United States Patent
Hanawa et al.

(10) Patent No.: US 6,468,388 B1
(45) Date of Patent: *Oct. 22, 2002

(54) REACTOR CHAMBER FOR AN EXTERNALLY EXCITED TORROIDAL PLASMA SOURCE WITH A GAS DISTRIBUTION PLATE

(75) Inventors: Hiroji Hanawa, Sunnyvale; Yan Ye, Campbell; Kenneth S Collins, San Jose; Kartik Ramaswamy, Santa Clara; Andrew Nguyen, San Jose; Tsutomu Tanaka, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 09/636,434

(22) Filed: Aug. 11, 2000

(51) Int. Cl.$^7$ .............................................. H01L 21/00
(52) U.S. Cl. .............................. 156/345.48; 118/723 I; 118/723 AN; 118/723 R
(58) Field of Search ....................... 156/345; 118/723 I, 118/723 R

(56) References Cited

U.S. PATENT DOCUMENTS

| | | |
|---|---|---|
| 2,344,138 A | 3/1944 | Drummond |
| 3,109,100 A | 10/1963 | Papp |
| 3,291,715 A | 12/1966 | Anderson |

(List continued on next page.)

FOREIGN PATENT DOCUMENTS

| | | |
|---|---|---|
| EP | 0 546 852 | 6/1993 |
| EP | 0 546 852 A1 | 6/1993 |
| EP | 0 836 218 | 4/1998 |
| WO | 99/00823 | 1/1999 |
| WO | WP 99/00823 | 1/1999 |
| WO | 01/11650 | 2/2001 |

OTHER PUBLICATIONS

U.S. Patent application Ser. No. 09/584,167, filed May 25, 2000, entitled, "Toroidal Plasma Source for Plasma Processing," By Michael S. Cox, et al.

Zhang, B.C., and Cross, R.C., "A high power radio frequency transformer for plasma production in a toroidal plasma source," Rev. Sci. Instrum., vol. 69, No. 1, Jan. 1998, pp. 101–108.

U.S. patent application Ser. No.: 09/636,435, filed Aug. 11, 2000, entitled,"Externally Excited Multiple Torroidal Plasma Source", by Hiroji Hanawa, et al.

U.S. patent application No.: 09/636,436, filed Aug. 11, 2000, entitled, "A Method of Processing a Workpiece Using an Externally Excited Torroidal Plasma Source," By Hirojoi Hanawa, et al.

(List continued on next page.)

Primary Examiner—Gregory Mills
Assistant Examiner—Anna Michelle Crowell
(74) Attorney, Agent, or Firm—Michaelson and Wallace; Joseph Bach

(57) ABSTRACT

A plasma chamber defining an evacuated interior environment for processing a substrate includes a substrate support, an apertured gas distribution plate in spaced facing relationship to the substrate support, and adapted to flow process gases into the chamber interior environment adjacent the substrate support, the gas distribution plate and substrate support defining a substrate processing region therebetween. A hollow conduit having respective ends opening into the substrate processing region on opposite sides of the gas distribution plate, with the interior of the conduit sharing the interior environment. The conduit being adapted to accept irradiation by an RF field of processing gases within the conduit to sustain a plasma in a path extending around the conduit interior and across the substrate processing region within the chamber interior environment.

21 Claims, 41 Drawing Sheets

U.S. PATENT DOCUMENTS

| | | |
|---|---|---|
| 4,431,898 A | 2/1984 | Reinberg et al. |
| 4,778,561 A | 10/1988 | Ghanbari |
| 4,867,859 A | 9/1989 | Harada et al. |
| 4,871,421 A | 10/1989 | Ogle et al. |
| 4,948,458 A | 8/1990 | Ogle |
| 5,061,838 A | 10/1991 | Lane et al. |
| 5,106,827 A | 4/1992 | Borden et al. |
| 5,107,201 A | 4/1992 | Ogle |
| 5,277,751 A | 1/1994 | Ogle |
| 5,290,382 A * | 3/1994 | Zarowin et al. ............ 156/345 |
| 5,435,881 A | 7/1995 | Ogle |
| 5,505,780 A | 4/1996 | Dalvie et al. |
| 5,520,209 A | 5/1996 | Goins et al. |
| 5,683,517 A | 11/1997 | Shan |
| 5,770,982 A | 6/1998 | Moore |
| 5,897,752 A | 4/1999 | Hong et al. |
| 5,935,077 A | 8/1999 | Ogle |
| 5,944,942 A | 8/1999 | Ogle |
| 5,948,168 A | 9/1999 | Shan et al. |
| 5,994,236 A | 11/1999 | Ogle |
| 5,998,933 A | 12/1999 | Shun'ko |
| 6,041,735 A | 3/2000 | Murzin et al. |
| 6,150,628 A | 11/2000 | Smith et al. |
| 6,203,657 B1 * | 3/2001 | Collison et al. ............ 156/345 |
| 6,348,126 B1 | 2/2002 | Hanawa et al. ............ 156/345 |

OTHER PUBLICATIONS

U.S. patent application No.: 09/636,700, filed Aug. 11, 2000, entitled, "Externally Excited Torroidal Plasma Source Using a Gas Distribution Plate," By Hiroji Hanawa, et al.

U.S. patent application Ser. No.: 09/637,174, filed Aug. 11, 2000, entitled, "Externally Excited Torroidal Plasma Source with a Gas Distribution Plate," By Hiroji Hanawa, et al.

U.S. patent application Ser. No.: 09/638,075, filed Aug. 11, 2000, enttiled, "Externally Excited Torroidal Plasma Source," By Hiroji Hanawa, et al.

* cited by examiner

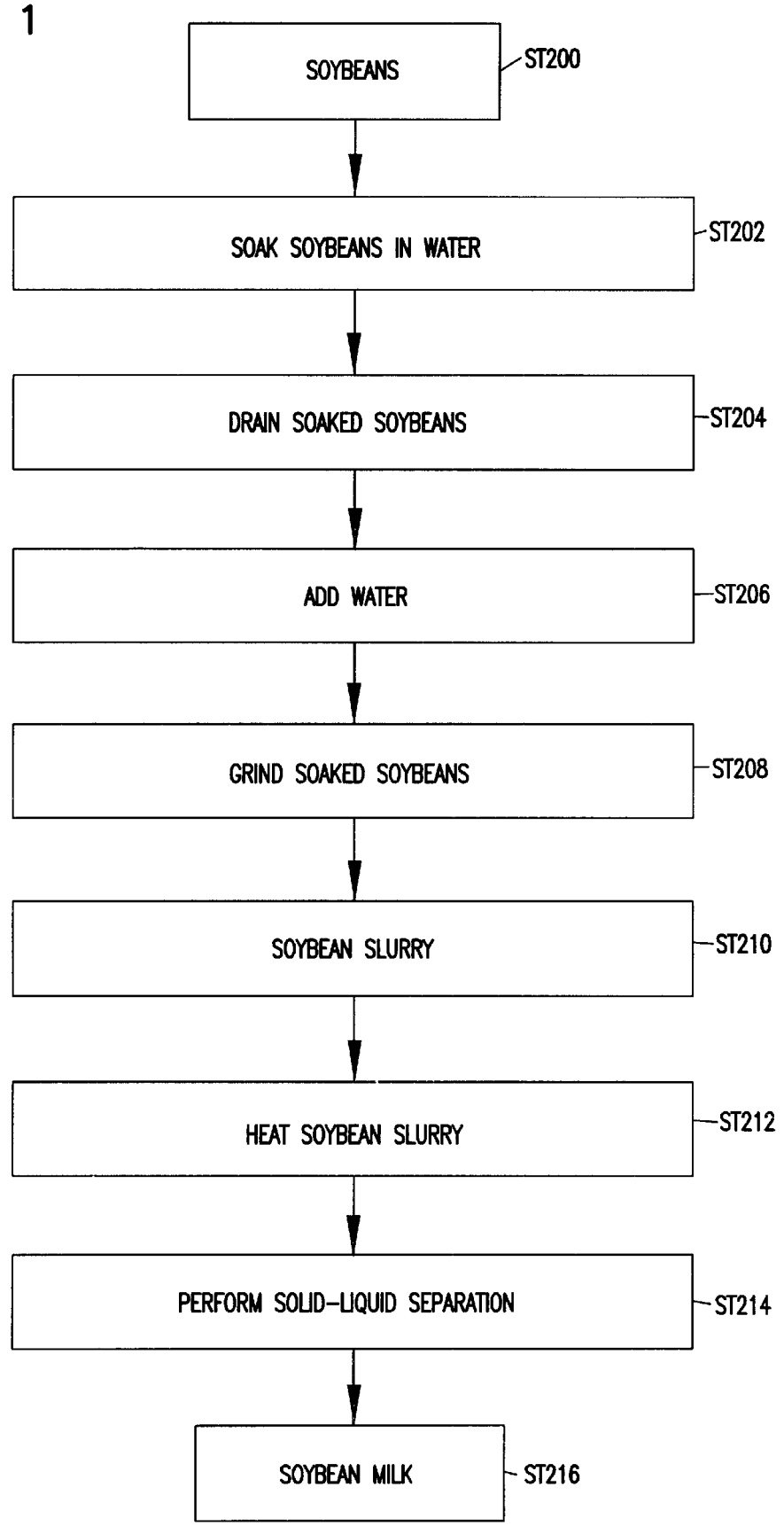

REACTOR CHAMBER FOR AN EXTERNALLY EXCITED TORROIDAL PLASMA SOURCE WITH A GAS DISTRIBUTION PLATE

CROSS REFERENCE TO RELATED APPLICATIONS

The following applications contain subject matter related to the present application:

U.S. Pat. No. 6,348,126 B1, issued Feb. 19, 2002 entitled, "EXTERNALLY EXCITED TORROIDAL PLASMA SOURCE," By Hiroji Hanawa, et al.; U.S. patent application Ser. No. 09/636,435, filed Aug. 11, 2000 entitled, "EXTERNALLY EXCITED MULTIPLE TORROIDAL PLASMA SOURCE," By Hirojji Hanawa, et al.; U.S. patent application Ser. No.: 09/636,436, filed Aug. 11, 2000 entitled, "A METHOD OF PROCESSING A WORKPIECE USING AN EXTERNALLY EXCITED TORROIDAL PLASMA SOURCE," By Hiroji Hanawa, et al.; U.S. patent application Ser. No.: 09/636,700, filed Aug. 11, 2000, entitled, "EXTERNALLY EXCITED TORROIDAL PLASMA SOURCE USING A GAS DISTRIBUTION PLATE," By Hiroji Hanawa, et al.; U.S. patent application Ser. No. : 09/637,174, filed Aug. 11, 2000 entitled, "EXTERNALLY EXCITED TORROIDAL PLASMA SOURCE WITH A GAS DISTRIBUTION PLATE," By Hiroji Hanawa, et al.; U.S. patent application No. : 09/638,075, filed Aug. 11, 2000 entitled, "EXTERNALLY EXCITED TORROIDAL PLASMA SOURCE," By Hiroji Hanawa, et al.

BACKGROUND OF THE INVENTION

1. Technical Field

The invention concerns plasma reactors used in processing workpieces in the manufacturing of items such as microelectronic circuits, flat panel displays and the like, and in particular plasma sources therefor.

2. Background Art

The trend in microelectronic circuits toward ever increasing densities and smaller feature sizes continues to make plasma processing of such devices more difficult. For example, the diameter of contact holes has been reduced while the hole depth has increased. During plasma-enhanced etching of a dielectric film on a silicon wafer, for example, the etch selectivity of the dielectric material (e.g. silicon dioxide) to photoresist must be sufficient to allow the etch process to etch a contact hole whose diameter is ten to fifteen times its depth, without appreciably disturbing the photoresist mask defining the hole. This task is made even more difficult because the recent trend toward shorter wavelength light for finer photolithography requires a thinner photoresist layer, so that the dielectric-to-photoresist etch selectivity must be greater than ever. This requirement is more readily met using processes having relatively low etch rates, such as dielectric etch processes employing a capacitively coupled plasma. The plasma density of a capacitively coupled plasma is relatively less than that of an inductively coupled plasma, and the capacitively coupled plasma etch process exhibits good dielectric-to-photoresist etch selectivity. The problem with the capacitively coupled process is that it is slow and therefore relatively less productive. Another problem that arises in such etch processes is non-uniform plasma distribution.

In order to increase productivity or etch rate, higher density plasmas have been employed. Typically, the high density plasma is an inductively coupled plasma. However, the process precursor gases tend to dissociate more rapidly in such a high density plasma, creating a higher plasma content of free fluorine, a species which reduces the etch selectivity to photoresist. To reduce this tendency, fluorocarbon process gases such as $CF_2$ are employed which dissociate in a plasma into fluorine-containing etchant species and one or more polymer species which tend to accumulate on non-oxide containing surfaces such as photoresist. This tends to increase etch selectivity. The oxygen in the oxygen-containing dielectric material promotes the pyrolization of the polymer over the dielectric, so that the polymer is removed, allowing the dielectric material to be etched while the non-oxygen containing material (e.g., the photoresist) continues to be covered by the polymer and therefore protected from the etchant. The problem is that the increase in contact opening depth and decrease in photoresist thickness to accommodate more advanced device designs has rendered the high density plasma process more likely to harm the photoresist layer during dielectric etching. As the plasma density is increased to improve etch rate, a more polymer-rich plasma must be used to protect the non-oxygen containing material such as photoresist, so that the rate of polymer removal from the oxygen-containing dielectric surfaces slows appreciably, particularly in small confined regions such as the bottom of a narrow contact opening. The result is that, while the photoresist may be adequately protected, the possibility is increased for the etch process to be blocked by polymer accumulation once a contact opening reaches a certain depth. Typically, the etch stop depth is less than the required depth of the contact opening so that the device fails. The contact opening may provide connection between an upper polysilicon conductor layer and a lower polysilicon conductor layer through an intermediate insulating silicon dioxide layer. Device failure occurs, for example, where the etch stop depth is less than the distance between the upper and lower polysilicon layers. Alternatively, the possibility arises of the process window for achieving a high density plasma without etch stop becoming too narrow for practical or reliable application to the more advanced device designs such as those having contact openings with aspect ratios of 10:1 or 15:1.

What would be desirable at present is a reactor that has the etch rate of an inductively coupled plasma reactor (having a high density plasma) with the selectivity of a capacitively coupled reactor. It has been difficult to realize the advantages of both types of reactors in a single machine led reactor.

One problem with high density inductively coupled plasma reactors, particularly of the type having an overhead coil antenna facing the wafer or workpiece, is that as the power applied to the coil antenna is increased to enhance the etch rate, the wafer-to-ceiling gap must be sufficiently large so that the power is absorbed in the plasma region well above the wafer. This avoids a risk of device damage on the wafer due to strong RF fields. Moreover, for high levels of RF power applied to the overhead coil antenna, the wafer-to-ceiling gap must be relatively large, and therefore the benefits of a small gap cannot be realized.

If the ceiling is a semiconductive window for the RF field of an inductively coupled reactor, or a conductive electrode of a capacitively coupled reactor, then one benefit of a small wafer-to-ceiling gap is an enhanced electric potential or ground reference that the ceiling could provide across the plane of the wafer at a relatively small gap distance (e.g., on the order of 1 or 2 inches).

Therefore, it would be desireable to have a reactor not only having the selectivity of a capacitively coupled reactor with the ion density and etch rate of an inductively coupled reactor, but further having none of the conventional limitations on the wafer-to-ceiling gap length other than a fundamental limit, such as the plasma sheath thickness, for example. It would further be desireable to have a reactor having the selectivity of a capacitively coupled reactor and the etch rate of an inductively coupled reactor in which the ion density and etch rate can be enhanced without necessarily increasing the applied RF plasma source power.

SUMMARY OF THE DISCLOSURE

A plasma chamber defining an evacuated interior environment for processing a substrate includes a substrate support, an apertured gas distribution plate in spaced facing relationship to the substrate support, and adapted to flow process gases into the chamber interior environment adjacent the substrate support, the gas distribution plate and substrate support defining a substrate processing region therebetween, a hollow conduit having respective ends opening into the substrate processing region on opposite sides of the gas distribution plate, with the interior of said conduit sharing the interior environment, the conduit being adapted to accept irradiation by an RF field of processing gases within the conduit to sustain a plasma in a path extending around the conduit interior and across the substrate processing region within the chamber interior environment.

DETAILED DESCRIPTION OF PREFERRED EMBODIMENTS

Overview of the Plasma Reactor Chamber

Figure 1:
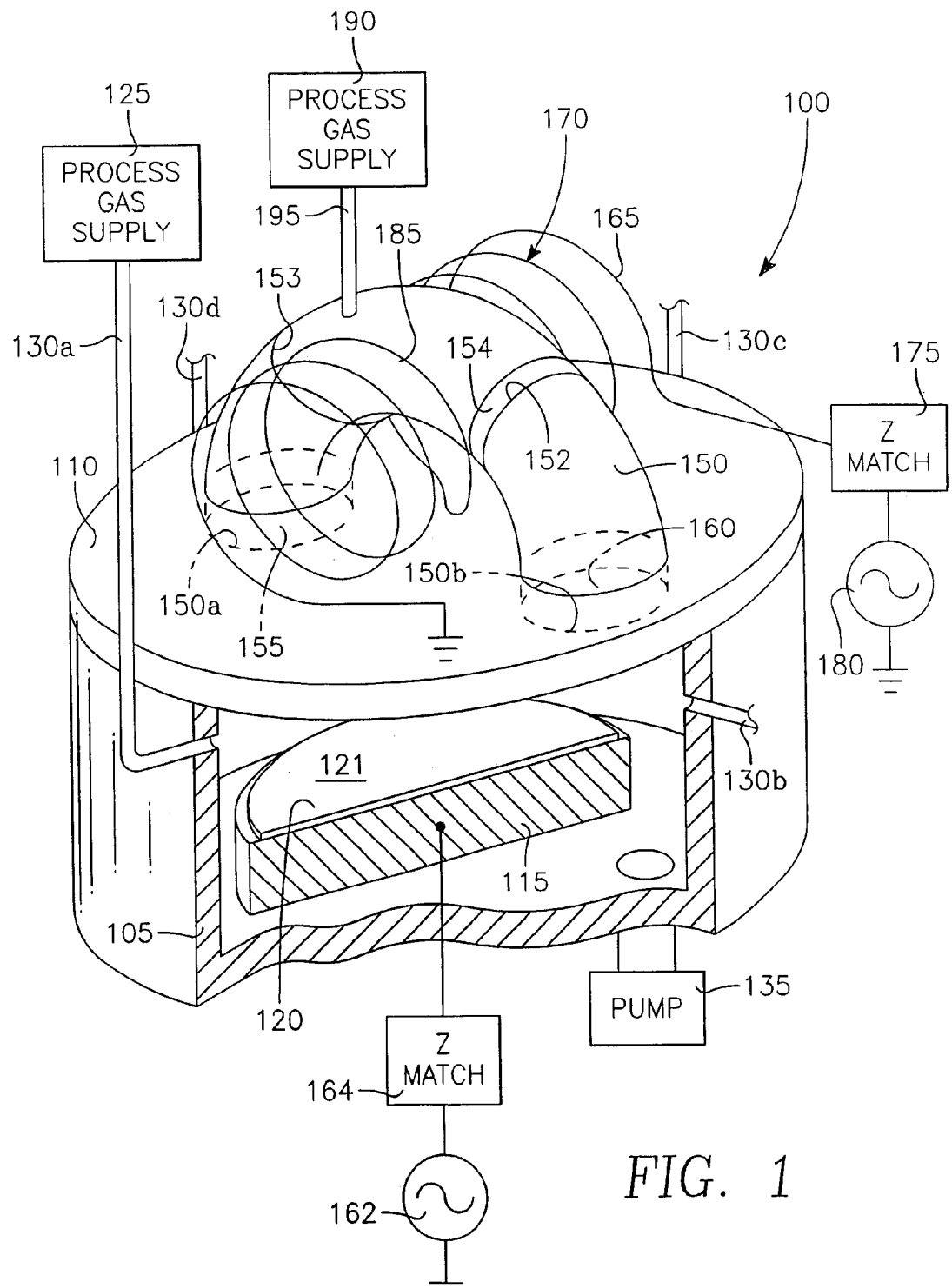
FIG. 1 illustrates a first embodiment that maintains an overhead torroidal plasma current path.
Figure 2:
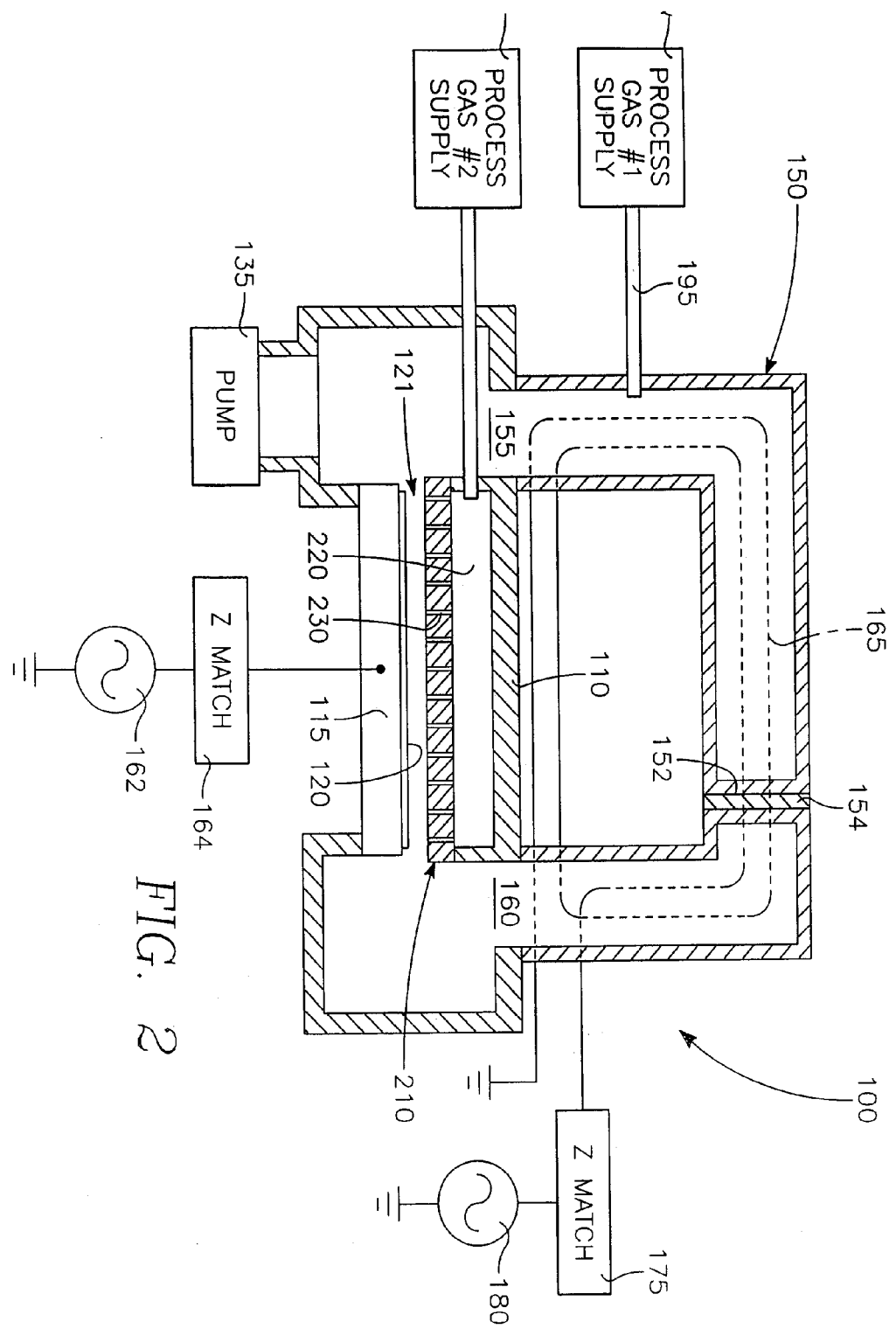
Figure 3:
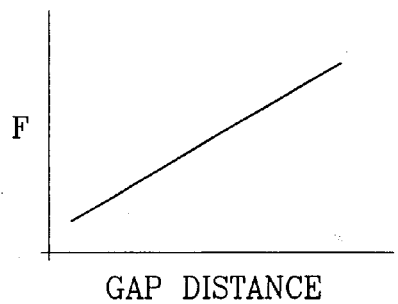
Figure 4:
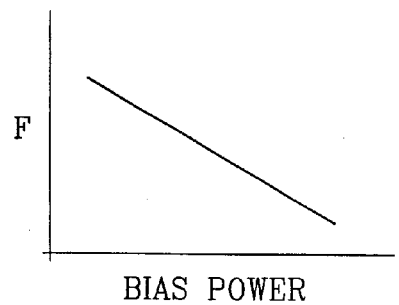
Figure 5:
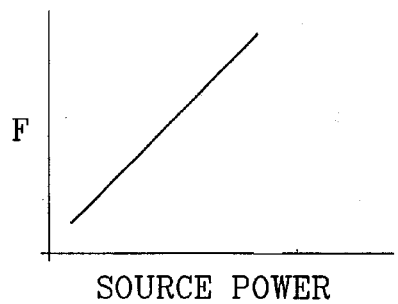
Figure 6:
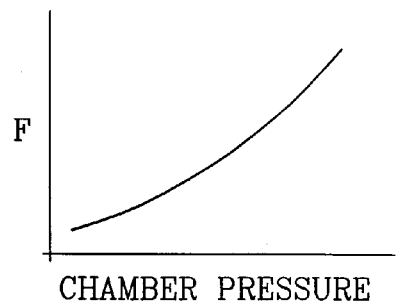
Figure 7:
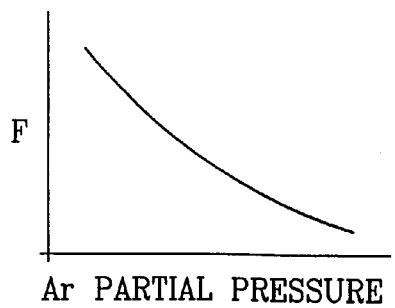
Figure 8:
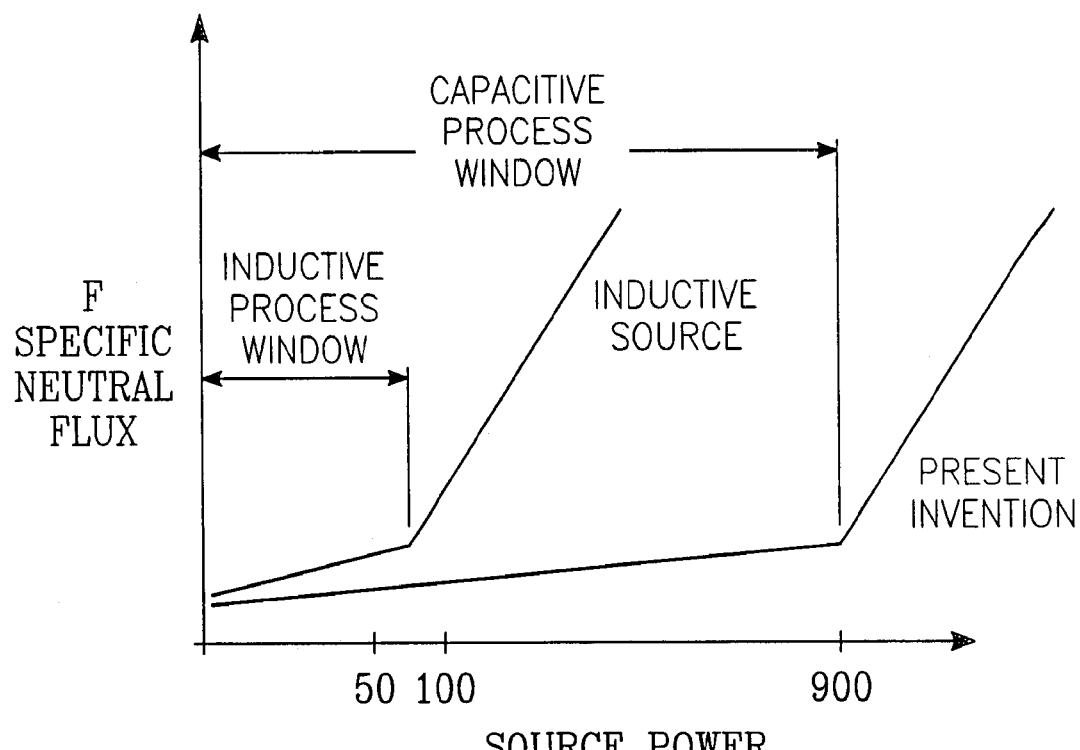
Figure 9:
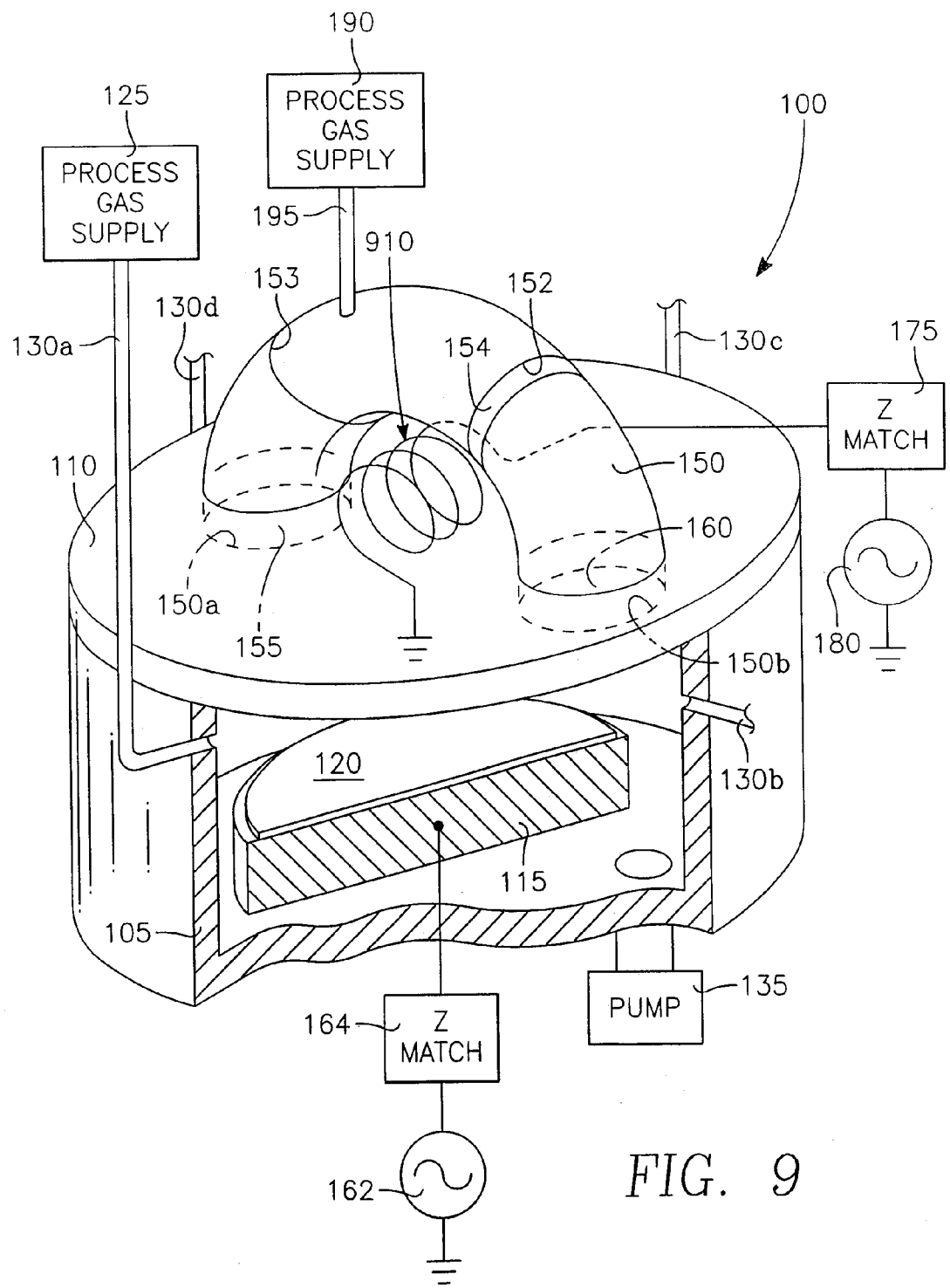
Figure 10:
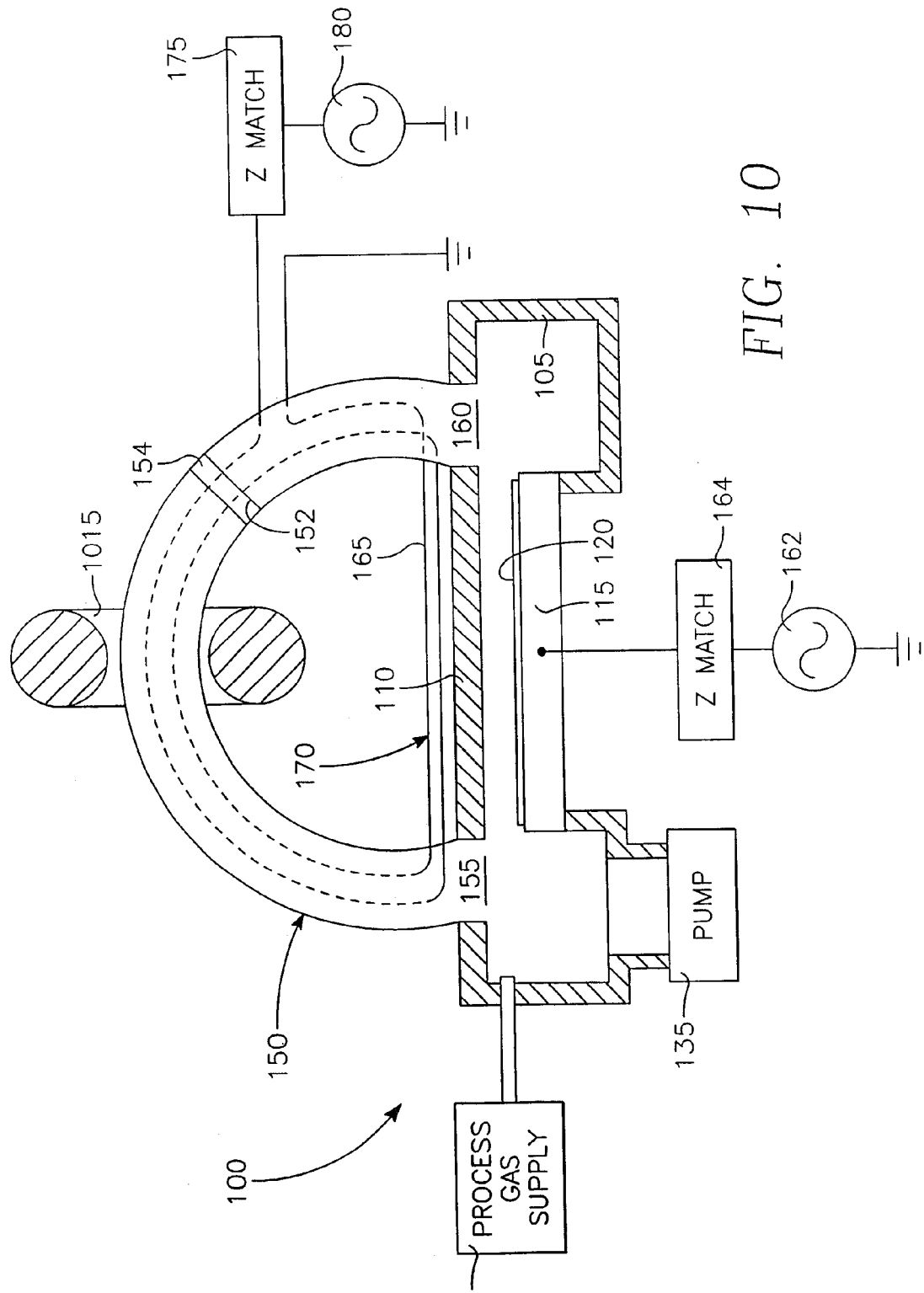
Figure 11:
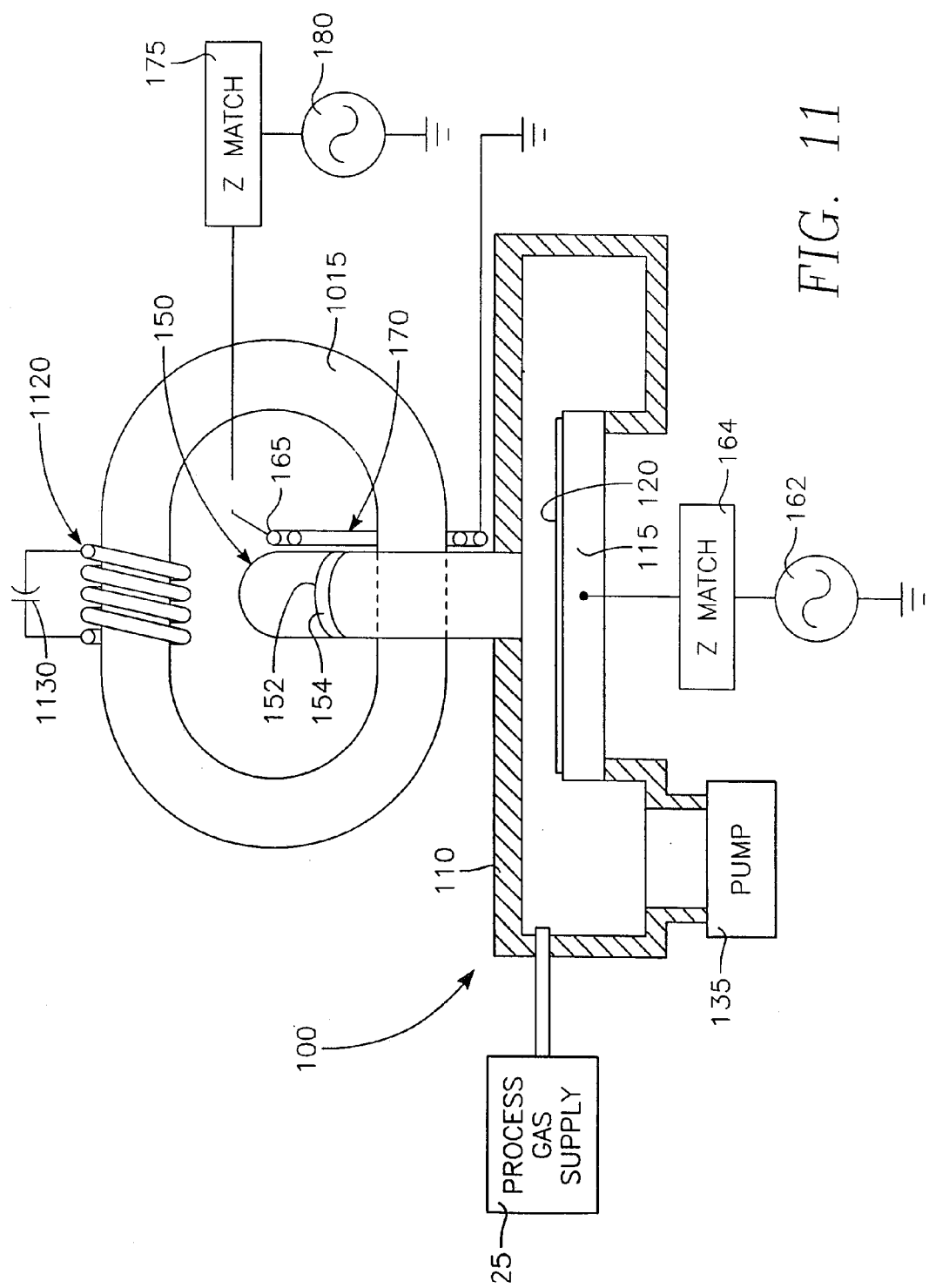
Figure 12:
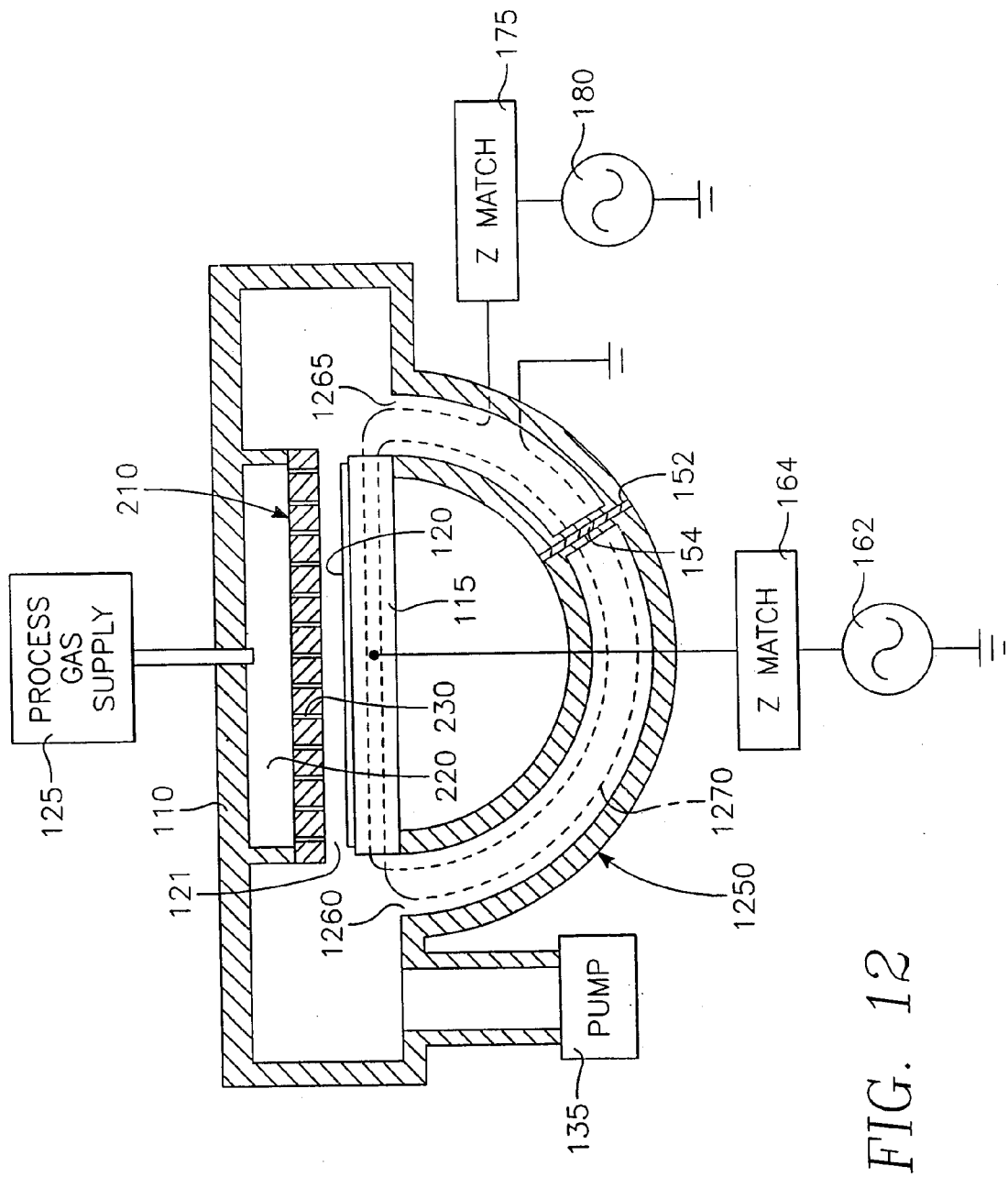
Figure 13:
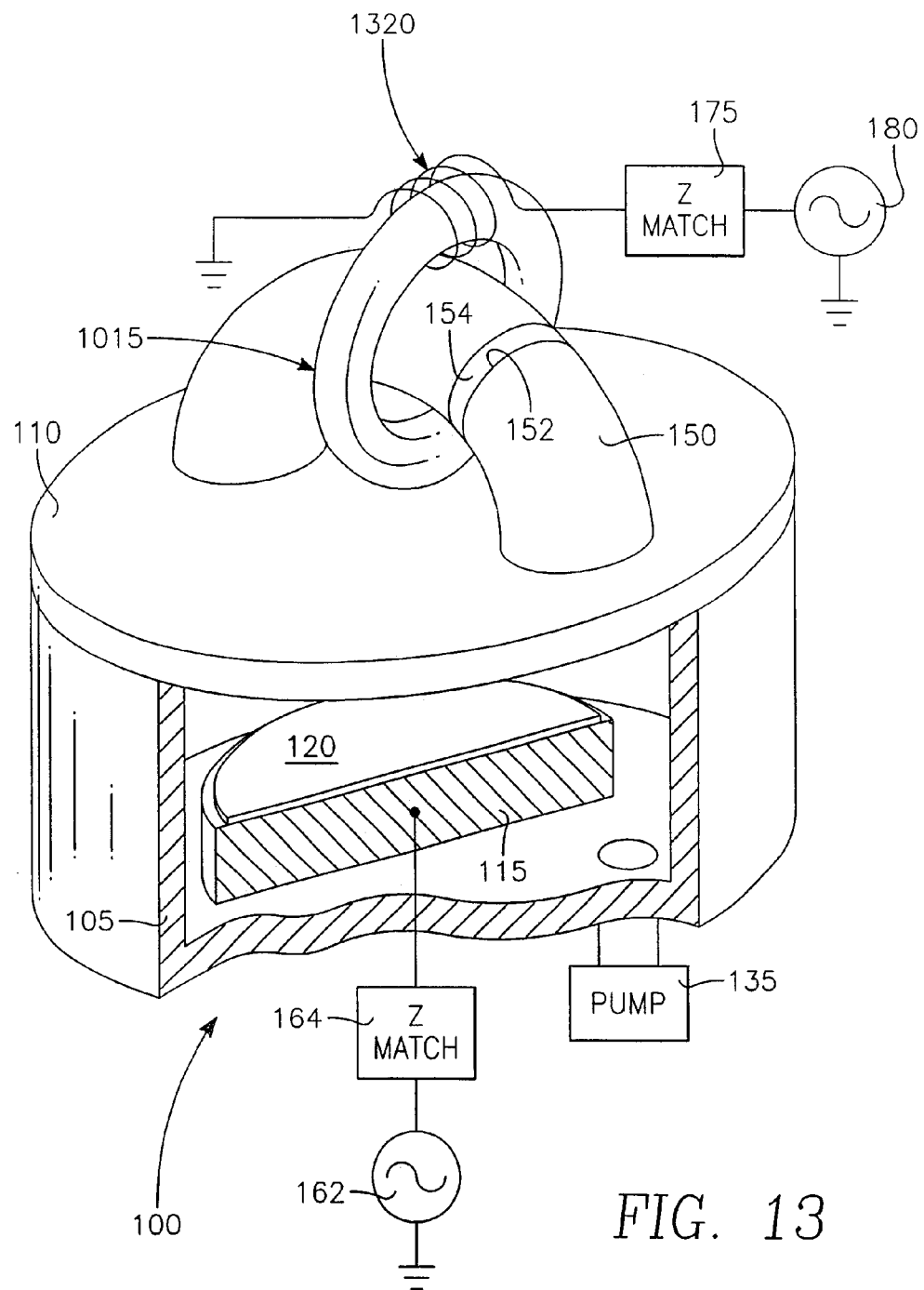

Referring to FIG. 1, a plasma reactor chamber 100 enclosed by a cylindrical side wall 105 and a ceiling 110 houses a wafer pedestal 115 for supporting a semiconductor wafer or workpiece 120. A process gas supply 125 furnishes process gas into the chamber 100 through gas inlet nozzles 130a–130d extending through the side wall 105. A vacuum pump 135 controls the pressure within the chamber 100, typically holding the pressure below 0.5 milliTorr (mT). A half-torroidal hollow tube enclosure or conduit 150 extends above the ceiling 110 in a half circle. The conduit 150, although extending externally outwardly from ceiling 110, is nevertheless part of the reactor and forms a wall of the chamber. Internally it shares the same evacuated atmosphere as exists elsewhere in the reactor. In fact, the vacuum pump 135, instead of being coupled to the bottom of the main part of the chamber as illustrated in FIG. 1, may instead be coupled to the conduit 150, although this is not presently preferred. The conduit 150 has one open end 150a sealed around a first opening 155 in the reactor ceiling 110 and its other end 150b sealed around a second opening 160 in the reactor ceiling 110. The two openings or ports 150, 160 are located on generally opposite sides of the wafer support pedestal 115. The hollow conduit 150 is reentrant in that it provides a flow path which exits the main portion of the chamber at one opening and re-enters at the other opening. In this specification, the conduit 150 may be described as being half-torroidal, in that the conduit is hollow and provides a portion of a closed path in which plasma may flow, the entire path being completed by flowing across the entire process region overlying the wafer support pedestal 115. Notwithstanding the use of the term "torroidal", the trajectory of the path as well as the cross-sectional shape of the path or conduit 150 may be circular or non-circular, and may be square, rectangular or any other shape either a regular shape or irregular.

The external conduit 150 may be formed of a relatively thin conductor such as sheet metal, but sufficiently strong to withstand the vacuum within the chamber. In order to suppress eddy currents in the sheet metal of the hollow conduit 150 (and thereby facilitate coupling of an RF inductive field into the interior of the conduit 150), an insulating gap 152 extends across and through the hollow conduit 150 so as to separate it into two tubular sections. The gap 152 is filled by a ring 154 of insulating material such as a ceramic in lieu of the sheet metal skin, so that the gap is vacuum tight. A second insulating gap 153 may be provided, so that one section of the conduit 150 is electrically floating. A bias RF generator 162 applies RF bias power to the wafer pedestal 115 and wafer 120 through an impedance match element 164.

Alternatively, the hollow conduit 150 may be formed of a non-conductive material instead of the conductive sheet metal. The non-conductive material may be a ceramic, for example. In such an alternative embodiment, neither gap 152 or 153 is required.

An antenna 170 such as a winding or coil 165 disposed on one side of the hollow conduit 150 and wound around an axis parallel to the axis of symmetry of the half-torroidal tube is connected through an impedance match element 175 to an RF power source 180. The antenna 170 may further include a second winding 185 disposed on the opposite side of the hollow conduit 150 and wound in the same direction as the first winding 165 so that the magnetic fields from both windings add constructively.

Process gases from the chamber 100 fill the hollow conduit 150. In addition, a separate process gas supply 190 may supply process gases directly in to the hollow conduit 150 through a gas inlet 195. The RF field in the external hollow conduit 150 ionizes the gases in the tube to produce a plasma. The RF field induced by the circular coil antenna 170 is such that the plasma formed in the tube 150 reaches through the region between the wafer 120 and the ceiling 110 to complete a torroidal path that includes the halftorroidal hollow conduit 150. As employed herein, the term "torroidal" refers to the closed and solid nature of the path, but does not refer or limit its cross-sectional shape or trajectory, either of which may be circular or non-circular or square or otherwise. Plasma circulates through the complete torroidal path or region which may be thought of as a closed plasma circuit. The torroidal region extends across the diameter of the wafer 120 and, in certain embodiments, has a sufficient width in the plane of the wafer so that it overlies the entire wafer surface.

The RF inductive field from the coil antenna 170 includes a magnetic field which itself is closed (as are all magnetic fields), and therefore induces a plasma current along the closed torroidal path described here. It is believed that power from the RF inductive field is absorbed at generally every location along the closed path, so that plasma ions are generated all along the path. The RF power absorption and rate of plasma ion generation may vary among different locations along the closed path depending upon a number of factors. However, the current is generally uniform along the closed path length, although the current density may vary. This current alternates at the frequency of the RF signal applied to the antenna 170. However, since the current induced by the RF magnetic field is closed, the current must be conserved around the circuit of the closed path, so that the amount of current flowing in any portion of the closed path is generally the same as in any other portion of the path. As will be described below, this fact is exploited in the invention to great advantage.

The closed torroidal path through which the plasma current flows is bounded by plasma sheaths formed at the various conductive surfaces bounding the path. These conductive surfaces include the sheet metal of the hollow conduit 150, the wafer (and/or the wafer support pedestal) and the ceiling overlying the wafer. The plasma sheaths formed on these conductive surfaces are charge-depleted regions produced as the result of the charge imbalance due to the greater mobility of the low-mass negative electrons and the lesser mobility of the heavy-mass positive ions. Such a plasma sheath has an electric field perpendicular to the local surface underlying the sheath. Thus, the RF plasma current that passes through the process region overlying the wafer is constricted by and passes between the two electric fields perpendicular to the surface of the ceiling facing the wafer and the surface of the wafer facing the gas distribution plate. The thickness of the sheath (with RF bias applied to the workpiece or other electrode) is greater where the electric field is concentrated over a small area, such as the wafer, and is less in other locations such as the sheath covering the ceiling and the large adjoining chamber wall surfaces. Thus, the plasma sheath overlying the wafer is much thicker. The electric fields of the wafer and ceiling/gas distribution plate sheaths are generally parallel to each other and perpendicular to the direction of the RF plasma current flow in the process region.

When RF power is first applied to the coil antenna 170, a discharge occurs across the gap 152 to ignite a capacitively coupled plasma from gases within the hollow conduit 150. Thereafter, as the plasma current through the hollow conduit 150 increases, the inductive coupling of the RF field becomes more dominant so that the plasma becomes an inductively coupled plasma. Alternatively, plasma may be initiated by other means, such as by RF bias applied to the workpiece support or other electrode.

In order to avoid edge effects at the wafer periphery, the ports 150, 160 are separated by a distance that exceeds the diameter of the wafer. For example, for a 12 inch diameter wafer, the ports 150, 160 are about 16 to 22 inches apart. For an 8 inch diameter wafer, the ports 150, 160 are about 10 to 16 inches apart.

ADVANTAGES OF THE INVENTION

A significant advantage is that power from the RF inductive field is absorbed throughout the relatively long closed torroidal path (i.e., long relative to the gap length between the wafer and the reactor ceiling), so that RF power absorption is distributed over a large area. As a result, the RF power in the vicinity of the wafer-to-ceiling gap (i.e., the process region 121 best shown in FIG. 2, not to be confused with the insulating gap 152) is relatively low, thus reducing the liklihood of device damage from RF fields. In constrast, in prior inductively coupled reactors, all of the RF power is absorbed within the narrow wafer-to-ceiling gap, so that it is greatly concentrated in that region. Moreover, this fact often limits the ability to narrow the wafer-to-ceiling gap (in the quest of other advantages) or, alternatively, requires greater concentration of RF power in the region of the wafer. Thus, the invention overcomes a limitation of long standing in the art. This aspect enhances process performance by reducing residency time of the reactive gases through a dramatic reduction in volume of the process region or process zone overlying the wafer, as discussed previously herein.

A related and even more important advantage is that the plasma density at the wafer surface can be dramatically increased without increasing the RF power applied to the coil antenna 170 (leading to greater efficiency). This is accomplished by reducing the cross-sectional area of the torroidal path in the vicinity of the pedestal surface and wafer 120 relative to the remainder of the torroidal path. By so constricting the torroidal path of the plasma current near the wafer only, the density of the plasma near the wafer surface is increased proportionately. This is because the torroidal path plasma current through the hollow conduit 150 must be at least nearly the same as the plasma current through the pedestal-to-ceiling (wafer-to-ceiling) gap.

A significant difference over the prior art is that not only is the RF field remote from the workpiece, and not only can ion density be increased at the wafer surface without increasing the applied RF field, but the plasma ion density and/or the applied RF field may be increased without increasing the minimum wafer-to-ceiling gap length. Formerly, such an increase in plasma density necessitated an increase in the wafer-to-ceiling gap to avoid strong fields at the wafer surface. In contrast, in the present invention the enhanced plasma density is realized without requiring any increase in the wafer-to-ceiling gap to avoid a concomitant increase in RF magnetic fields at the wafer surface. This is because the RF field is applied remotely from the wafer and moreover need not be increased to realize an increase in plasma density at the wafer surface. As a result, the wafer-to-ceiling gap can be reduced down to a fundamental limit to achieve numerous advantages. For example, if the ceiling surface above the wafer is conductive, then reducing the wafer-to-ceiling gap improves the electrical or ground reference provided by the conductive ceiling surface. A fundamental limit on the minimum wafer-to-ceiling gap length is the sum of the thicknesses of the plasma sheaths on the wafer surface and on the ceiling surface.

A further advantage of the invention is that because the RF inductive field is applied along the entire torroidal path of the RF plasma current (so that its absorption is distributed as discussed above), the chamber ceiling 110, unlike with most other inductively powered reactors, need not function as a window to an inductive field and therefore may be formed of any desired material, such as a highly conductive and thick metal, and therefore may comprise a conductive gas distribution plate as will be described below, for example. As a result, the ceiling 110 readily provides a reliable electric potential or ground reference across the entire plane of the pedestal or wafer 120.

Increasing the Plasma Ion Density

Figure 2:
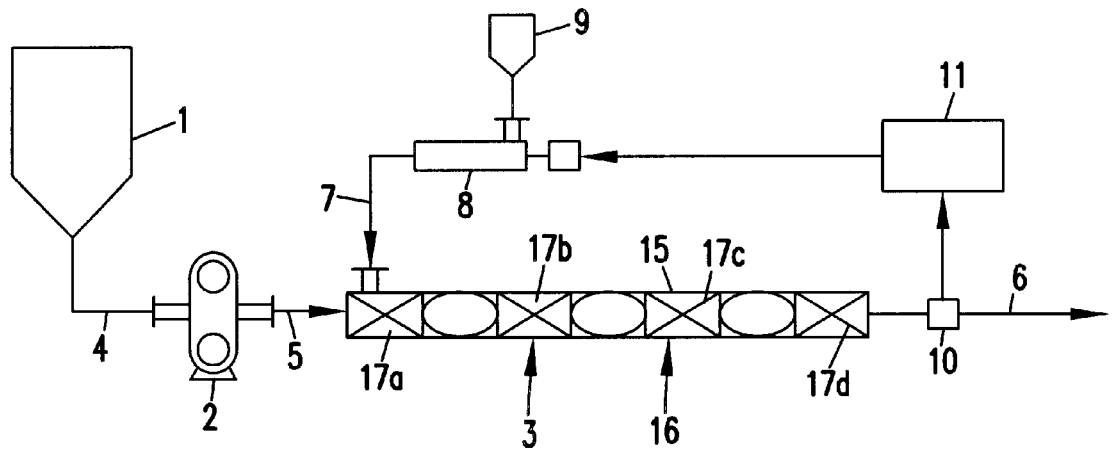
FIG. 2 is a side view of an embodiment corresponding to the embodiment of FIG. 1.

One way of realizing higher plasma density near the wafer surface by reducing plasma path cross-sectional area over the wafer is to reduce the wafer-to-ceiling gap length. This may be accomplished by simply reducing the ceiling height or by introducing a conductive gas distribution plate or showerhead over the wafer, as illustrated in FIG. 2. The gas distribution showerhead 210 of FIG. 2 consists of a gas distribution plenum 220 connected to the gas supply 125 and communicating with the process region over the wafer 120 through plural gas nozzle openings 230. The advantage of the conductive showerhead 210 is two-fold: First, by virtue of its close location to the wafer, it constricts the plasma path over the wafer surface and thereby increases the density of the plasma current in that vicinity. Second, it provides a uniform electrical potential reference or ground plane close to and across the entire wafer surface.

Preferably, in order to avoid arcing across the openings 230, each opening 230 is relatively small, on the order of a millimeter (preferred hole diameter is approximately 0.5mm). The spacing between adjacent openings may be on the order of a several millimeters.

The conductive showerhead 210 constricts the plasma current path rather than providing a short circuit through itself because a plasma sheath is formed around the portion of the showerhead surface immersed in the plasma. The sheath has a greater impedance to the plasma current than the space between the wafer 120 and the showerhead 210, and therefore all the plasma current goes around the conductive showerhead 210.

It is not necessary to employ a showerhead (e.g., the showerhead 210) in order to constrict the toroidal plasma current or path in the vicinity of the process region overlying the wafer. The path constriction and consequent increase in plasma ion density in the process region may be achieved without the showerhead 210 by similarly reducing the wafer-to-ceiling height. If the showerhead 210 is eliminated in this manner, then the process gases may be supplied into the chamber interior by means of conventional gas inlet nozzles (not shown).

One advantage of the showerhead 210 is that different mixtures of reactive and inert process gas ratios may be introduced through different orifices 230 at different radii, in order to finely adjust the uniformity of plasma effects on photoresist, for example. Thus, for example, a greater proportion of inert gas to reactive gas may be supplied to the orifices 230 lying outside a median radius while a greater proportion of reactive gas to inert gas may be supplied to the orifices 230 within that median radius.

As will be described below, another way in which the toroidal plasma current path may be constricted in the process region overlying the wafer (in order to increase plasma ion density over the wafer) is to increase the plasma sheath thickness on the wafer by increasing the RF bias power applied to the wafer support pedestal. Since as described previously the plasma current across the process region is confined between the plasma sheath at the wafer surface and the plasma sheath at the ceiling (or showerhead) surface, increasing the plasma sheath thickness at the wafer surface necessarily decreases the cross-section of the portion of the toroidal plasma current within process region, thereby increasing the plasma ion density in the process region. Thus, as will be described more fully later in this specification, as RF bias power on the wafer support pedestal is increased, plasma ion density near the wafer surface is increased accordingly.

High Etch Selectivity at High Etch Rates

The invention solves the problem of poor etch selectivity which sometimes occurs with a high density plasma. The reactor of FIGS. 1 and 2 has a silicon dioxide-to-photoresist etch selectivity as high as that of a capacitively coupled plasma reactor (about 7:1) while providing high etch rates approaching that of a high density inductively coupled plasma reactor. It is believed that the reason for this success is that the reactor structure of FIGS. 1 and 2 reduces the degree of dissociation of the reactive process gas, typically a fluorocarbon gas, so as to reduce the incidence of free fluorine in the plasma region over the wafer 120. Thus, the proportion of free fluorine in the plasma relative to other species dissociated from the fluorocarbon gas is desireably reduced. Such other species include the protective carbon-rich polymer precursor species formed in the plasma from the fluorocarbon process gas and deposited on the photoresist as a protective polymer coating. They further include less reactive etchant species such as CF and $CF_2$ formed in the plasma from the fluorocarbon process gas. Free fluorine tends to attack photoresist and the protective polymer coating formed thereover as vigorously as it attacks silicon dioxide, thus reducing oxide-to-photoresist etch selectivity. On the other hand, the less reactive etch species such as $CF_2$ or CF tend to attack photoresist and the protective polymer coating formed thereover more slowly and therefore provide superior etch selectivity.

It is believed the reduction in the dissociation of the plasma species to free fluorine is accomplished in the invention by reducing the residency time of the reactive gas in the plasma. This is because the more complex species initially dissociated in the plasma from the fluorocarbon process gas, such as $CF_2$ and CF are themselves ultimately dissociated into simpler species including free fluorine, the extent of this final step of dissociation depending upon the residency time of the gas in the plasma. The term "residency time" or "residence time" as employed in this specification corresponds generally to the average time that a process gas molecule and the species dissociated from the that molecule are present in the process region overlying the workpiece or wafer. This time or duration extends from the initial injection of the molecule into the process region until the molecule and/or its dissociated progeny are pass out of the process region along the closed toroidal path described above that extends through the processing zone.

As stated above, the invention enhances etch selectivity by reducing the residency time in the process region of the fluorocarbon process gas. The reduction in residency time is achieved by constricting the plasma volume between the wafer 120 and the ceiling 110.

The reduction in the wafer-to-ceiling gap or volume has certain beneficial effects. First, it increases plasma density over the wafer, enhancing etch rate. Second, residency time falls as the volume is decreased. As referred to above, the small volume is made possible in the present invention because, unlike conventional inductively coupled reactors, the RF source power is not deposited within the confines of the process region overlying the wafer but rather power deposition is distributed along the entire closed toroidal path of the plasma current. Therefore, the wafer-to-ceiling gap-can be less than a skin depth of the RF inductive field, and in fact can be so small as to significantly reduce the residency time of the reactive gases introduced into the process region, a significant advantage.

There are two ways of reducing the plasma path cross-section and therefore the volume over the wafer 120. One is to reduce the wafer-to-showerhead gap distance. The other is to increase the plasma sheath thickness over the wafer by increasing the bias RF power applied to the wafer pedestal 115 by the RF bias power generator 162, as briefly mentioned above. Either method results in a reduction in free fluorine content of the plasma in the vicinity of the wafer 120 (and consequent increase in dielectric-to-photoresist etch selectivity) as observed using optical emission spectroscopy (OES) techniques.

There are three additional methods of the invention for reducing free fluorine content to improve etch selectivity. One method is to introduce a non-chemically reactive diluent gas such as argon into the plasma. Preferably, the argon gas is introduced outside and above the process region by injecting it directly into the hollow conduit 150 from the second process gas supply 190, while the chemically reactive process gases (fluorocarbon gases) enter the chamber only through the showerhead 210. With this advantageous arrangement, the argon ions, neutrals, and excited neutrals propagate within the toroidal path plasma current and through the process region across the wafer surface to dilute the newly introduced reactive (e.g., fluorocarbon) gases and thereby effectively reduce their residency time over the wafer. Another method of reducing plasma free fluorine content is to reduce the chamber pressure. A further method is to reduce the RF source power applied to the coil antenna 170.

Figure 3:
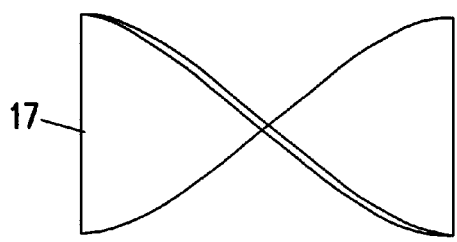
FIG. 3 is a graph illustrating the behavior of free fluorine concentration in the plasma with variations in wafer-to-ceiling gap distance.
Figure 4:
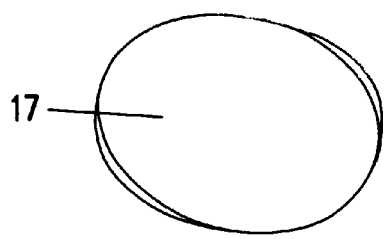
FIG. 4 is a graph illustrating the behavior of free fluorine concentration in the plasma with variations in RF bias power applied to the workpiece.
Figure 5:
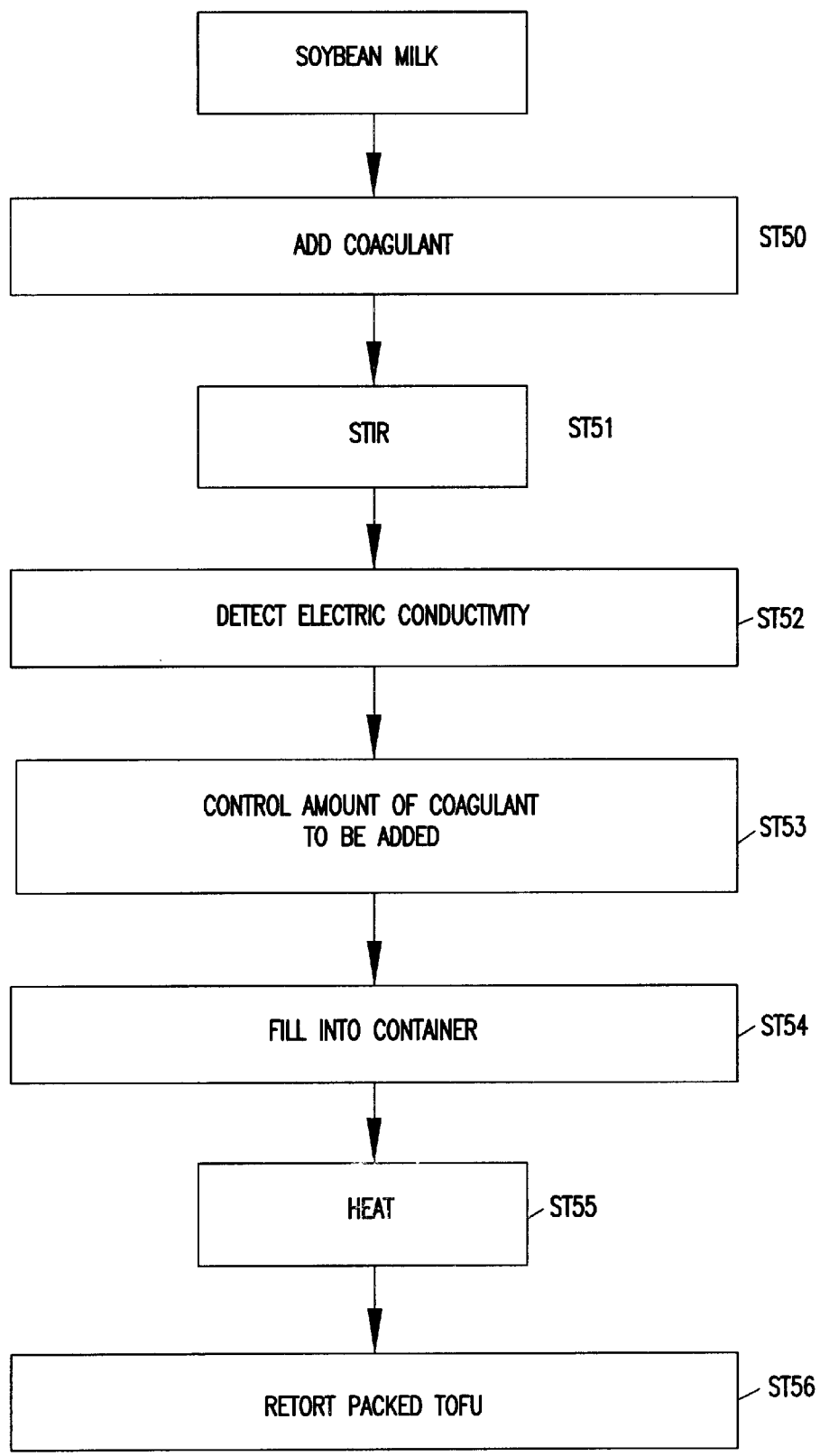
FIG. 5 is a graph illustrating the behavior of free fluorine concentration in the plasma with variations in RF source power applied to the coil antenna.
Figure 6:
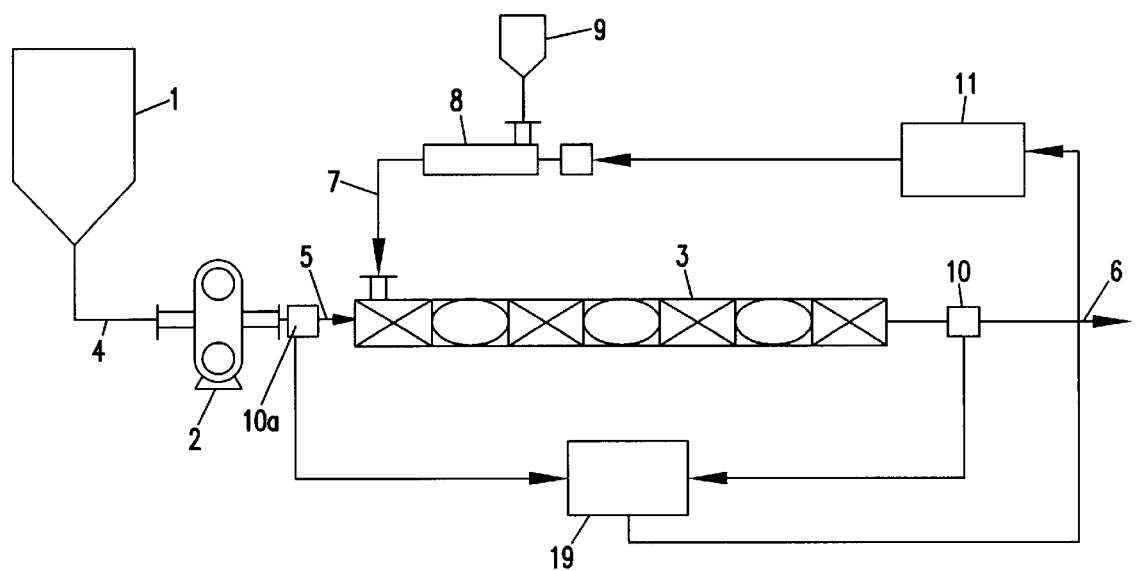
FIG. 6 is a graph illustrating the behavior of free fluorine concentration in the plasma with variations in reactor chamber pressure.
Figure 7:
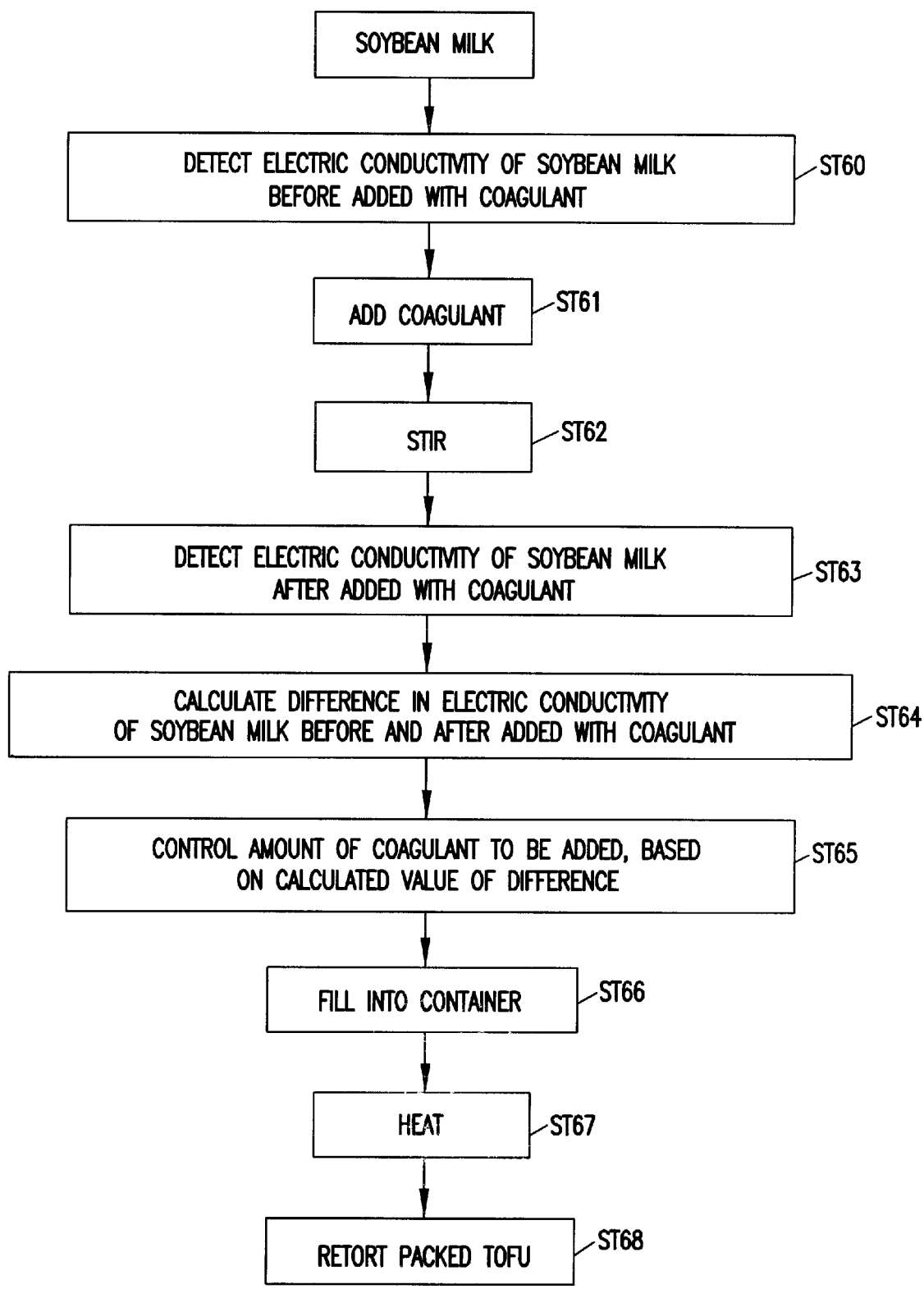
FIG. 7 is a graph illustrating the behavior of free fluorine concentration in the plasma with variations in partial pressure of an inert diluent gas such as Argon.

FIG. 3 is a graph illustrating a trend observed in the invention in which the free fluorine content of the plasma decreases as the wafer-to-showerhead gap distance is decreased. FIG. 4 is a graph illustrating that the free fluorine content of the plasma is decreased by decreasing the plasma bias power applied to the wafer pedestal 115. FIG. 5 is a graph illustrating that plasma free fluorine content is reduced by reducing the RF source power applied to the coil antenna 170. FIG. 6 is a graph illustrating that the free fluorine content is reduced by reducing chamber pressure. FIG. 7 is a graph illustrating that plasma free fluorine content is reduced by increasing the diluent (Argon gas) flow rate into the tubular enclosure 150. The graphs of FIGS. 3–7 are merely illustrative of plasma behavioral trends inferred from numerous OES observations and do not depict actual data.

Wide Process Window of the Invention

Preferably, the chamber pressure is less than 0.5 T and can be as low as 1 mT. The process gas may be $C_4F_8$ injected into the chamber 100 through the gas distribution showerhead at a flow rate of about 15 cc/m with 150 cc/m of Argon, with the chamber pressure being maintained at about 20 mT. Alternatively, the Argon gas flow rate may be increased to 650 cc/m and the chamber pressure to 60 mT. The antenna 170 may be excited with about 500 Watts of RF power at 13 MHz. The wafer-to-showerhead gap may be about 0.3 inches to 2 inches. The bias RF power applied to the wafer pedestal may be 13 MHz at 2000 Watts. Other selections of frequency may be made. The source power applied to the coil antenna 170 may be as low as 50 KHz or as high as several times 13 MHz or higher. The same is true of the bias power applied to the wafer pedestal.

Figure 8:
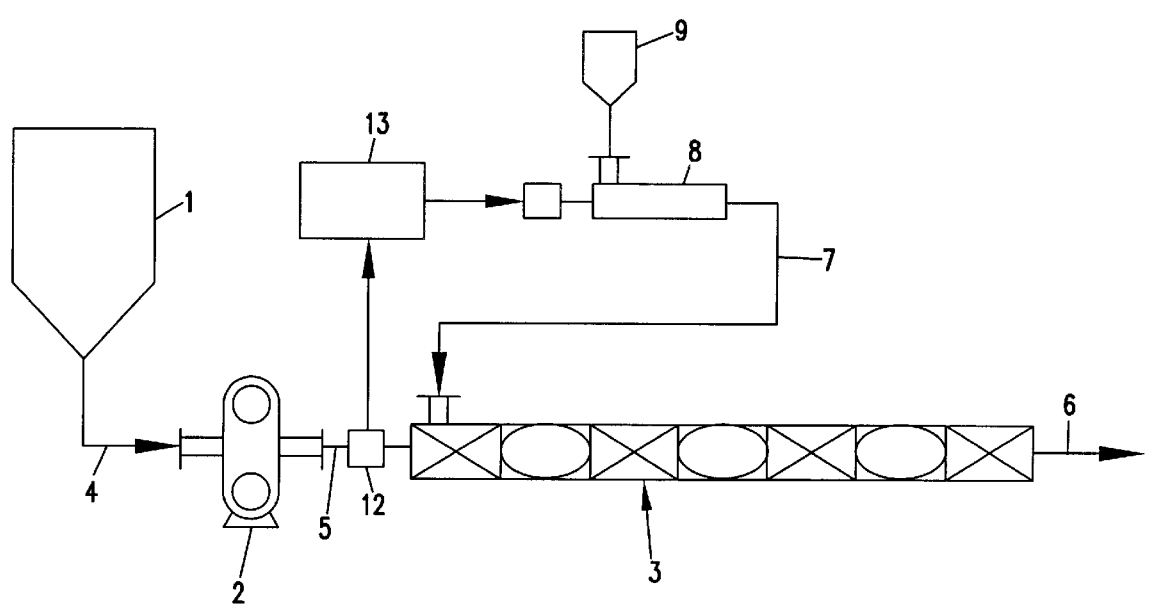
FIG. 8 is a graph illustrating the degree of dissociation of process gas as a function of source power for an inductively coupled reactor and for a reactor of the present invention.

The process window for the reactor of FIGS. 1 and 2 is far wider than the process window for a conventional inductively coupled reactor. This is illustrated in the graph of FIG. 8, showing the specific neutral flux of free fluorine as a function of RF source power for a conventional inductive reactor and for the reactor of FIGS. 1 and 2. For the conventional inductively coupled reactor, FIG. 8 shows that the free fluorine specific flux begins to rapidly increase as the source power exceeds between 50 and 100 Watts. In contrast, the reactor of FIGS. 1 and 2 can accept source power levels approaching 1000 Watts before the free fluorine specific flux begins to increase rapidly. Therefore, the source power process window in the invention is nearly an order of magnitude wider than that of a conventional inductively coupled reactor, a significant advantage.

Dual Advantages of the Invention

The constriction of the torroidal plasma current path in the vicinity of the wafer or workpiece produces two independent advantages without any significant tradeoffs of other performance criteria: (1) the plasma density over the wafer is increased without requiring any increase in plasma source power, and (2) the etch selectivity to photoresist or other materials is increased, as explained above. It is believed that in prior plasma reactors it has been impractical if not impossible to increase the plasma ion density by the same step that increases etch selectivity. Thus, the dual advantages realized with the torroidal plasma source of the present invention appear to be a revolutionary departure from the prior art.

Other Preferred Embodiments

Figure 9:
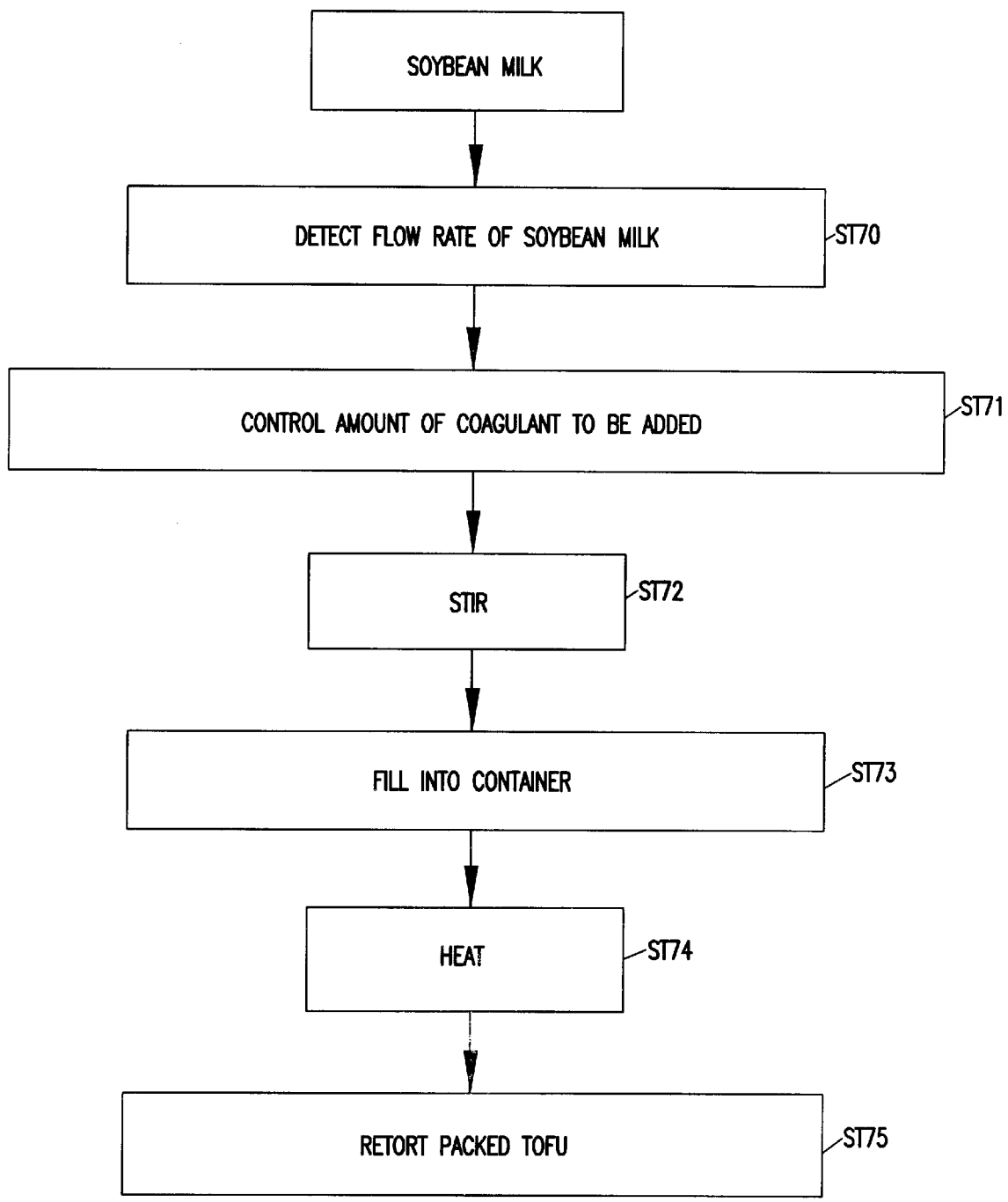
FIG. 9 illustrates a variation of the embodiment of FIG. 1.

FIG. 9 illustrates a modification of the embodiment of FIG. 1 in which the side antenna 170 is replaced by a smaller antenna 910 that fits inside the empty space between the ceiling 110 and the hollow conduit 150. Preferably, the antenna 910 is a single coil winding centered with respect to the hollow conduit 150.

Figure 10:
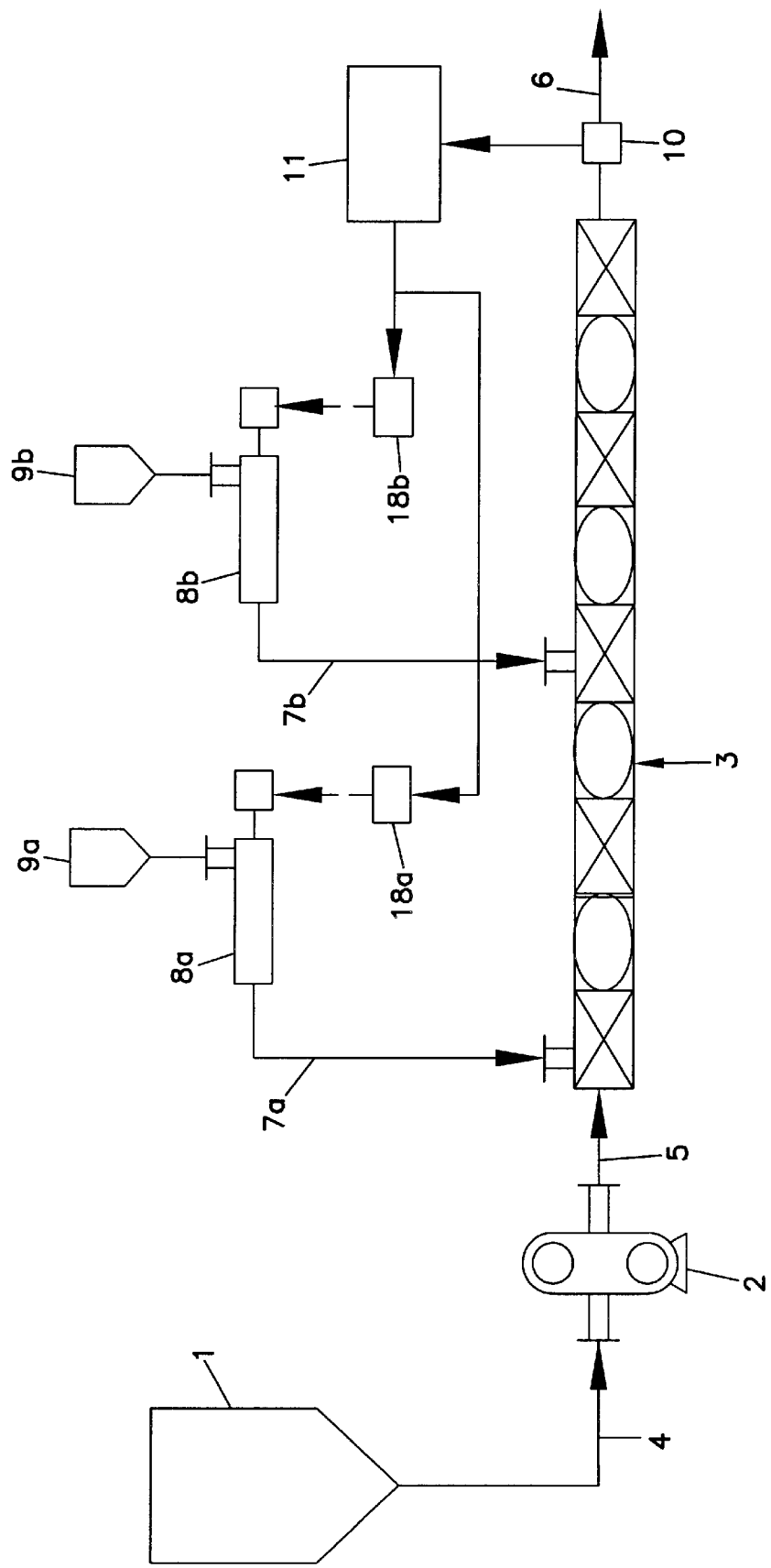
FIGS. 10 and 11 illustrate a variation of the embodiment of FIG. 1 in which a closed magnetic core is employed.
Figure 11:
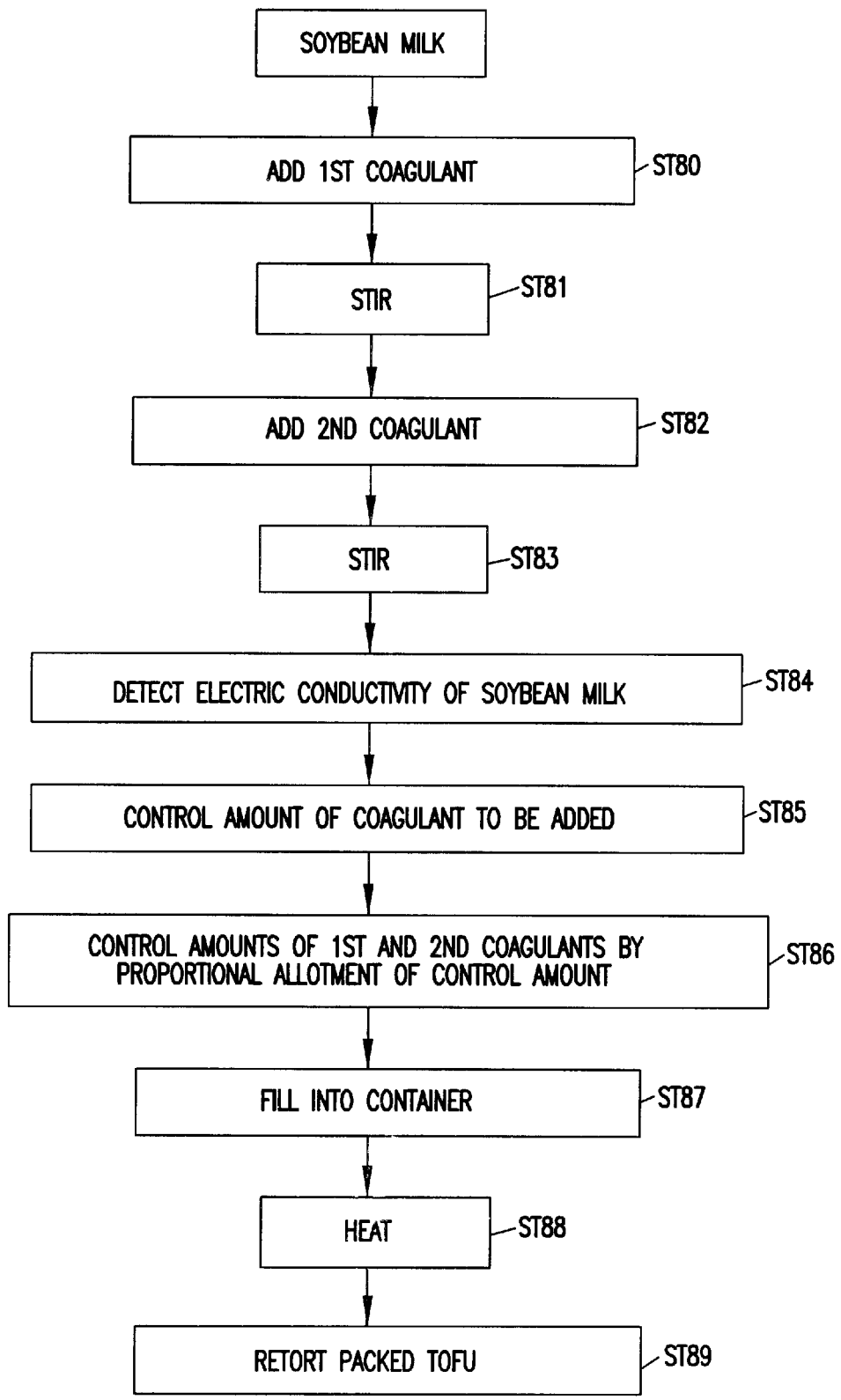

FIGS. 10 and 11 illustrate how the embodiment of FIG. 1 may be enhanced by the addition of a closed magnetically permeable core 1015 that extends through the space between the ceiling 110 and the hollow conduit 150. The core 1015 improves the inductive coupling from the antenna 170 to the plasma inside the hollow conduit 150.

Impedance match may be achieved without the impedance match circuit 175 by using, instead, a secondary winding 1120 around the core 1015 connected across a tuning capacitor 1130. The capacitance of the tuning capacitor 1130 is selected to resonate the secondary winding 1120 at the frequency of the RF power source 180. For a fixed tuning capacitor 1130, dynamic impedance matching may be provided by frequency tuning and/or by forward power servoing.

Figure 12:
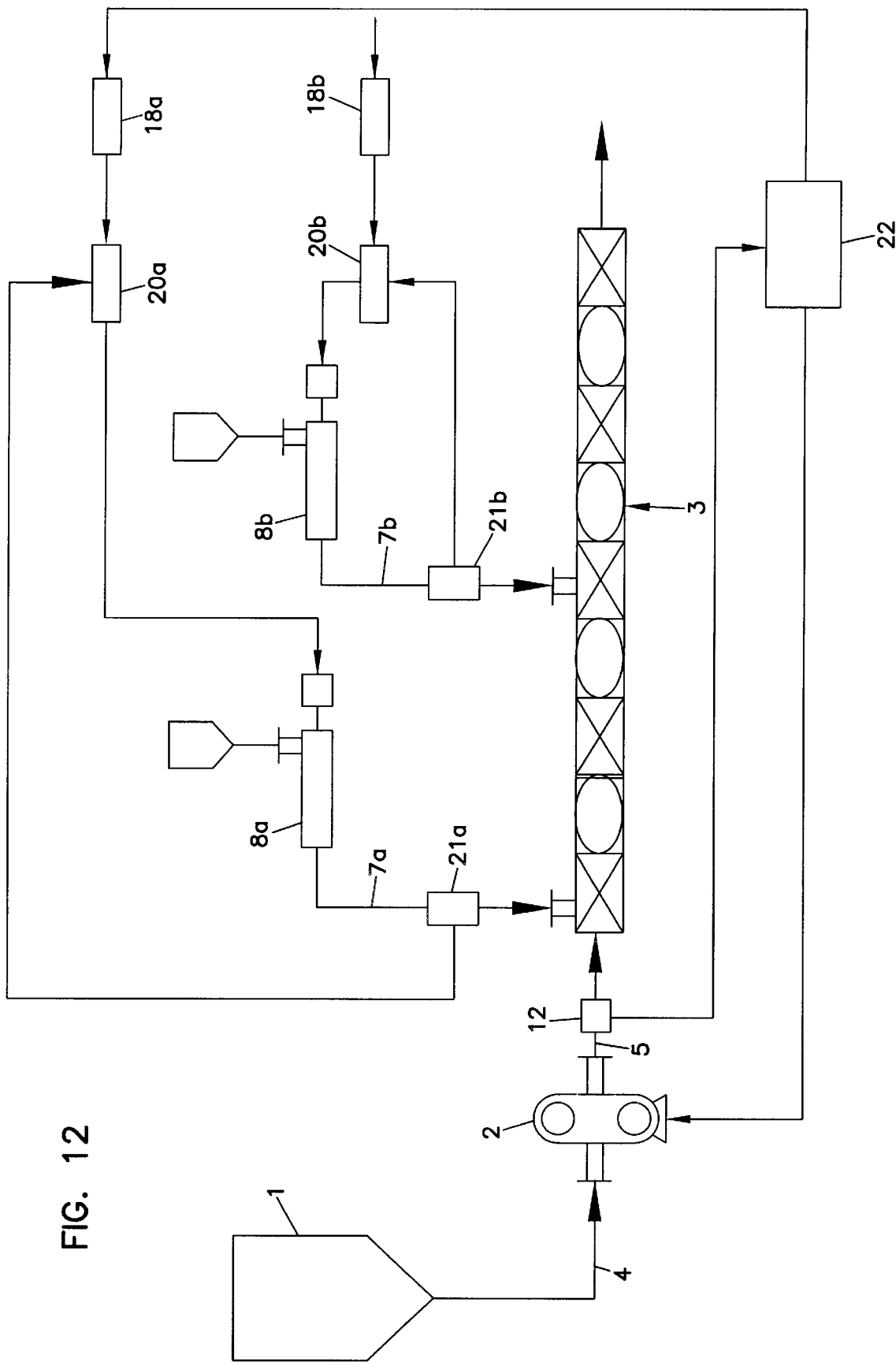
FIG. 12 illustrates another embodiment of the invention in which a torroidal plasma current path passes beneath the reactor chamber.

FIG. 12 illustrates an embodiment of the invention in which a hollow tube enclosure 1250 extends around the bottom of the reactor and communicates with the interior of the chamber through a pair of openings 1260, 1265 in the bottom floor of the chamber. A coil antenna 1270 follows along side the torroidal path provided by the hollow tube enclosure 1250 in the manner of the embodiment of FIG. 1. While FIG. 12 shows the vacuum pump 135 coupled to the bottom of the main chamber, it may just as well be coupled instead to the underlying conduit 1250.

Figure 13:
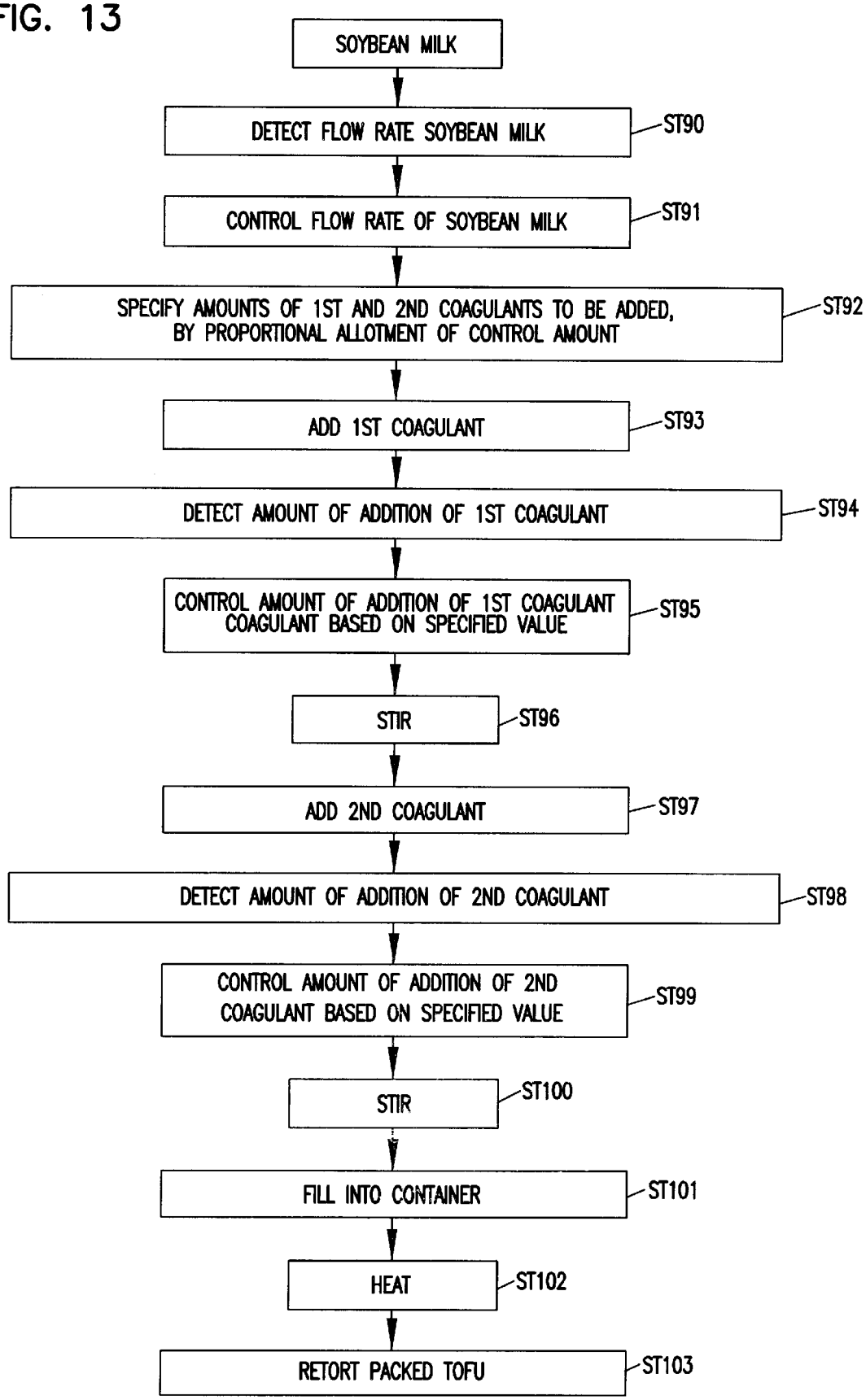
FIG. 13 illustrates a variation of the embodiment of FIG. 10 in which plasma source power is applied to a coil wound around a distal portion the closed magnetic core.

FIG. 13 illustrates a variation of the embodiment of FIGS. 10 and 11, in which the antenna 170 is replaced by an inductive winding 1320 surrounding an upper section of the core 1015. Conveniently, the winding 1320 surrounds a section of the core 1015 that is above the conduit 150 (rather than below it). However, the winding 1320 can surround any section of the core 1015.

Figure 14:
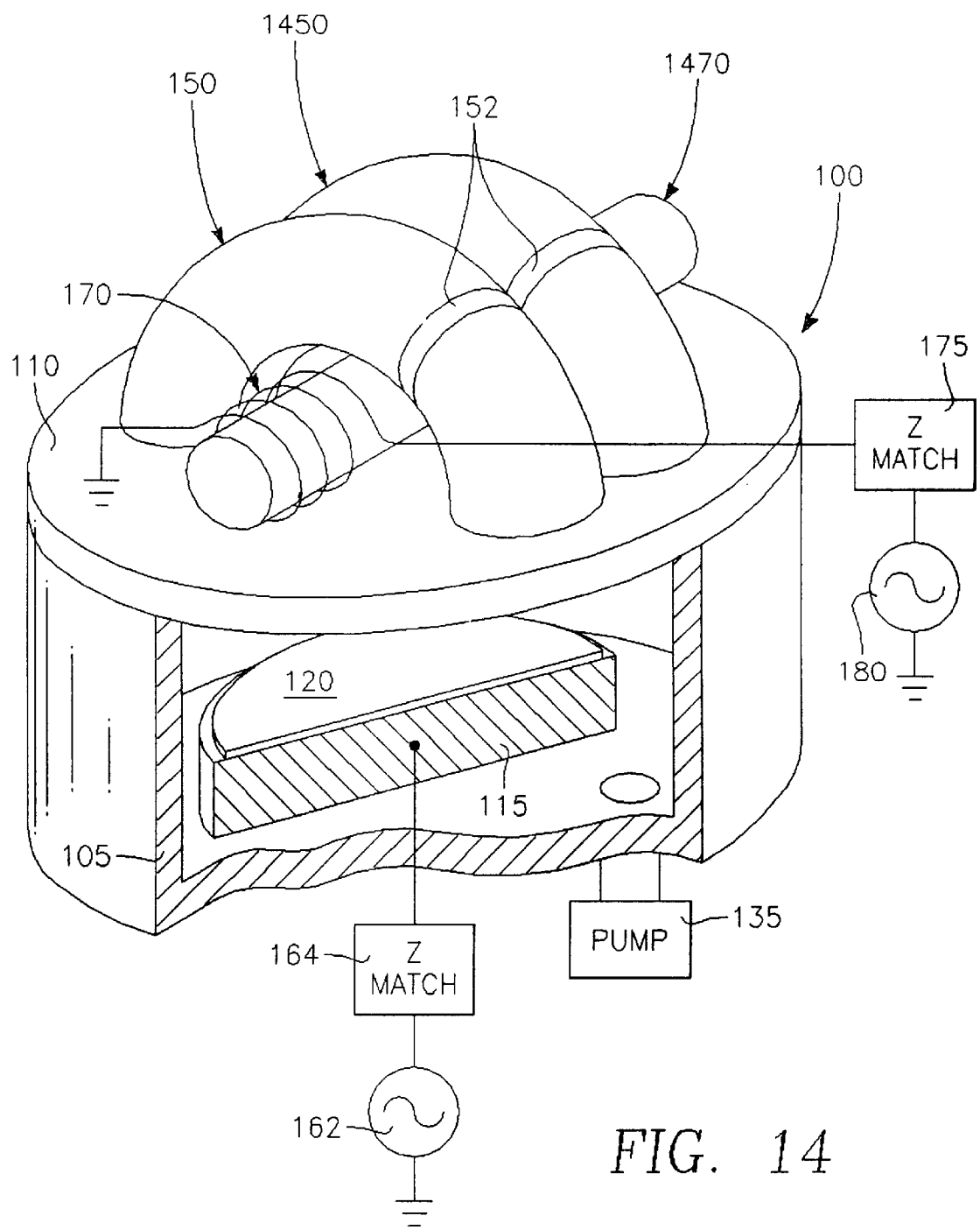
FIG. 14 illustrates an embodiment that establishes two parallel torroidal plasma currents.

FIG. 14 illustrates an extension of the concept of FIG. 13 in which a second hollow tube enclosure 1450 runs parallel to the first hollow conduit 150 and provides a parallel torroidal path for a second torroidal plasma current. The tube enclosure 1450 communicates with the chamber interior at each of its ends through respective openings in the ceiling 110. A magnetic core 1470 extends under both tube enclosures 150, 1450 and through the coil antenna 170.

Figure 15:
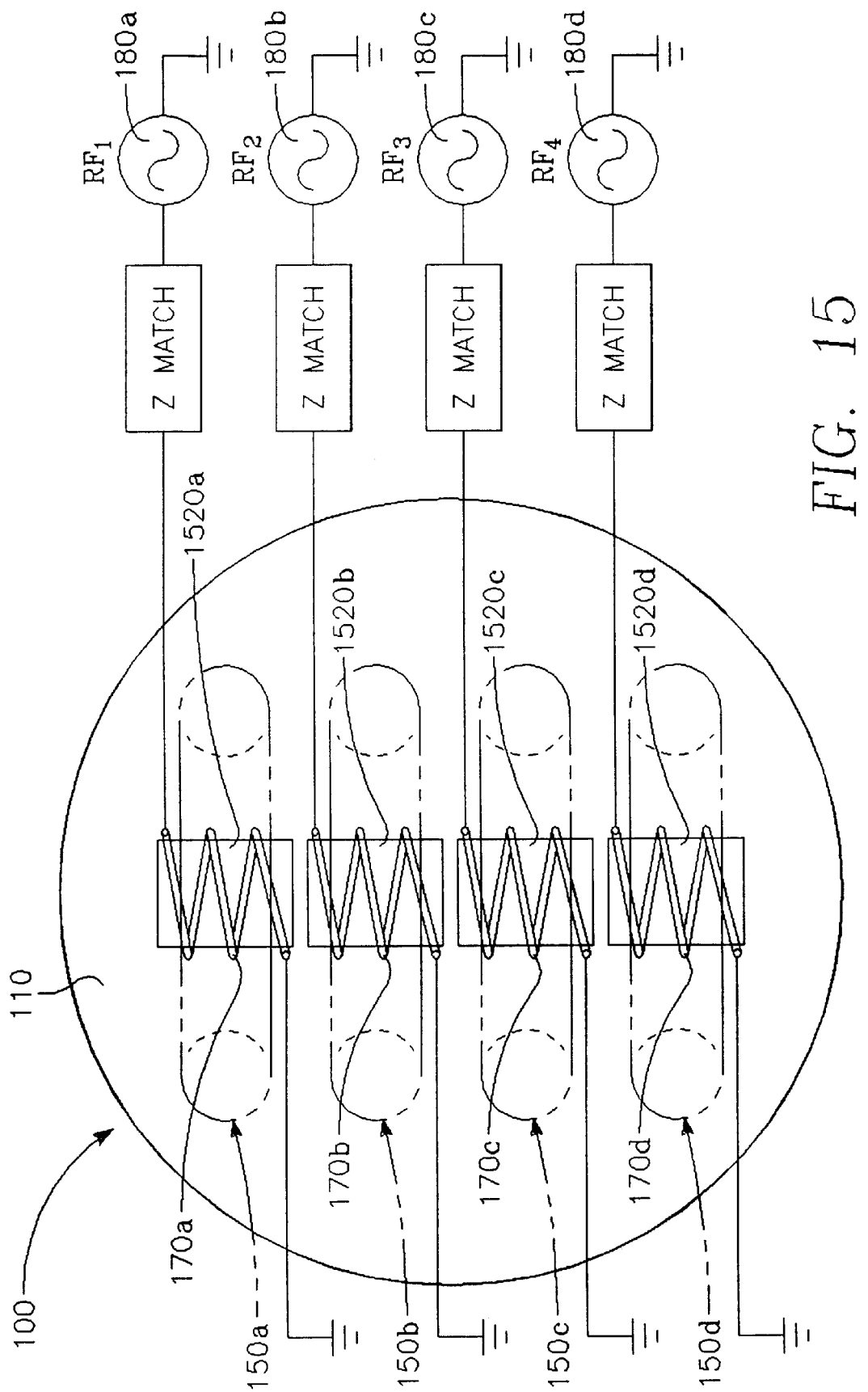
FIG. 15 illustrates an embodiment that establishes a plurality of individually controlled parallel torroidal plasma currents.

FIG. 15 illustrates an extension of the concept of FIG. 14 in which an array of parallel hollow tube enclosures 150a, 150b, 150c, 150d provide plural torroidal plasma current paths through the reactor chamber. In the embodiment of FIG. 15, the plasma ion density is controlled independently in each individual hollow conduit 150a–d by an individual coil antenna 170a–d, respectively, driven by an independent RF power source 180a–d, respectively. Individual cylindrical open cores 1520a–1520d may be separately inserted within the respective coil antennas 170a–d. In this embodiment, the relative center-to-edge ion density distribution may be adjusted by separately adjusting the power levels of the individual RF power sources 180a–d.

Figure 16:
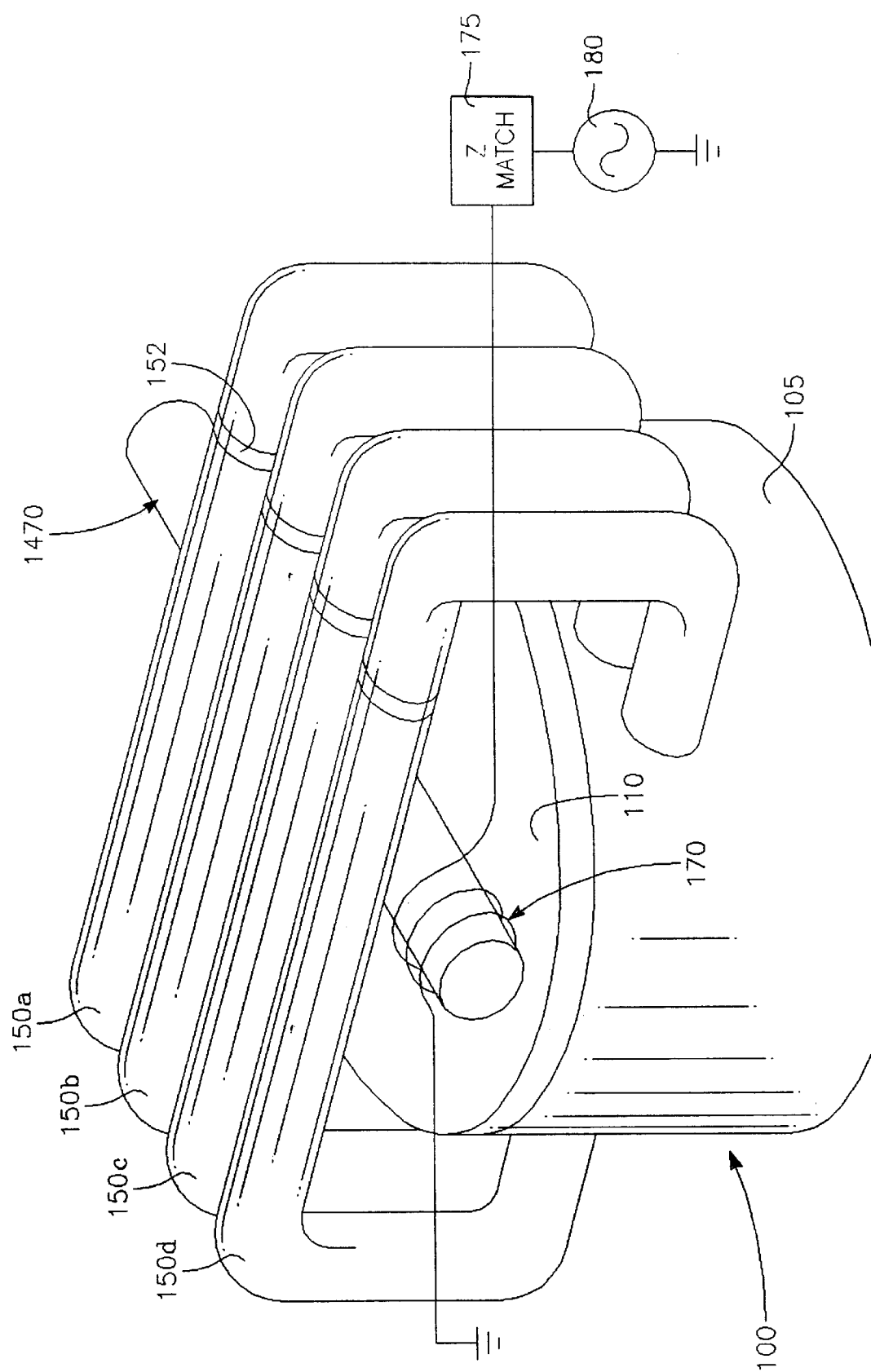
FIG. 16 illustrates a variation of the embodiment of FIG. 15 in which the parallel torroidal plasma currents enter and exit the plasma chamber through the vertical side wall rather than the ceiling.

FIG. 16 illustrates a modification of the embodiment of FIG. 15 in which the array of tube enclosures 150a–d extend through the side wall of the reactor rather than through the ceiling 110. Another modification illustrated in FIG. 16 is the use of a single common magnetic core 1470 adjacent all of the tube enclosures 150a–d and having the antenna 170 wrapped around it so that a single RF source excites the plasma in all of the tube enclosures 150a–d.

Figure 17A:
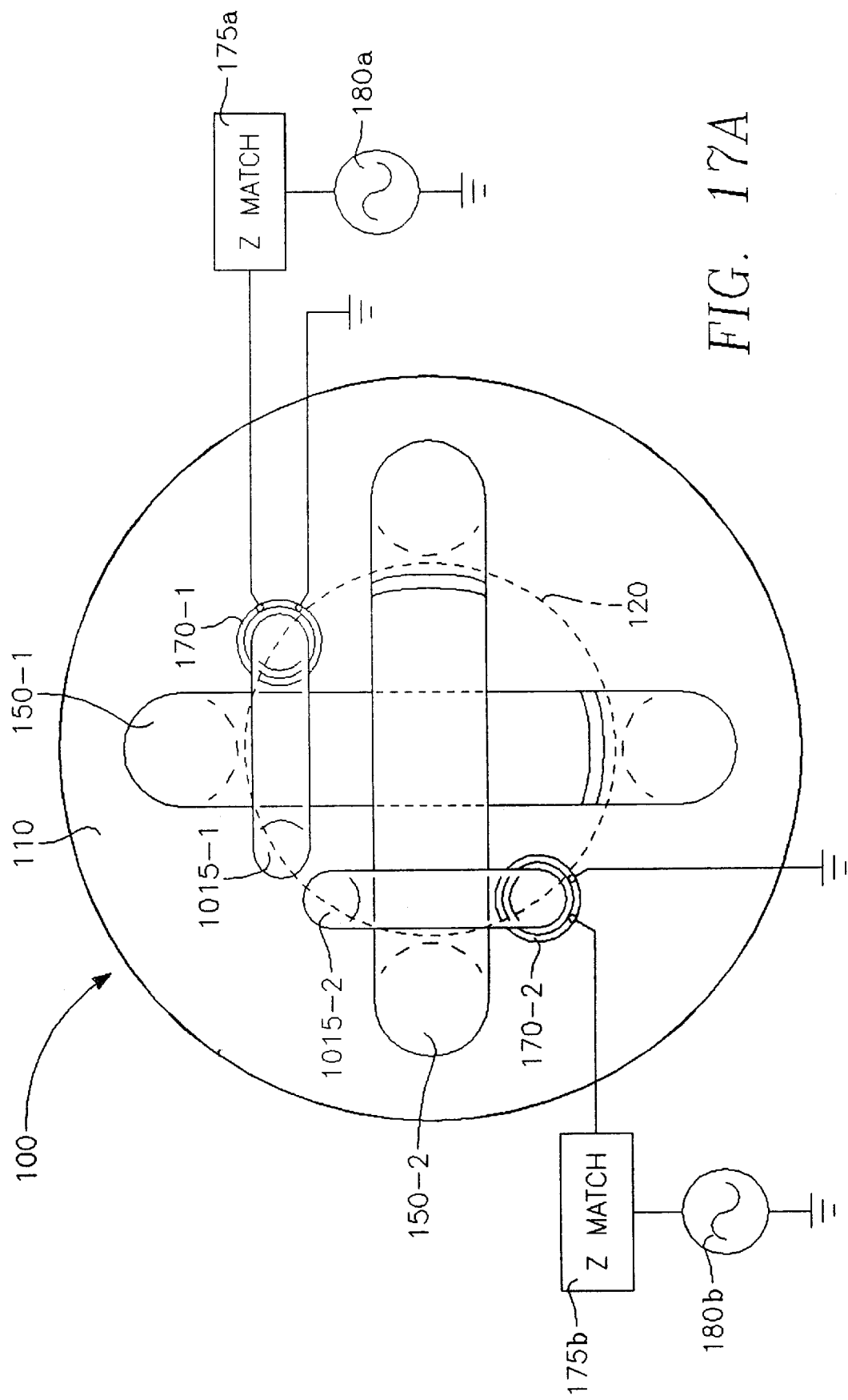
FIG. 17A illustrates an embodiment that maintains a pair of mutually orthogonal torroidal plasma currents across the surface of the workpiece.

FIG. 17A illustrates a pair of orthogonal tube enclosures 150-1 and 150-2 extending through respective ports in the ceiling 110 and excited by respective coil antennas 170-1 and 170-2. Individual cores 1015-1 and 1015-2 are within the respective coil antennas 170-1 and 170-2. This embodiment creates two mutually orthogonal torroidal plasma current paths over the wafer 120 for enhanced uniformity. The two orthogonal torroidal or closed paths are separate and independently powered as illustrated, but intersect in the process region overlying the wafer, and otherwise do not interact. In order to assure separate control of the plasma source power applied to each one of the orthogonal paths, the frequency of the respective RF generators 180a, 180b of FIG. 17 are different, so that the operation of the impedance match circuits 175a, 175b is decoupled. For example, the RF generator 180a may produce an RF signal at 11 MHz while the RF generator 180b may produce an RF signal at 12 MHz. Alternatively, independent operation may be achieved by offsetting the phases of the two RF generators 180a, 180b.

Figure 17B:
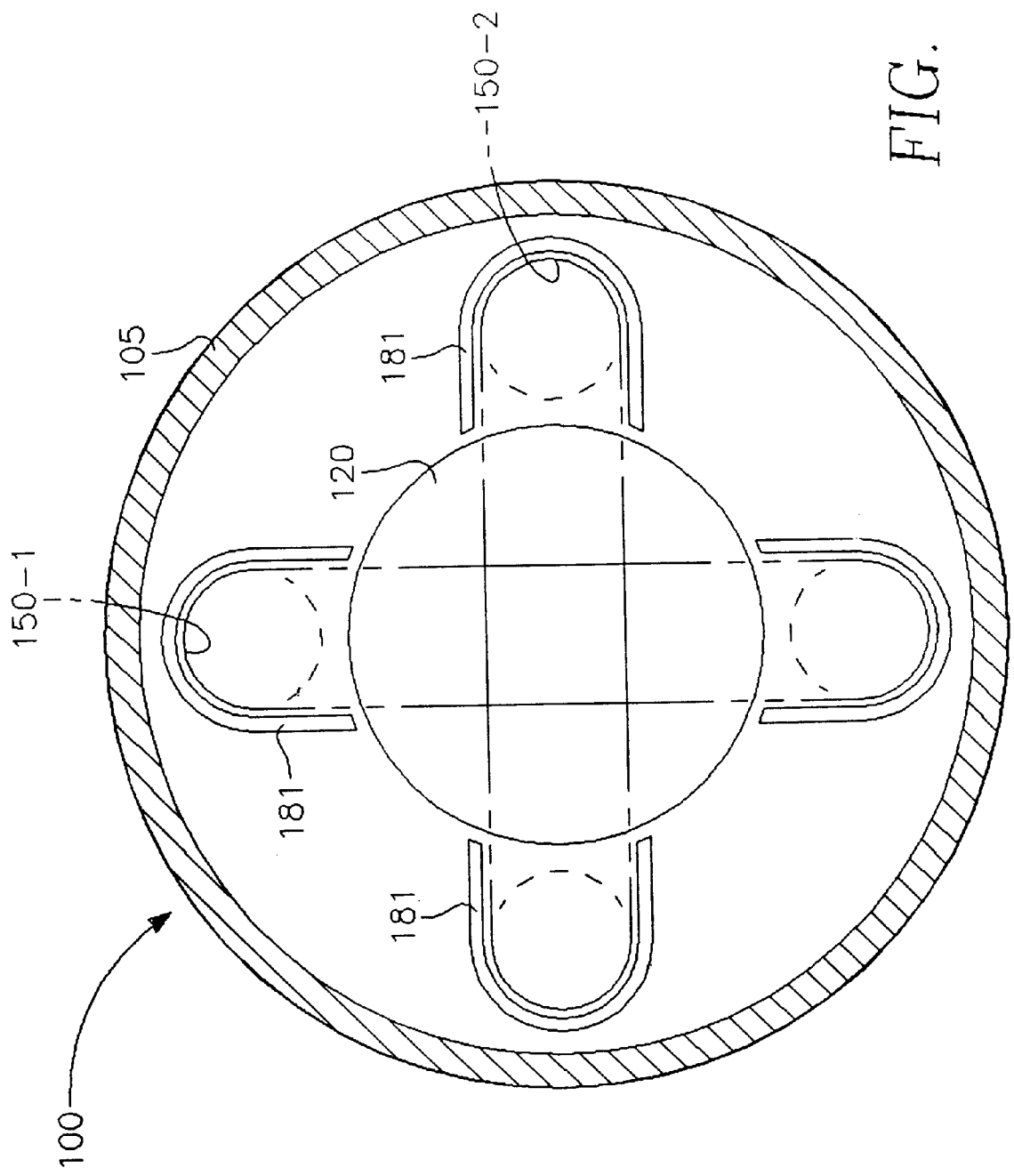
FIG. 17B illustrates the use of plural radial vanes in the embodiment of FIG. 17A.

FIG. 17B illustrates how radial vanes 181 may be employed to guide the torroidal plasma currents of each of the two conduits 150-1, 150-2 through the processing region overlying the wafer support. The radial vanes 181 extend between the openings of each conduit near the sides of the chamber up to the edge of the wafer support. The radial vanes 181 prevent diversion of plasma from one torroidal path to the other torroidal path, so that the two plasma currents only intersect within the processing region overlying the wafer support.

Embodiments Suitable for Large Diameter Wafers

In addition to the recent industry trends toward smaller device sizes and higher device densities, another trend is toward greater wafer diameters. For example, 12-inch diameter wafers are currently entering production, and perhaps larger diameter wafers will be in the future. The advantage is greater throughput because of the large number of integrated circuit die per wafer. The disadvantage is that in plasma processing it is more difficult to maintain a uniform plasma across a large diameter wafer. The following embodiments of the present invention are particularly adapted for providing a uniform plasma ion density distribution across the entire surface of a large diameter wafer, such as a 12-inch diameter wafer.

Figure 18:
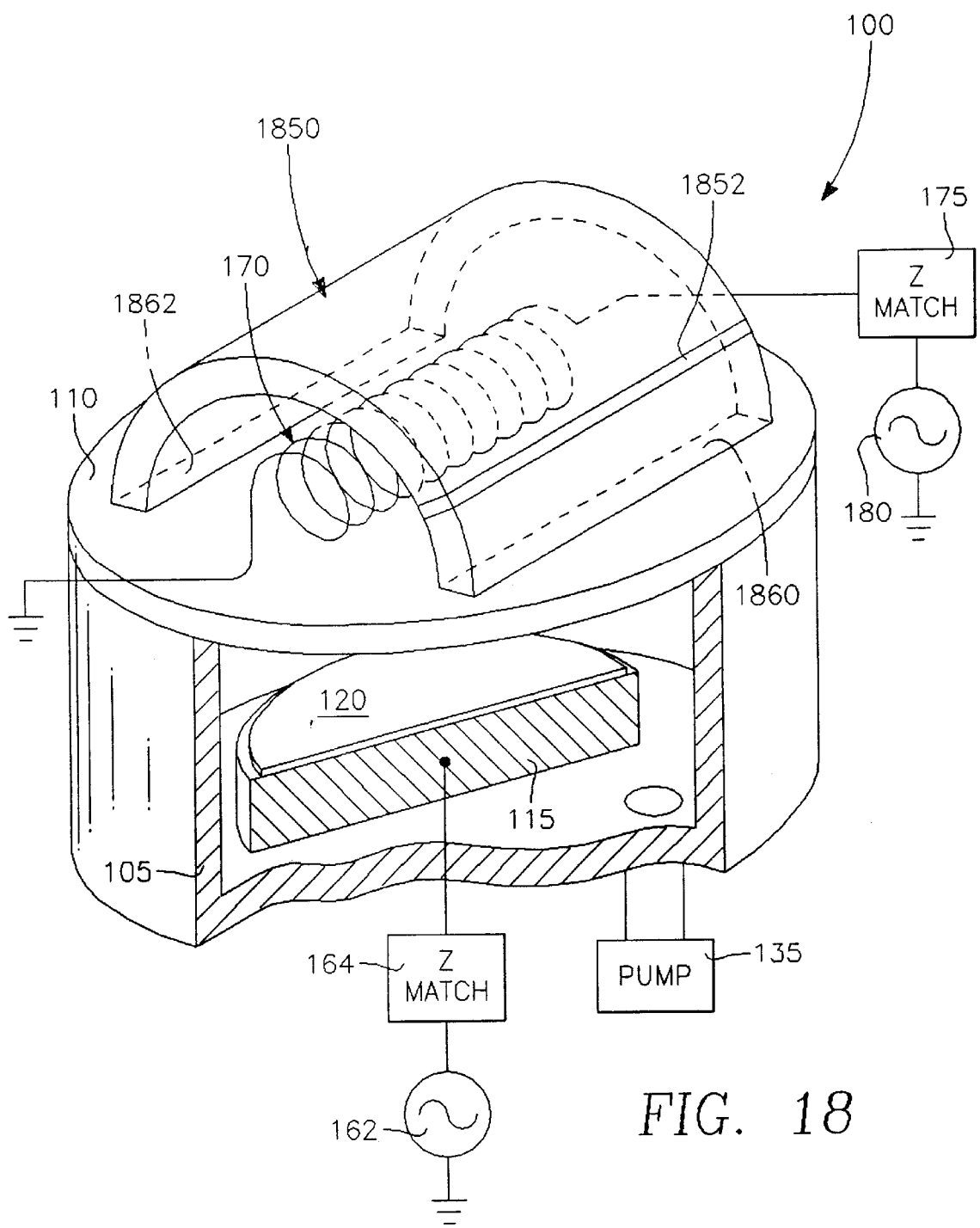
FIGS. 18 and 19 illustrate an embodiment of the invention in which the torroidal plasma current is a broad belt that extends across a wide path suitable for processing large wafers.
Figure 19:
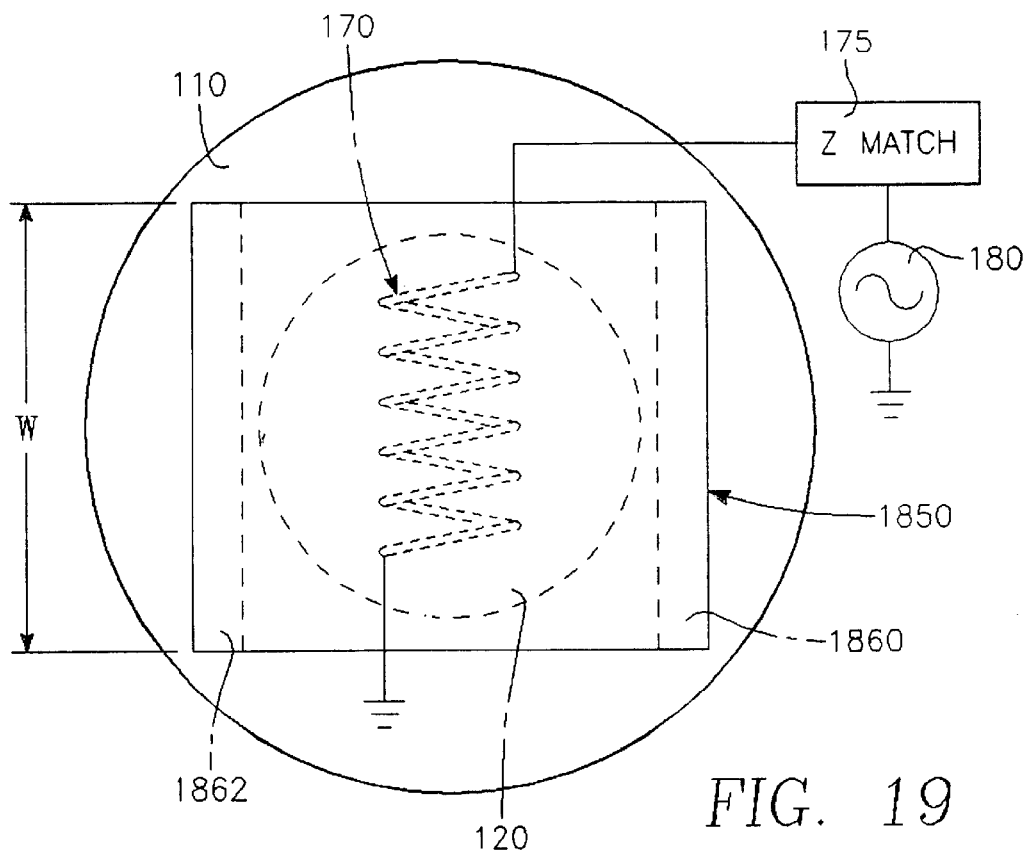
Figure 20:
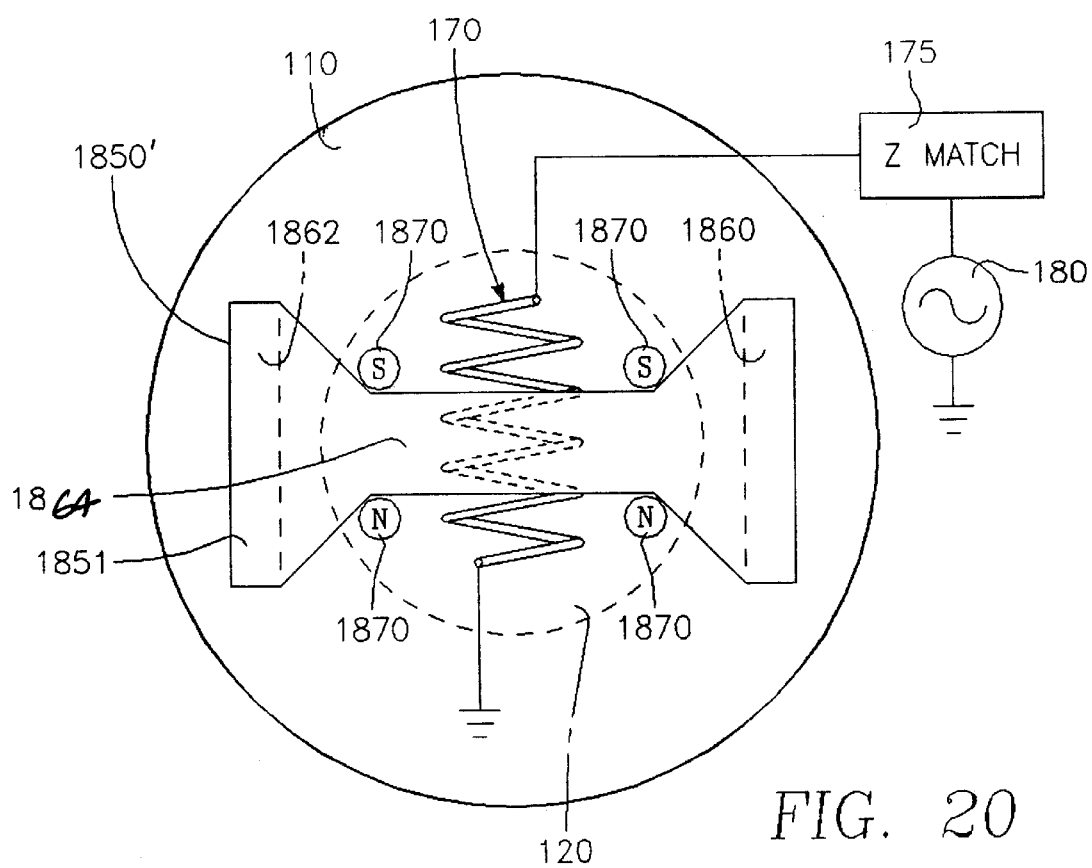
FIG. 20 illustrates a variation of the embodiment of FIG. 18 in which an external section of the torroidal plasma current path is constricted.

FIGS. 18 and 19 illustrate a hollow tube enclosure 1810 which is a wide flattened rectangular version 1850 of the hollow conduit 150 of FIG. 1 that includes an insulating gap 1852. This version produces a wide "belt" of plasma that is better suited for uniformly covering a large diameter wafer such as a 12-inch diameter wafer or workpiece. The width W of the tube enclosure and of the pair of openings 1860, 1862 in the ceiling 110 preferably exceeds the wafer by about 5% or more. For example, if the wafer diameter is 10 inches, then the width W of the rectangular tube enclosure 1850 and of the openings 1860, 1862 is about 11 inches. FIG. 20 illustrates a modified version 18501 of the rectangular tube enclosure 1850 of FIGS. 18 and 19 in which a portion 1864 of the exterior tube enclosure 1850 is constricted. However, the unconstricted version of FIGS. 18 and 19 is preferred.

FIG. 20 further illustrates the optional use of focusing magnets 1870 at the transitions between the constricted and unconstricted portions of the enclosure 1850. The focusing magnets 1870 promote a better movement of the plasma between the constricted and unconstricted portions of the enclosure 1850, and specifically promote a more uniform spreading out of the plasma as it moves across the transition between the constricted portion 1864 and the unconstricted portion of the tube enclosure 1850.

Figure 21:
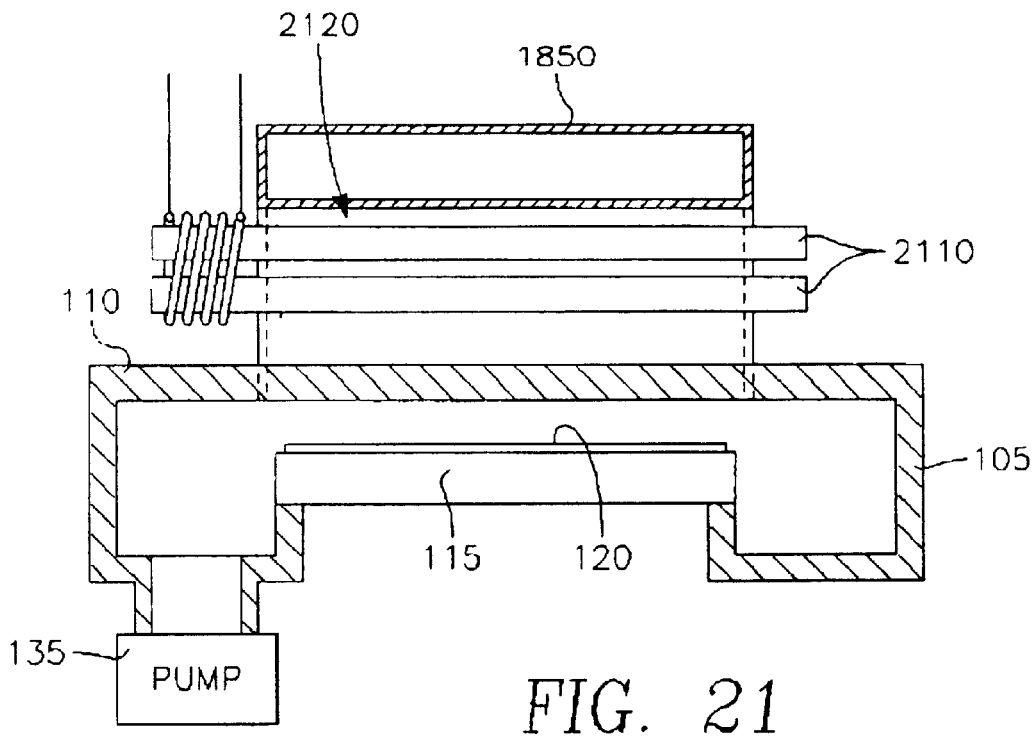
FIG. 21 illustrates a variation of the embodiment of FIG. 18 employing cylindrical magnetic cores whose axial positions may be adjusted to adjust ion density distribution across the wafer surface.
Figure 22:
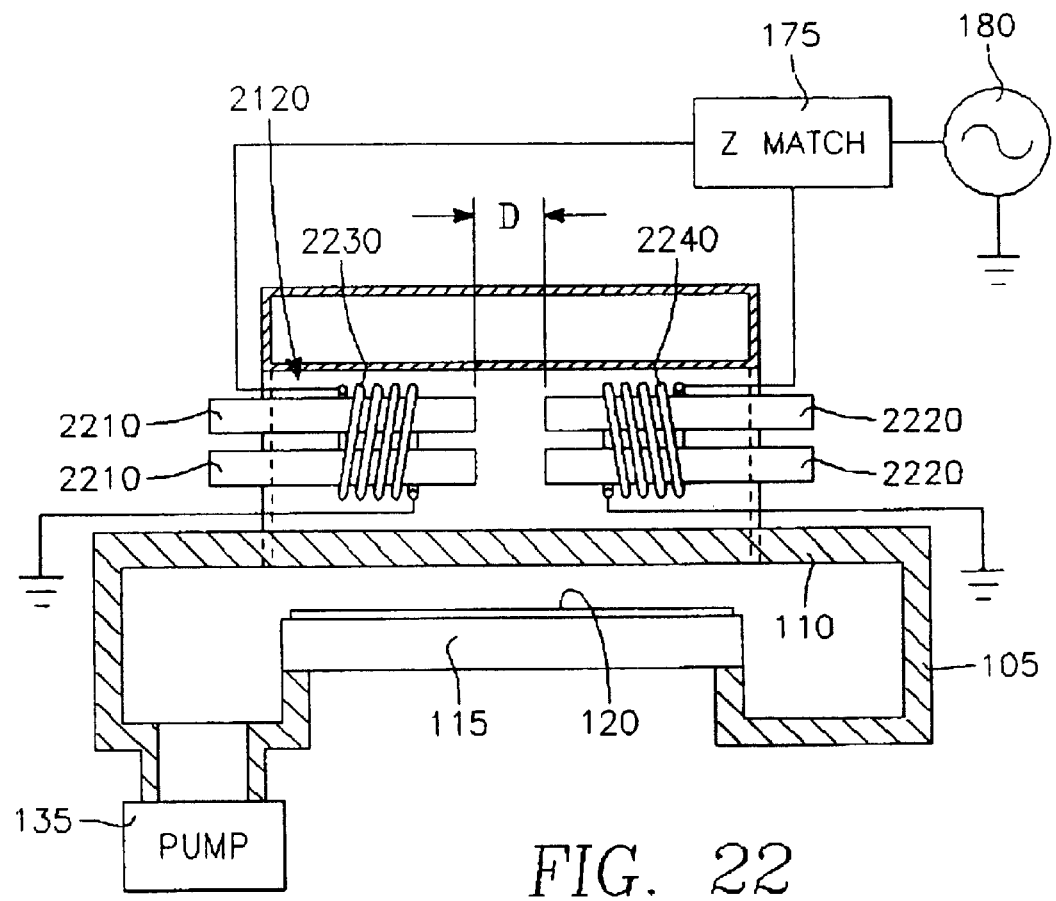
FIG. 22 illustrates a variation of FIG. 21 in which a pair of windings are wound around a pair of groups of cylindrical magnetic cores.
Figure 23:
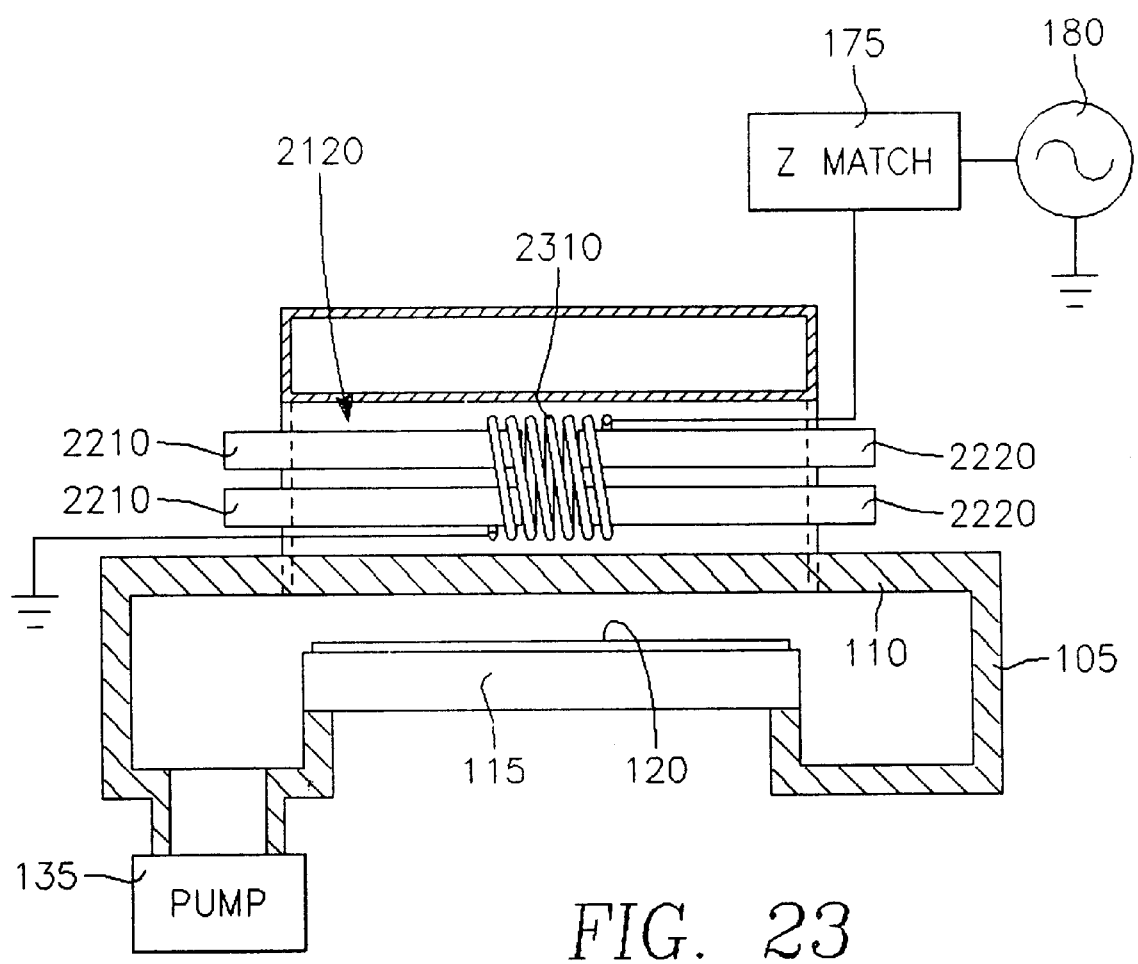
FIG. 23 illustrates a variation of FIG. 22 in which a single common winding is wound around both groups of cores.

FIG. 21 illustrates how plural cylindrical magnetic cores 2110 may be inserted through the exterior region 2120 circumscribed by the tube enclosure 1850. The cylindrical cores 2110 are generally parallel to the axis of symmetry of the tube enclosure 1850. FIG. 22 illustrates a modification of the embodiment of FIG. 21 in which the cores 2110 extend completely through the exterior region 2120 surrounded by the tube enclosure 1850 are replaced by pairs of shortened cores 2210, 2220 in respective halves of the exterior region 2120. The side coils 165, 186 are replaced by a pair of coil windings 2230, 2240 surrounding the respective core pairs 2210, 2220. In this embodiment, the displacement D between the core pairs 2210, 2220 may be changed to adjust the ion density near the wafer center relative to the ion density at the wafer circumference. A wider displacement D reduces the inductive coupling near the wafer center and therefore reduces the plasma ion density at the wafer center. Thus, an additional control element is provided for precisely adjusting ion density spatial distribution across the wafer surface. FIG. 23 illustrates a variation of the embodiment of FIG. 22 in which the separate windings 2230, 2240 are replaced by a single center winding 2310 centered with respect to the core pairs 2210, 2220.

Figure 24:
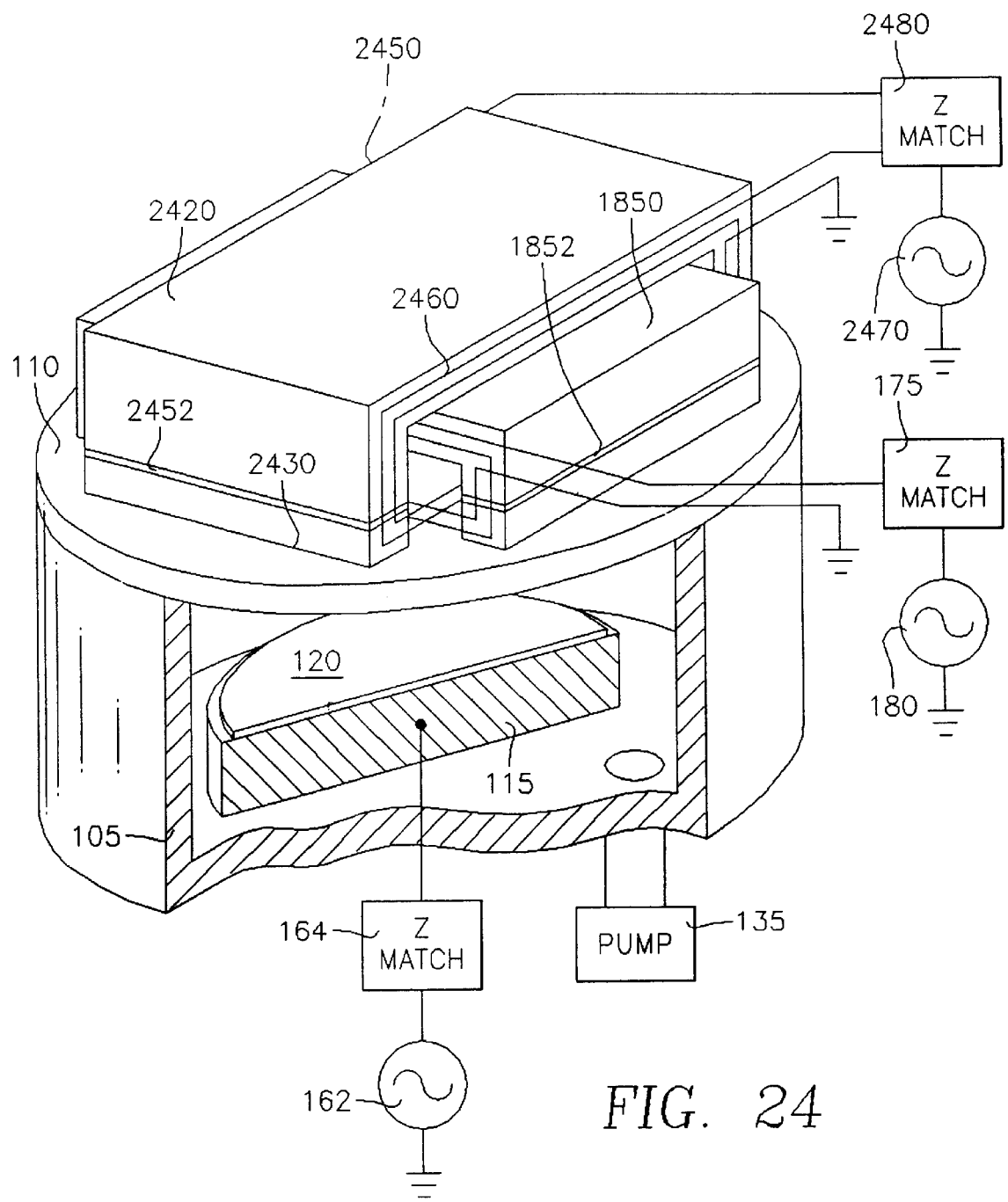
FIGS. 24 and 25 illustrate an embodiment that maintains a pair of mutually orthogonal torroidal plasma currents which are wide belts suitable for processing large wafers.
Figure 25:
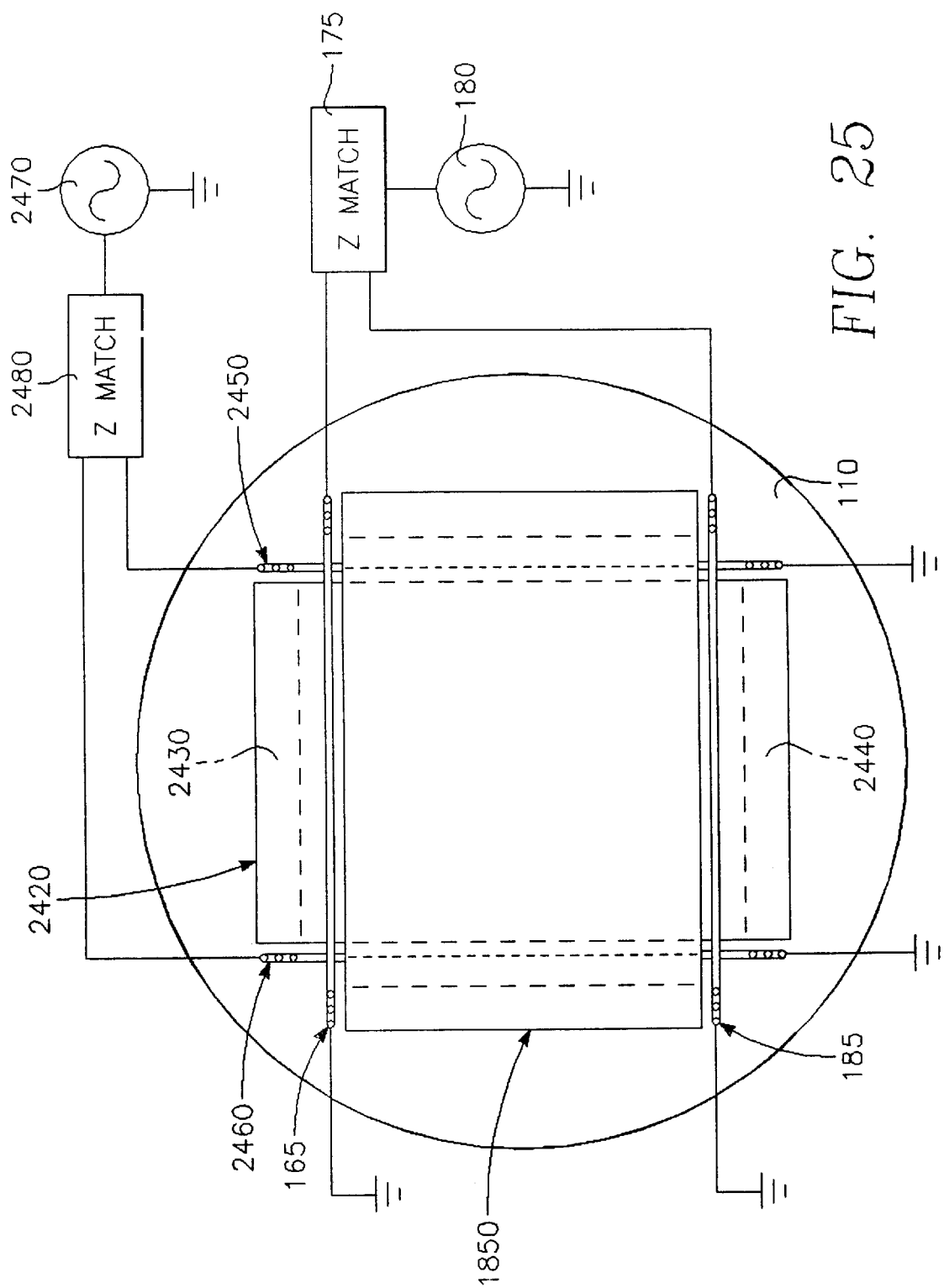

FIGS. 24 and 25 illustrate an embodiment providing even greater uniformity of plasma ion density distribution across the wafer surface. In the embodiment of FIGS. 24 and 25, two torroidal plasma current paths are established that are transverse to one another and preferably are mutually orthogonal. This is accomplished by providing a second wide rectangular hollow enclosure 2420 extending transversely and preferably orthogonally relative to the first tube enclosure 1850. The second tube enclosure 2420 communicates with the chamber interior through a pair of openings 2430, 2440 through the ceiling 110 and includes an insulating gap 2452. A pair of side coil windings 2450, 2460 along the sides of the second tube enclosure 2420 maintain a plasma therein and are driven by a second RF power supply 2470 through an impedance match circuit 2480. As indicated in FIG. 24, the two orthogonal plasma currents coincide over the wafer surface and provide more uniform coverage of plasma over the wafer surface. This embodiment is expected to find particularly advantageous use for processing large wafers of diameters of 10 inches and greater.

As in the embodiment of FIG. 17, the embodiment of FIG. 24 creates two mutually orthogonal torroidal plasma current paths over the wafer 120 for enhanced uniformity. The two orthogonal torroidal or closed paths are separate and independently powered as illustrated, but intersect in the process region overlying the wafer, and otherwise do not interact or otherwise divert or diffuse one another. In order to assure separate control of the plasma source power applied to each one of the orthogonal paths, the frequency of the respective RF generators 180, 2470 of FIG. 24 are different, so that the operation of the impedance match circuits 175, 2480 is decoupled. For example, the RF generator 180 may produce an RF signal at 11 MHz while the RF generator 2470 may produce an RF signal at 12 MHz. Alternatively, independent operation may be achieved by offsetting the phases of the two RF generators 180, 2470.

Figure 26:
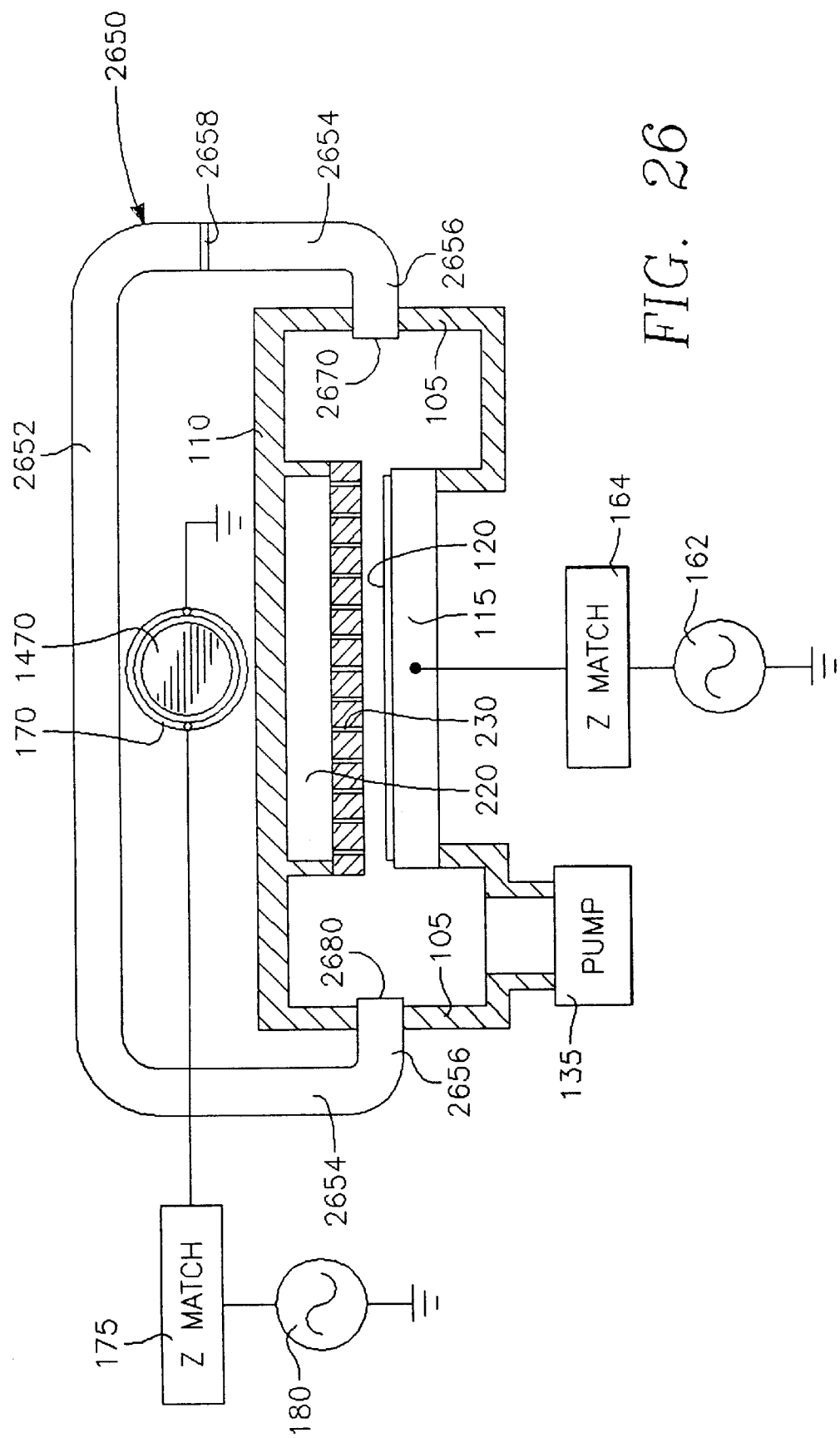
FIG. 26 illustrates a variation of the embodiment of FIG. 25 in which magnetic cores are employed to enhance inductive coupling.

FIG. 26 illustrates a variation of the embodiment of FIG. 18 in which a modified rectangular enclosure 2650 that includes an insulating gap 2658 communicates with the chamber interior through the chamber side wall 105 rather than through the ceiling 110. For this purpose, the rectangular enclosure 2650 has a horizontal top section 2652, a pair of downwardly extending legs 2654 at respective ends of the top section 2652 and a pair of horizontal inwardly extending legs 2656 each extending from the bottom end of a respective one of the downwardly extending legs 2654 to a respective opening 2670, 2680 in the side wall 105.

Figure 27:
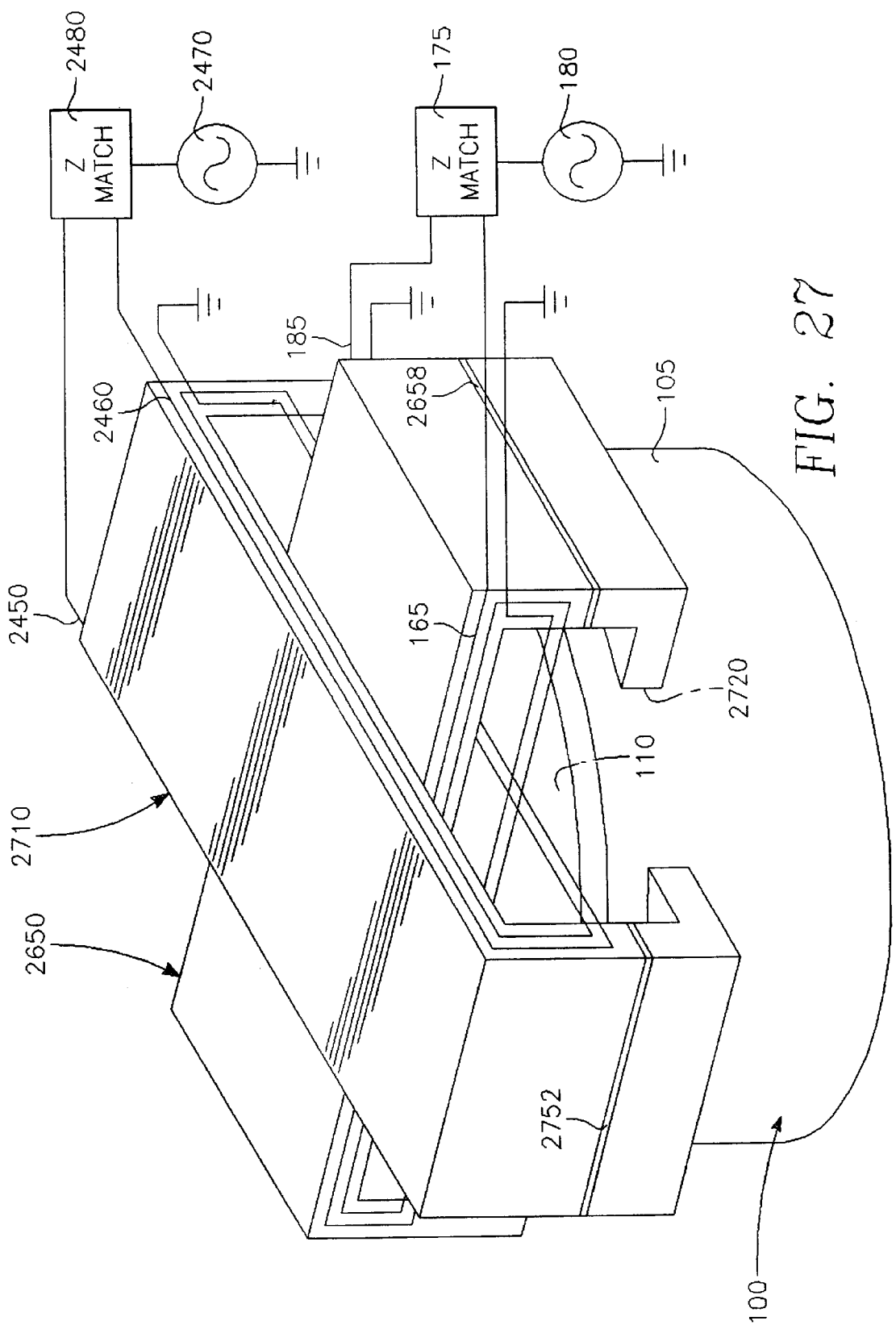
FIG. 27 illustrates a modification of the embodiment of FIG. 24 in which the orthogonal plasma belts enter and exit the reactor chamber through the vertical side wall rather than through the horizontal ceiling.

FIG. 27 illustrates how a second rectangular tube enclosure 2710 including an insulating gap 2752 may be added to the embodiment of FIG. 26, the second tube enclosure 2710 being identical to the rectangular tube enclosure 2650 of FIG. 26 except that the rectangular tube enclosures 2650, 2710 are mutually orthogonal (or at least transverse to one another). The second rectangular tube enclosure communicates with the chamber interior through respective openings through the side wall 105, including the opening 2720. Like the embodiment of FIG. 25, the tube enclosures 2650 and 2710 produce mutually orthogonal torroidal plasma currents that coincide over the wafer surface to provide superior uniformity over a broader wafer diameter. Plasma source power is applied to the interior of the tube enclosures through the respective pairs of side coil windings 165, 185 and 2450, 2460.

Figure 28A:
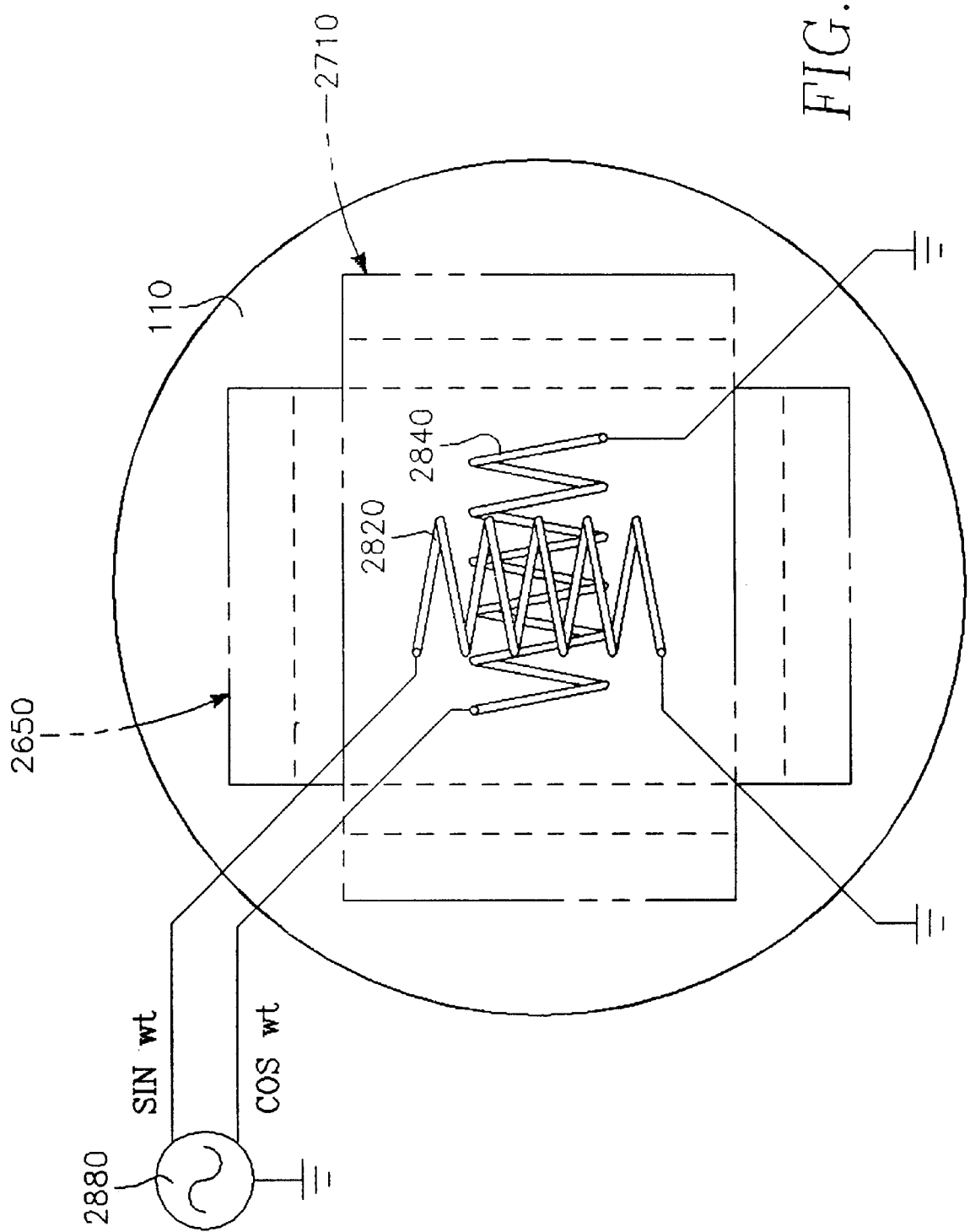
FIG. 28A illustrates an implementation of the embodiment of FIG. 24 which produces a rotating torroidal plasma current.

FIG. 28A illustrates how the side coils 165, 185, 2450, 2460 may be replaced (or supplemented) by a pair of mutually orthogonal interior coils 2820, 2840 lying within the external region 2860 surrounded by the two rectangular tube enclosures 2650, 2710. Each one of the coils 2820, 2840 produces the torroidal plasma current in a corresponding one of the rectangular tube enclosures 2650, 2710. The coils 2820, 2840 may be driven completely independently at different frequencies or at the same frequency with the same or a different phase. Or, they may be driven at the same frequency but with a phase difference (i.e., 90 degrees) that causes the combined torroidal plasma current to rotate at the source power frequency. In this case the coils 2820, 2840 are driven with the sin and cosine components, respectively, of a common signal generator 2880, as indicated in FIG. 28A. The advantage is that the plasma current path rotates azimuthally across the wafer surface at a rotational frequency that exceeds the plasma ion frequency so that non-uniformities are better suppressed than in prior art methods such as MERIE reactors in which the rotation is at a much lower frequency.

Figure 28B:
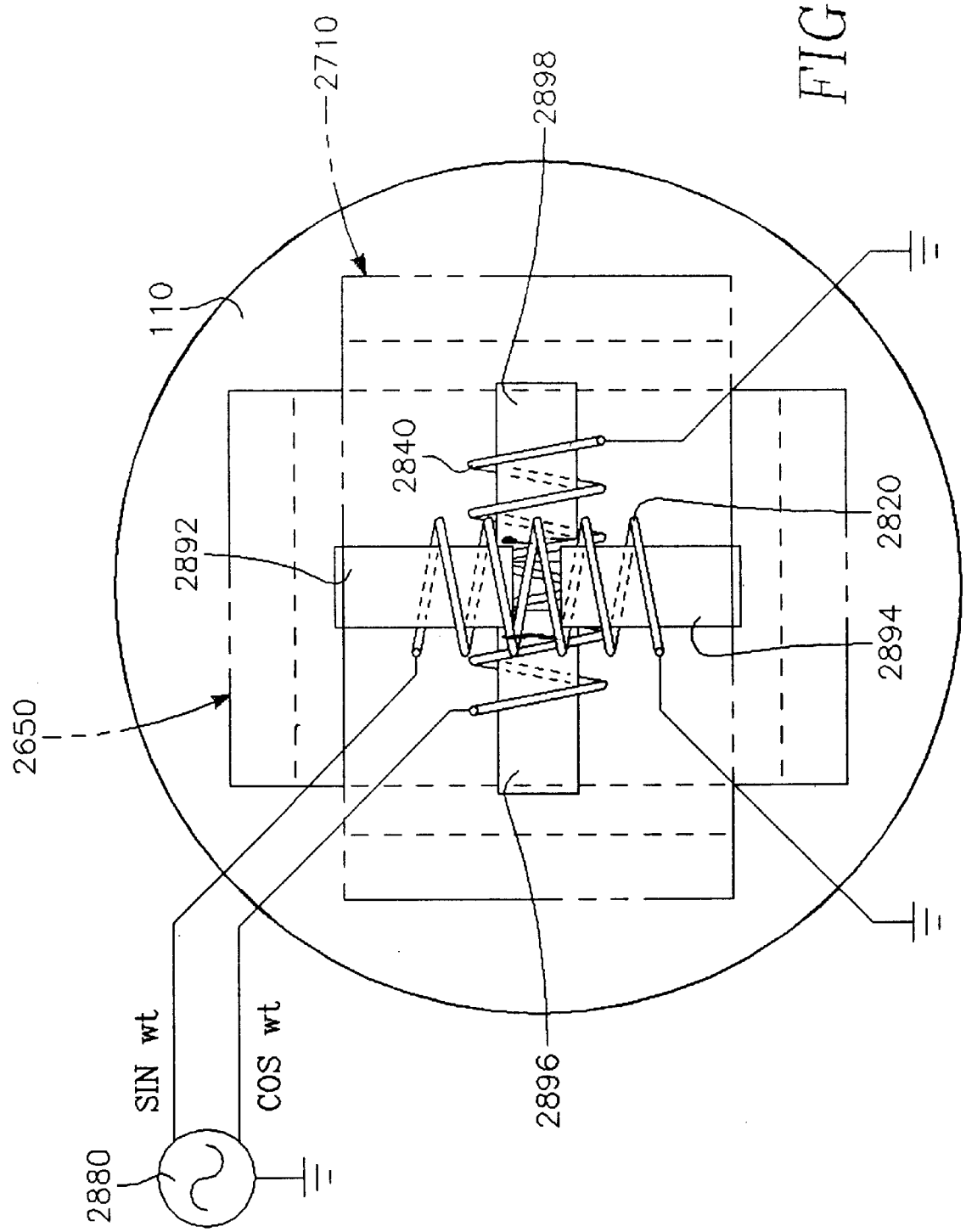
FIG. 28B illustrates a version of the embodiment of FIG. 28A that includes magnetic cores.

Referring now to FIG. 28B, radial adjustment of plasma ion density may be generally provided by provision of a pair of magnetic cylindrical cores 2892, 2894 that may be axially moved toward or away from one another within the coil 2820 and a pair of magnetic cylindrical cores 2896, 2898 that may be axially moved toward or away from one another within the coil 2840. As each pair of cores is moved toward one another, inductive coupling near the center of each of the orthogonal plasma currents is enhanced relative to the edge of the current, so that plasma density at the wafer center is generally enhanced. Thus, the center-to-edge plasma ion density may be controlled by moving the cores 2892, 2894, 2896, 2898.

Figure 29:
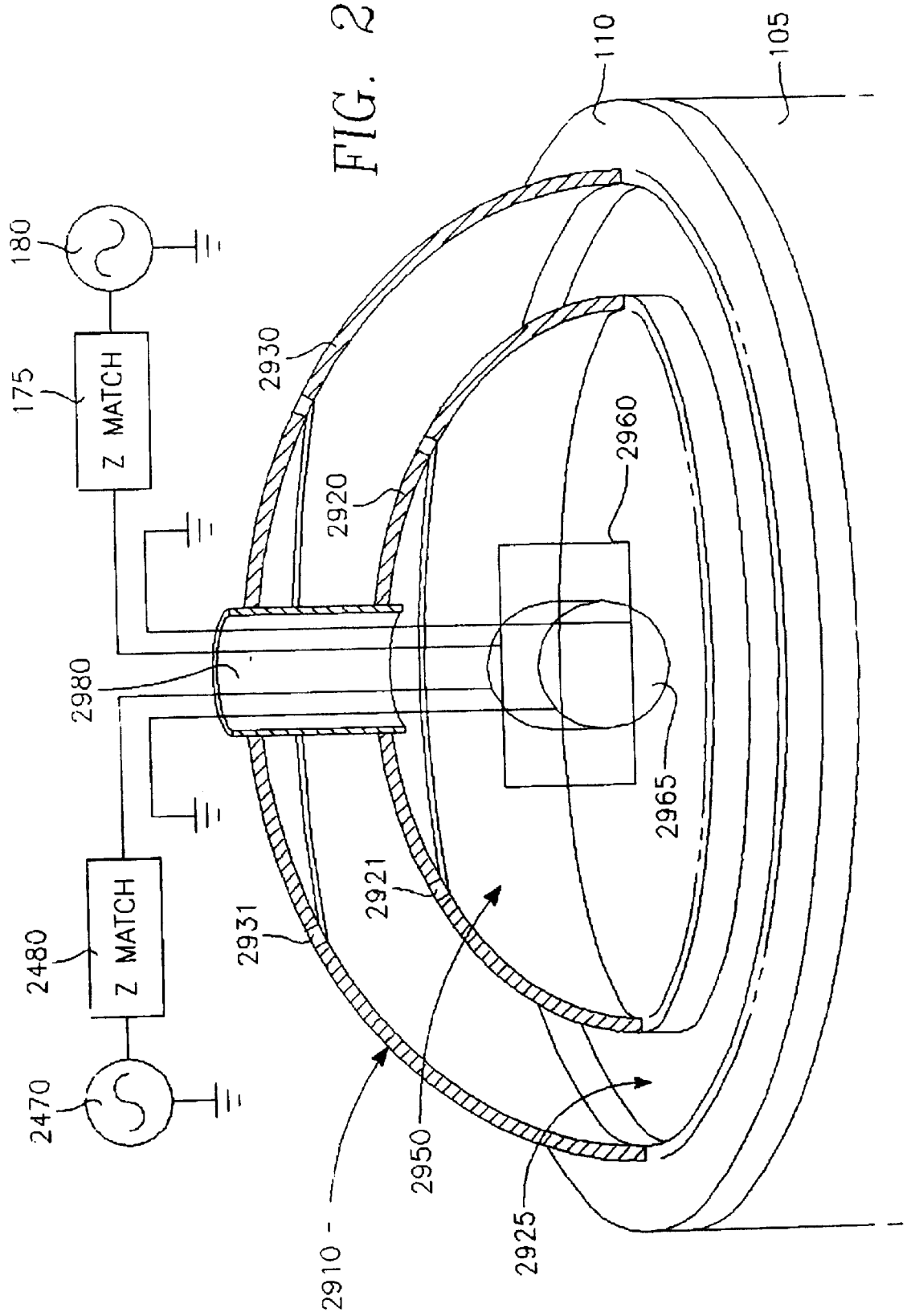
FIG. 29 illustrates a preferred embodiment of the invention in which a continuous circular plenum is provided to enclose the torroidal plasma current.

FIG. 29 illustrates an alternative embodiment of the invention in which the two tube enclosures 2650, 2710 are merged together into a single enclosure 2910 that extends 360 degrees around the center axis of the reactor that constitutes a single plenum. In the embodiment of FIG. 29, the plenum 2910 has a half-dome lower wall 2920 and a half-dome upper wall 2930 generally congruent with the lower wall 2920. The plenum 2910 is therefore the space between the upper and lower half-dome walls 2920, 2930. An insulating gap 2921 may extend around the upper dome wall 2920 and/or an insulating gap 2931 may extend around the lower dome wall 2930. The plenum 2910 communicates with the chamber interior through an annular opening 2925 in the ceiling 110 that extends 360 degrees around the axis of symmetry of the chamber.

The plenum 2910 completely encloses a region 2950 above the ceiling 110. In the embodiment of FIG. 29, plasma source power is coupled into the interior of the plenum 2910 by a pair of mutually orthogonal coils 2960, 2965. Access to the coils 2960, 2965 is provided through a vertical conduit 2980 passing through the center of the plenum 2910. Preferably, the coils 2960, 2965 are driven in quadrature as in the embodiment of FIG. 28 to achieve an azimuthally circulating torroidal plasma current (i.e., a plasma current circulating within the plane of the wafer. The rotation frequency is the frequency of the applied RF power.

Figure 30:
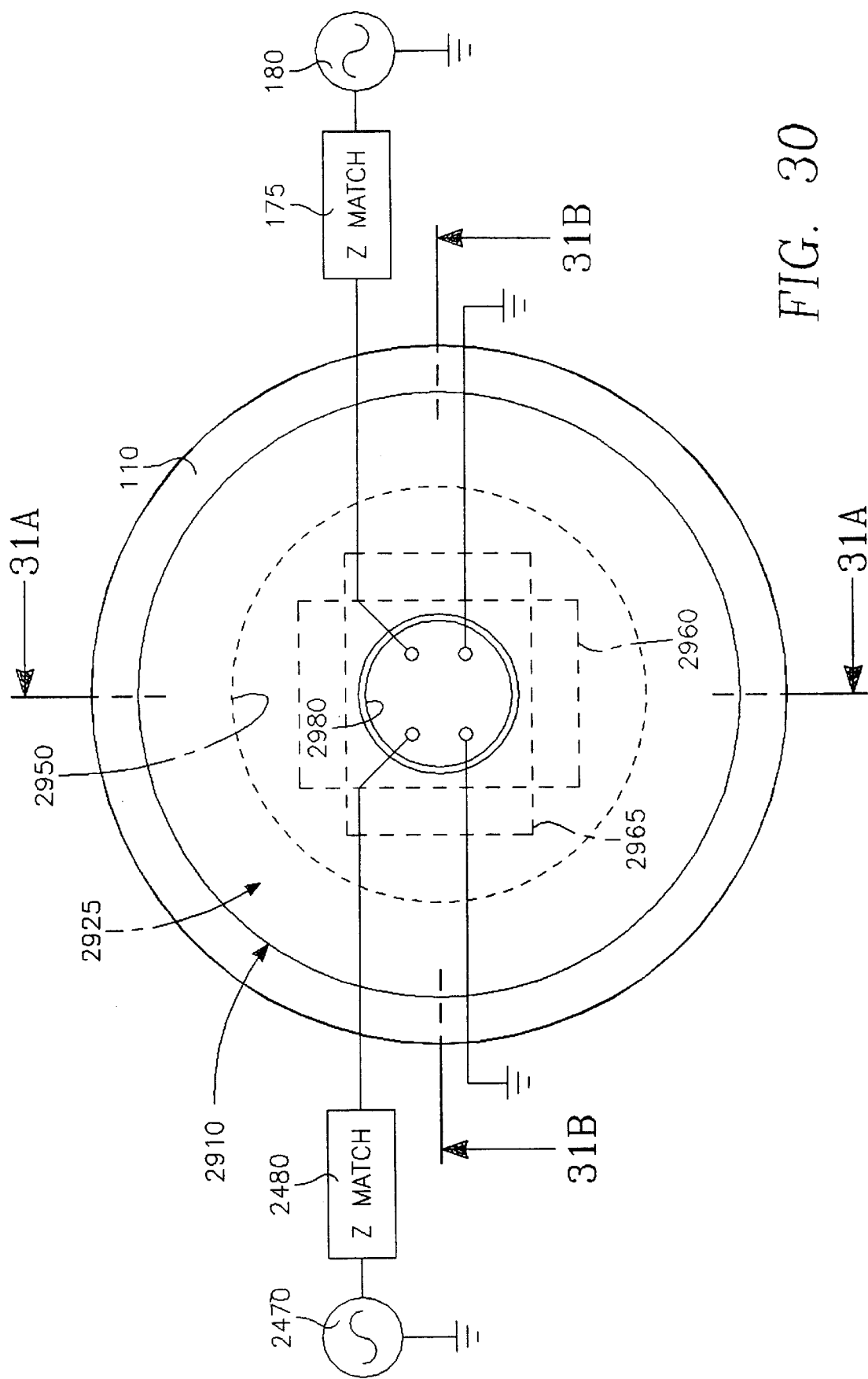
FIG. 30 is a top sectional view corresponding to FIG. 29.
Figure 31A:
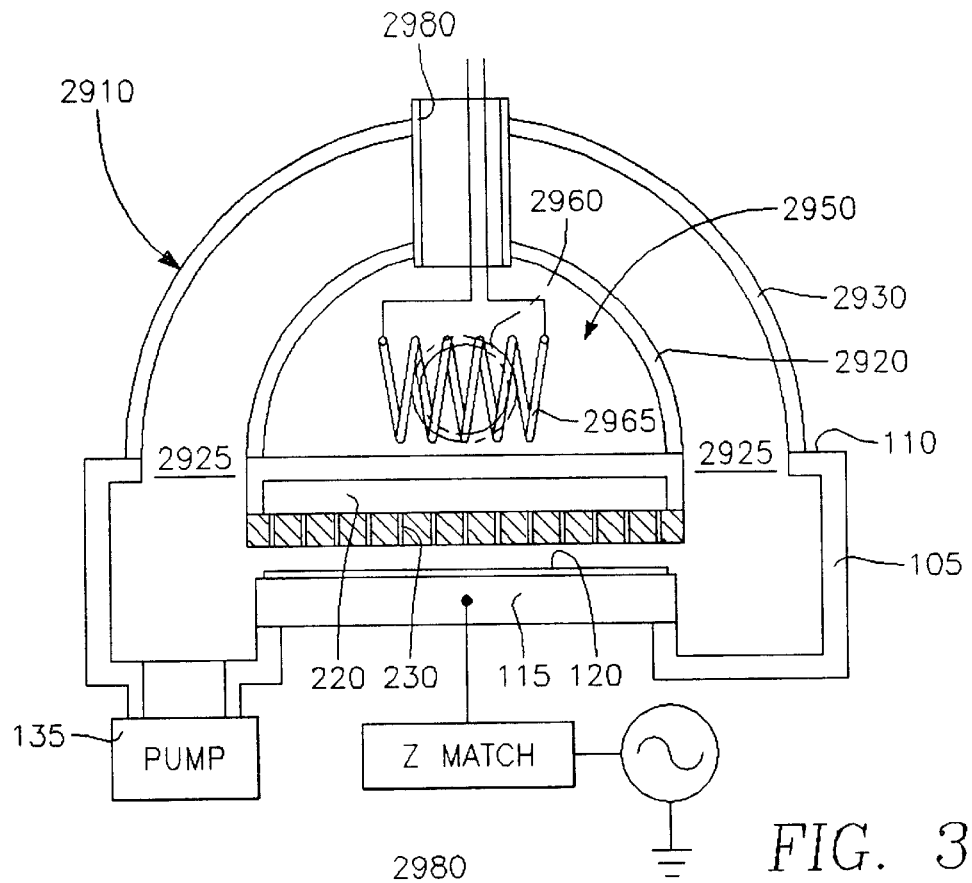
FIGS. 31A and 31B are front and side sectional views corresponding to FIG. 30.
Figure 31B:
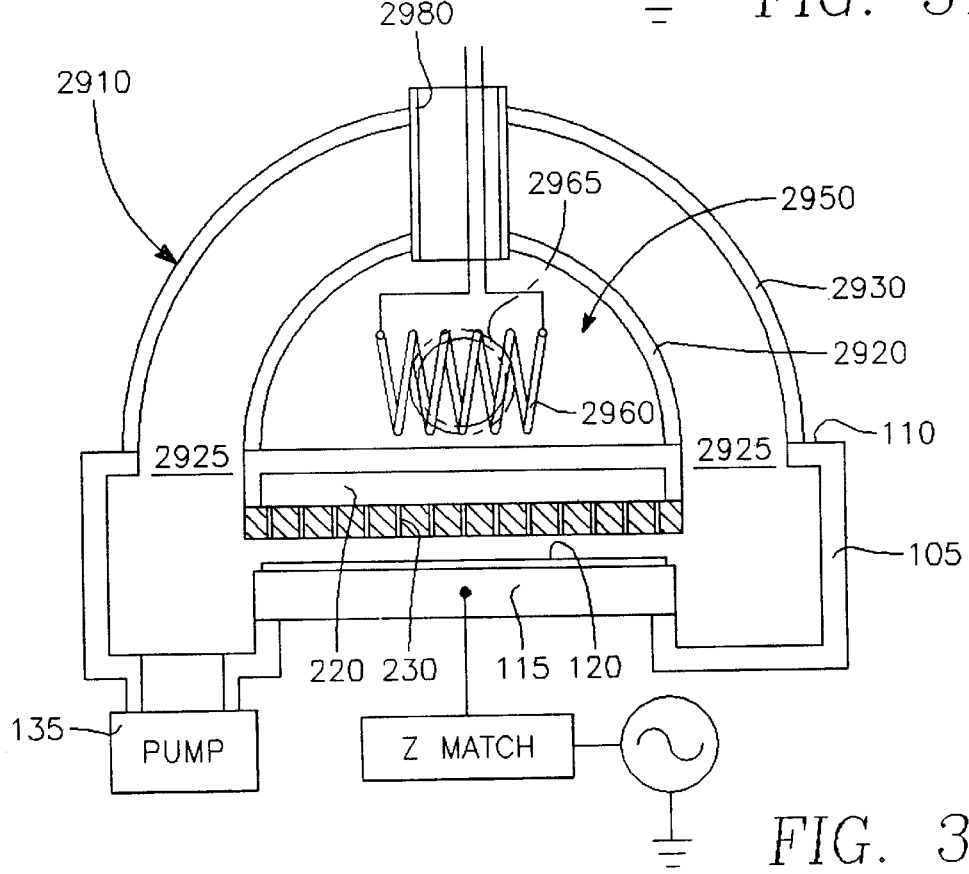

Alternatively, the coils 2960, 2965 may be driven separately at different frequencies. FIG. 30 is a top sectional view of the embodiment of FIG. 29. FIGS. 31A and 31B are front and side sectional views, respectively, corresponding to FIG. 30.

Figure 32:
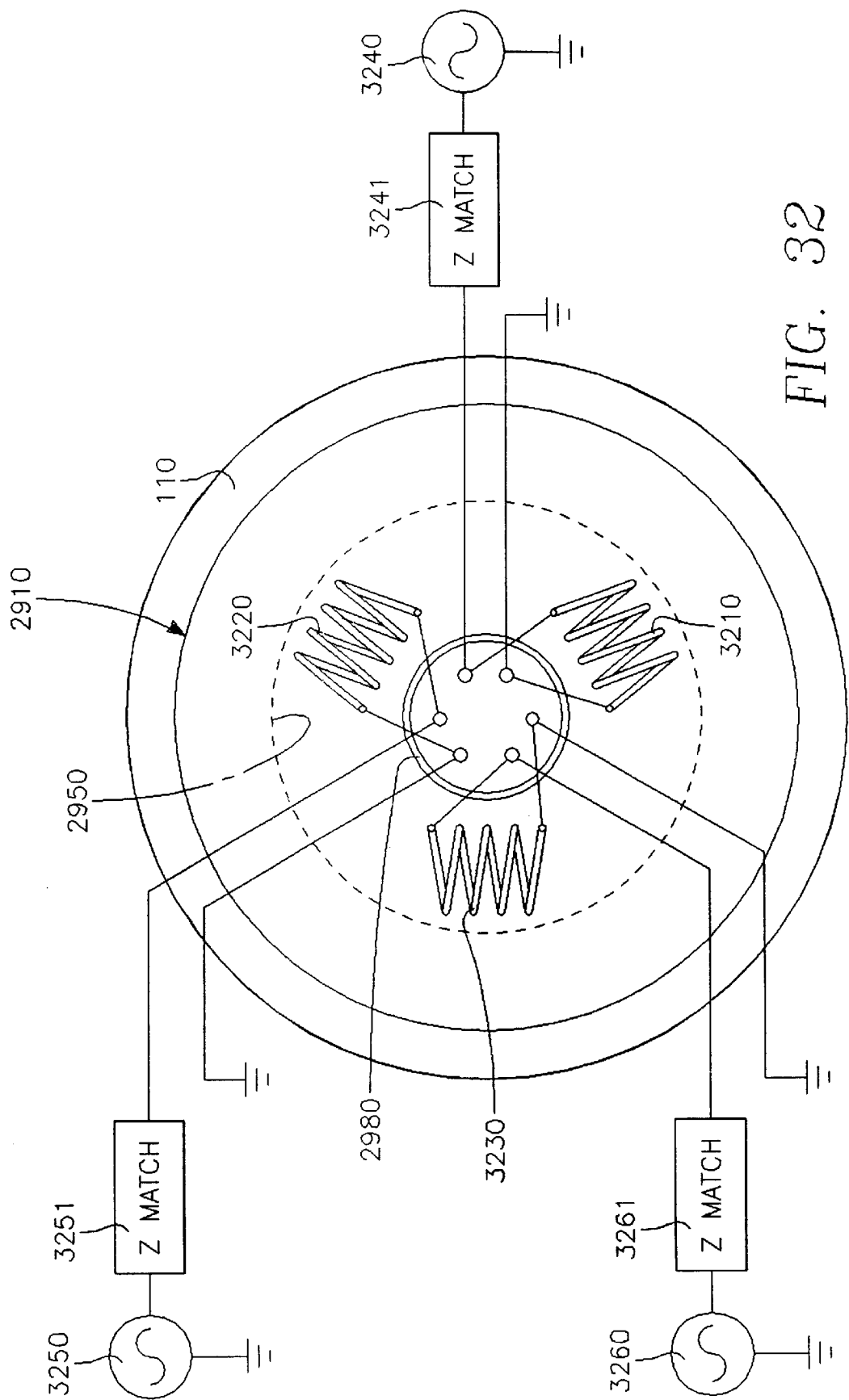
FIG. 32 illustrates a variation of the embodiment 29 employing three independently driven RF coils underneath the continuous plenum facing at 120 degree intervals.
Figure 33:
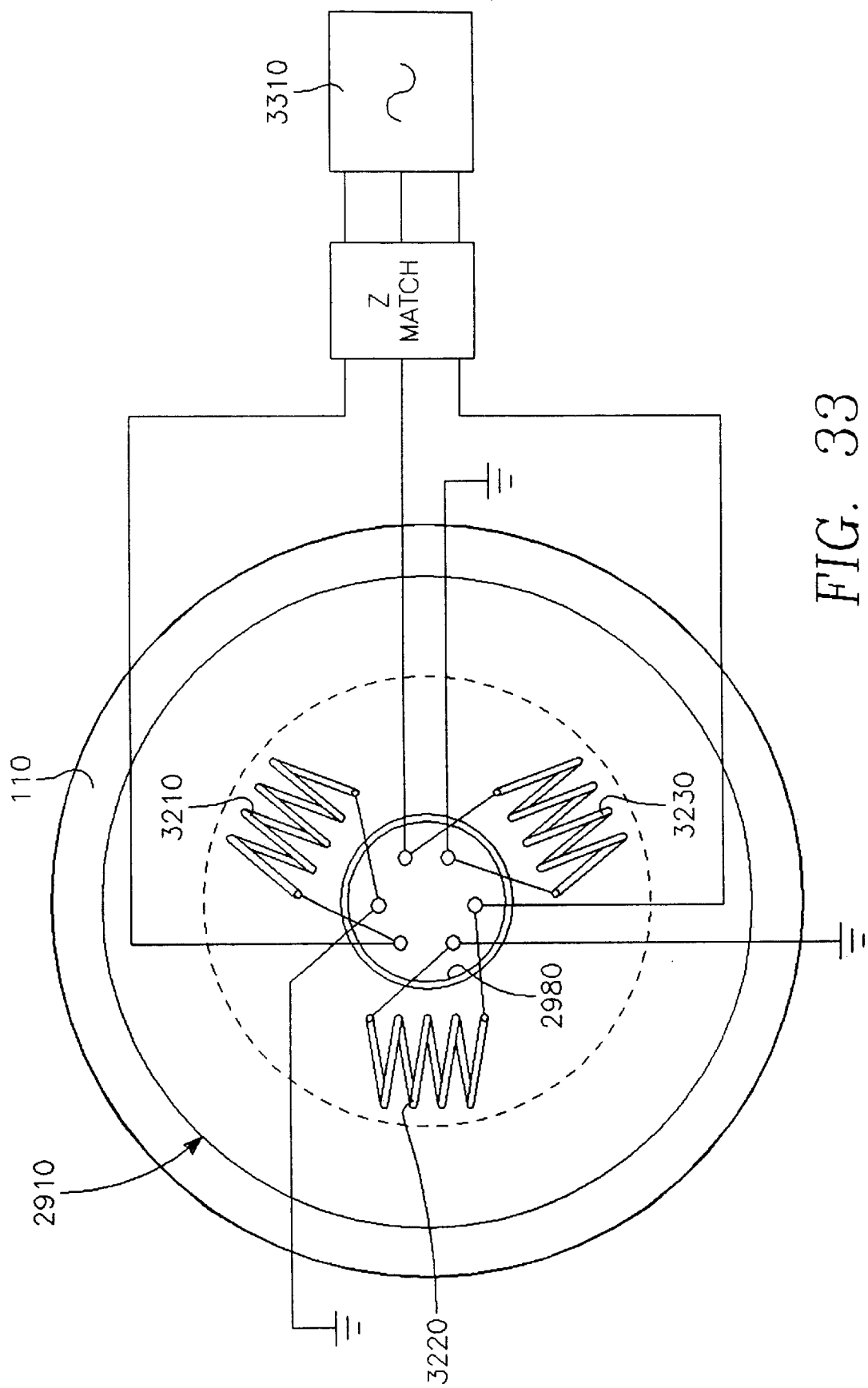
FIG. 33 illustrates a variation of the embodiment of FIG. 32 in which the three RF coils are driven at 120 degree phase to provide an azimuthally rotating plasma.

The pair of mutually orthogonal coils 2960, 2965 may be replaced by any number n of separately driven coils with their winding axes disposed at 360/n degrees apart. For example, FIG. 32 illustrates the case where the two coils 2960, 2965 are replace by three coils 3210, 3220, 3230 with winding axes placed at 120 degree intervals and driven by three respective RF supplies 3240, 3250, 3260 through respective impedance match circuits 3241, 3251, 3261. In order to produce a rotating torroidal plasma current, the three windings 3210, 3220, 3230 are driven 120 degrees out of phase from a common power source 3310 as illustrated in FIG. 33. The embodiments of FIGS. 32 and 33 are preferred over the embodiment of FIG. 29 having only two coils, since it is felt much of the mutual coupling between coils would be around rather than through the vertical conduit 2980.

Figure 34:
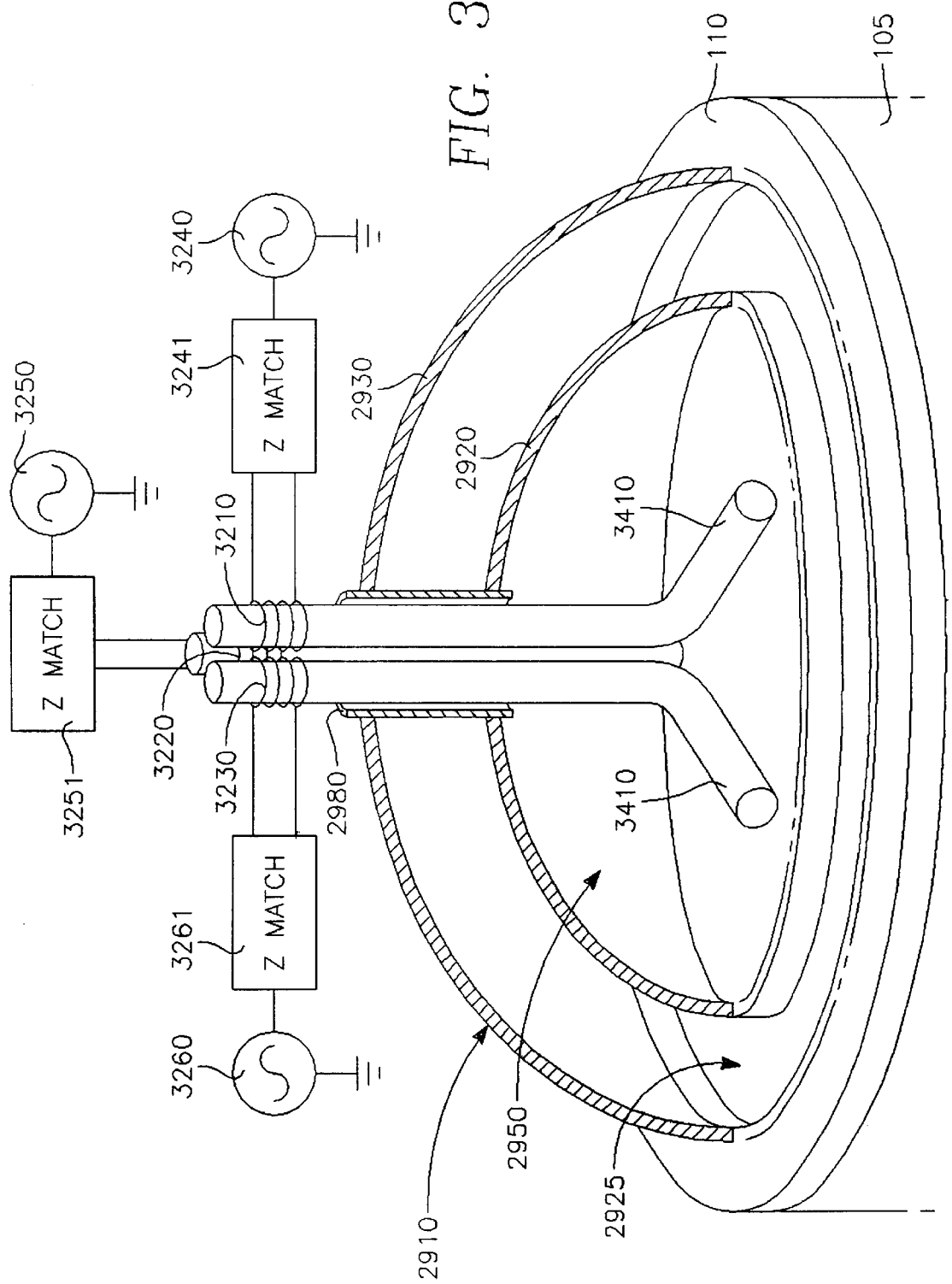
FIG. 34 illustrates a variation of the embodiment of FIG. 33 in which RF drive coils are wound around vertical external ends of respective magnetic cores whose opposite ends extend horizontally under the plenum at symmetrically distributed angles.

FIG. 34 illustrates an embodiment in which the three coils are outside of the enclosed region 2950, while their inductances are coupled into the enclosed region 2950 by respective vertical magnetic cores 3410 extending through the conduit 2980. Each core 3410 has one end extending above the conduit 2980 around which a respective one of the coils 3210, 3220, 3230 is wound. The bottom of each core 3410 is inside the enclosed region 2950 and has a horizontal leg. The horizontal legs of the three cores 3410 are oriented at 120degree intervals to provide inductive coupling to the interior of the plenum 2910 similar to that provided by the three coils inside the enclosed region as in FIG. 32.

The advantage of the flattened rectangular tube enclosures of the embodiments of FIGS. 18–28 is that the broad width and relatively low height of the tube enclosure forces the torroidal plasma current to be a wide thin belt of plasma that more readily covers the entire surface of a large diameter wafer. The entirety of the tube enclosure need not be of the maximum width. Instead the outer section of the tube enclosure farthest from the chamber interior may be necked down, as discussed above with reference to the embodiment of FIG. 20. In this case, it is preferable to provide focusing magnets 1870 at the transition corners between the wide portion 1851 and the narrow section 1852 to force the plasma current exiting the narrow portion 1852 to spread entirely across the entire width of the wide section 1851. If it is desired to maximize plasma ion density at the wafer surface, then it is preferred that the cross-sectional area of the narrow portion 1852 be at least nearly as great as the cross-sectional area of the wide portion 1851. For example, the narrow portion 1852 may be a passageway whose height and width are about the same while the wide portion 1851 may have a height that is less than its width.

The various embodiments described herein with air-core coils (i.e., coils without a magnetic core) may instead employ magnetic-cores, which can be the open-magnetic-path type ("rod" type cores) or the closed-magnetic-core type illustrated in the accompanying drawings. Furthermore, the various embodiments described herein having two or more toroidal paths driven with different RF frequencies may instead be driven with same frequenct, and with the same or different phases.

Figure 35:
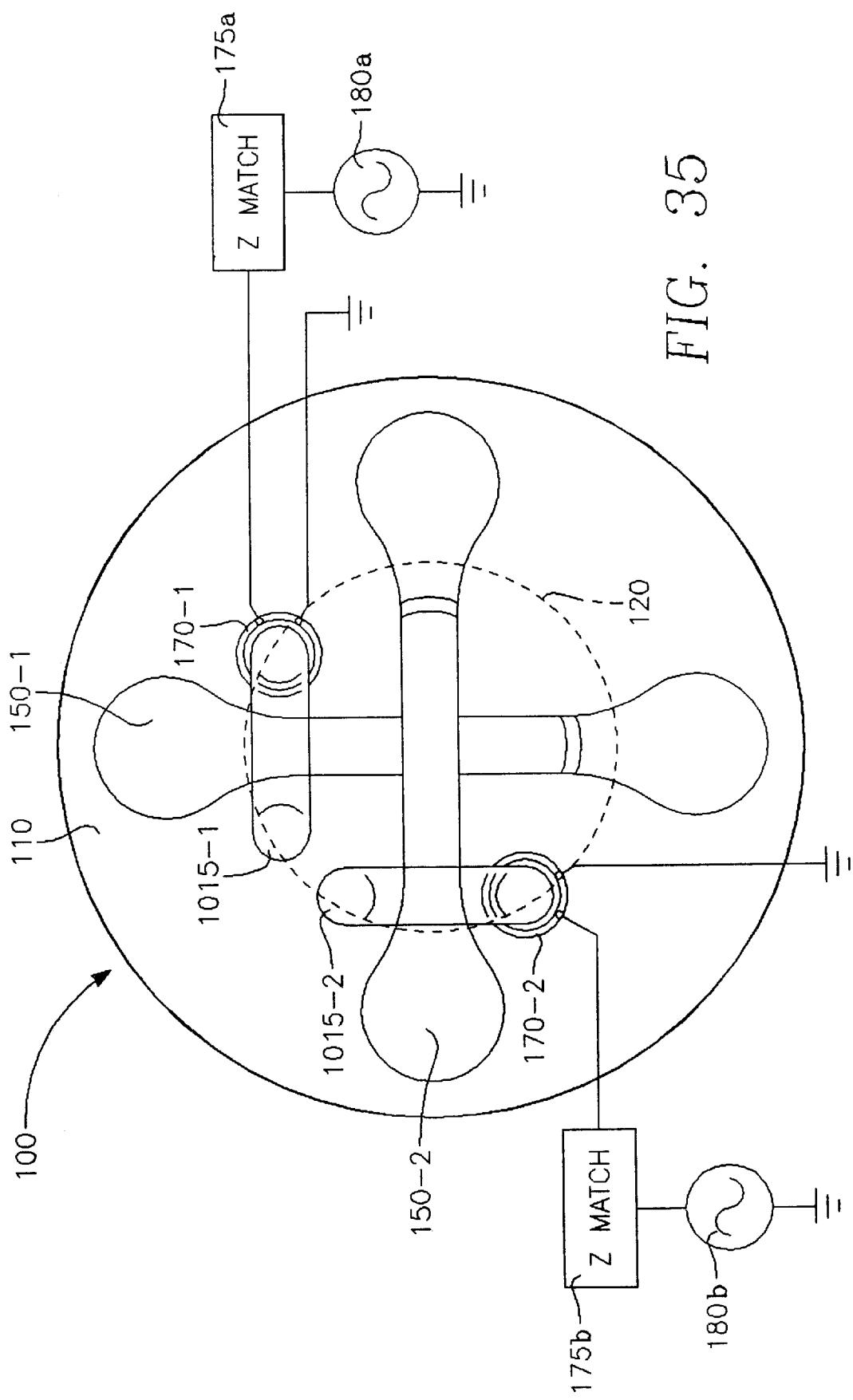
FIG. 35 is an version of the embodiment of FIG. 17 in which the mutually transverse hollow conduits are narrowed as in the embodiment of FIG. 20.

FIG. 35 is a version of the embodiment of FIG. 17 in which the mutually transverse hollow conduits are narrowed as in the embodiment of FIG. 20.

Figure 36:
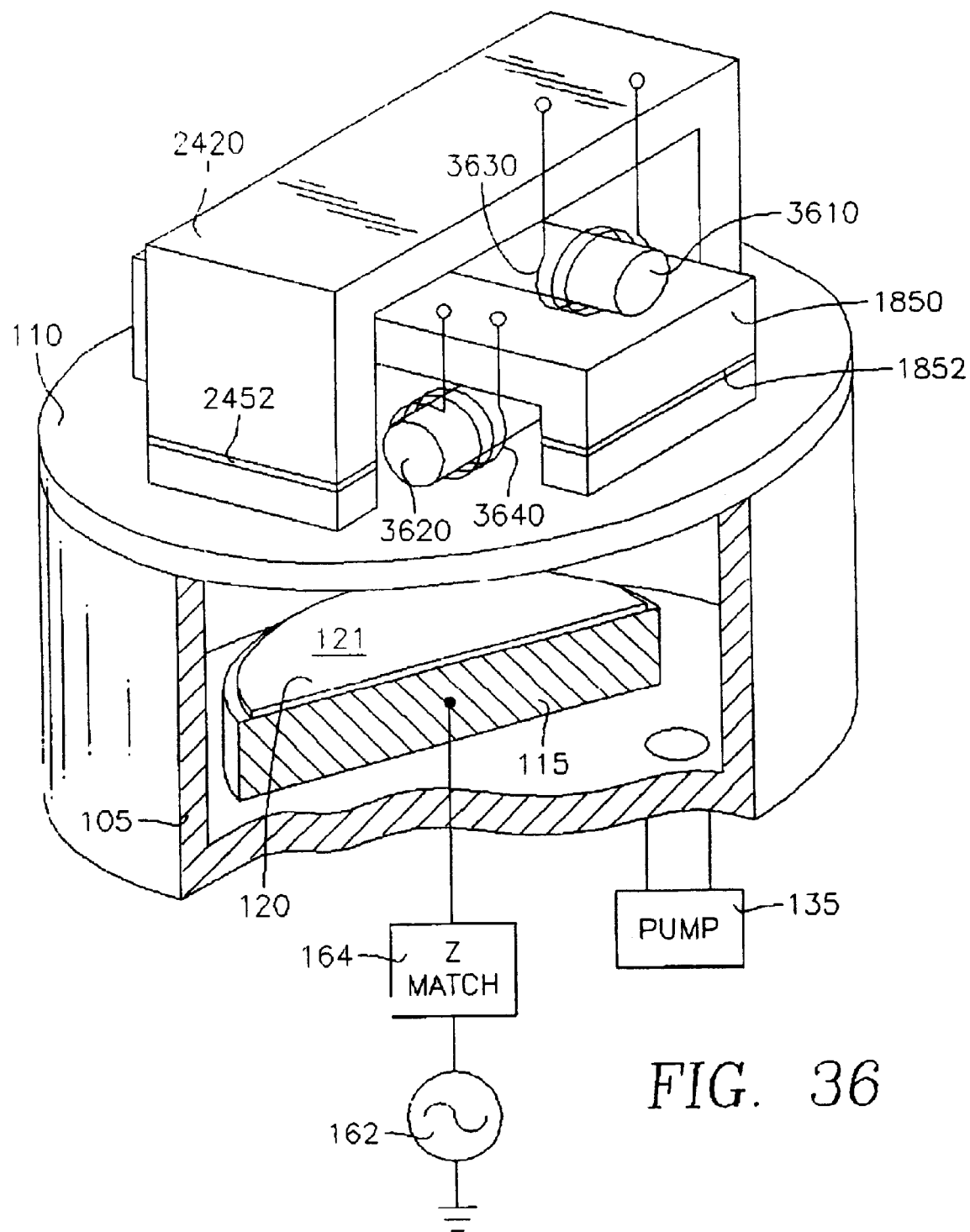
FIG. 36 is a version of the embodiment of FIG. 24 but employing a pair of magnetic cores 3610, 3620 with respective windings 3630, 3640 therearound for connection to respective RF power sources.

FIG. 36 is a version of the embodiment of FIG. 24 but employing a pair of magnetic cores 3610, 3620 with respective windings 3630, 3640 therearound for connection to respective RF power sources.

Figure 37:
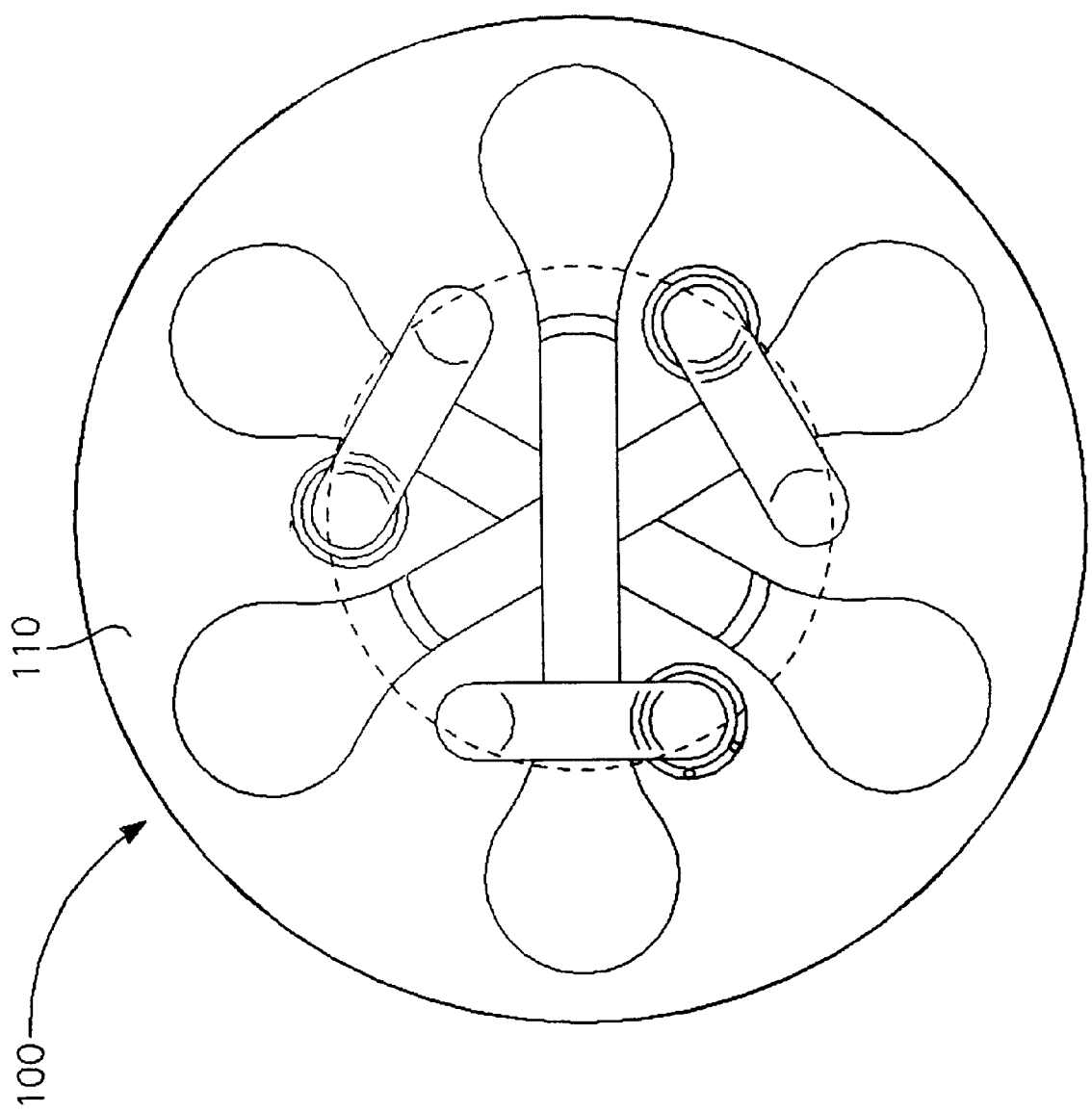
FIG. 37 is an embodiment corresponding to that of FIG. 35 but having three instead of two reentrant conduits with a total of six reentrant ports to the chamber.

FIG. 37 is an embodiment corresponding to that of FIG. 35 but having three instead of two reentrant conduits with a total of six reentrant ports to the chamber. Having a number of symmetrically disposed conduits and reentrant ports greater than two (as in the embodiment of FIG. 37) is believed to be particularly advantageous for processing wafers of diameter of 300 mm and greater.

Figure 38:
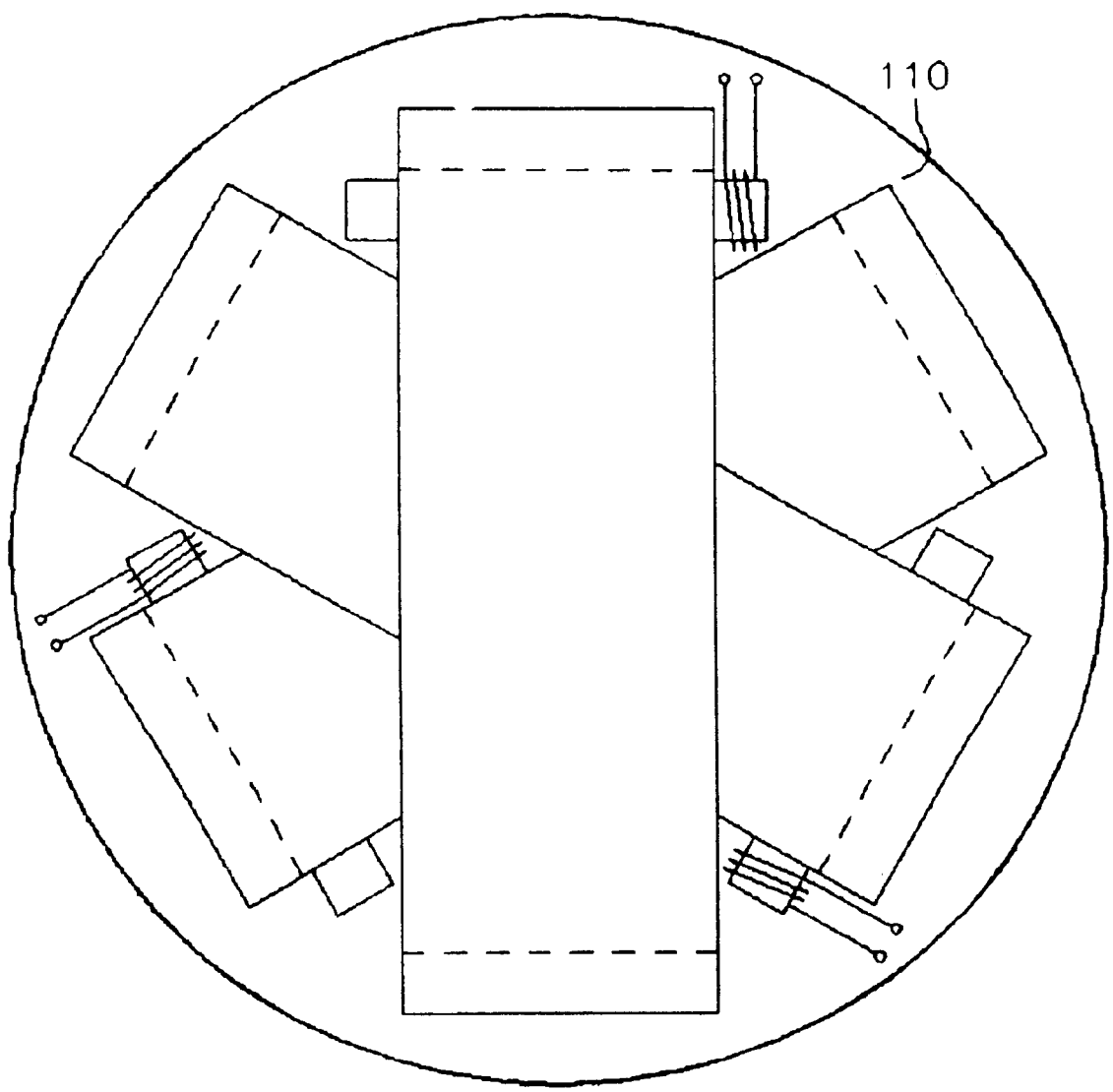
FIG. 38 is an embodiment corresponding to that of FIG. 38 but having three instead of two reentrant conduits with a total of six reentrant ports to the chamber.

FIG. 38 is an embodiment corresponding to that of FIG. 38 but having three instead of two reentrant conduits with a total of six reentrant ports to the chamber.

Figure 39:
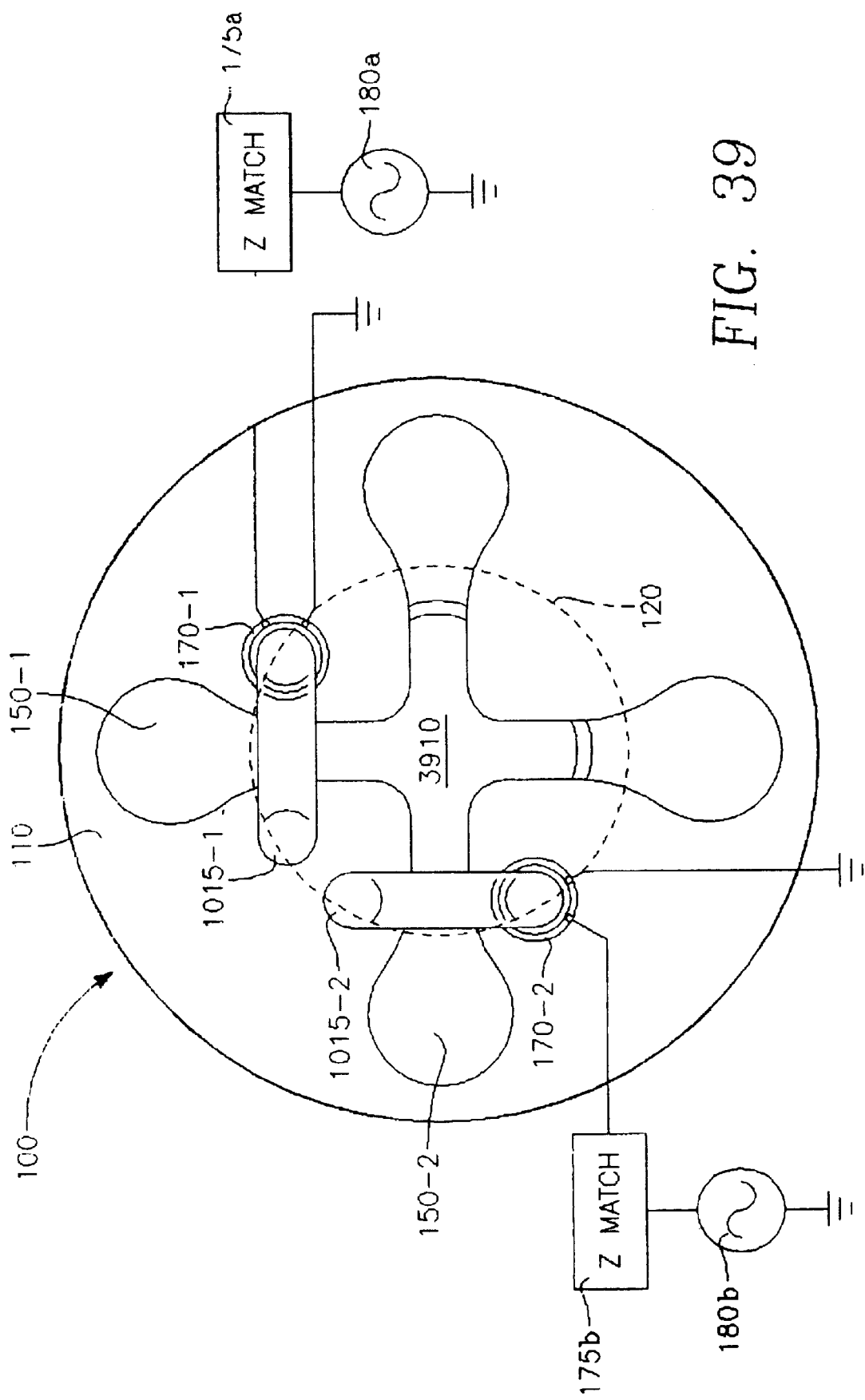
FIG. 39 is an embodiment corresponding to that of FIG. 35 in which the external conduits join together in a common plenum 3910.

FIG. 39 is an embodiment corresponding to that of FIG. 35 in which the external conduits join together in a common plenum 3910.

Figure 40:
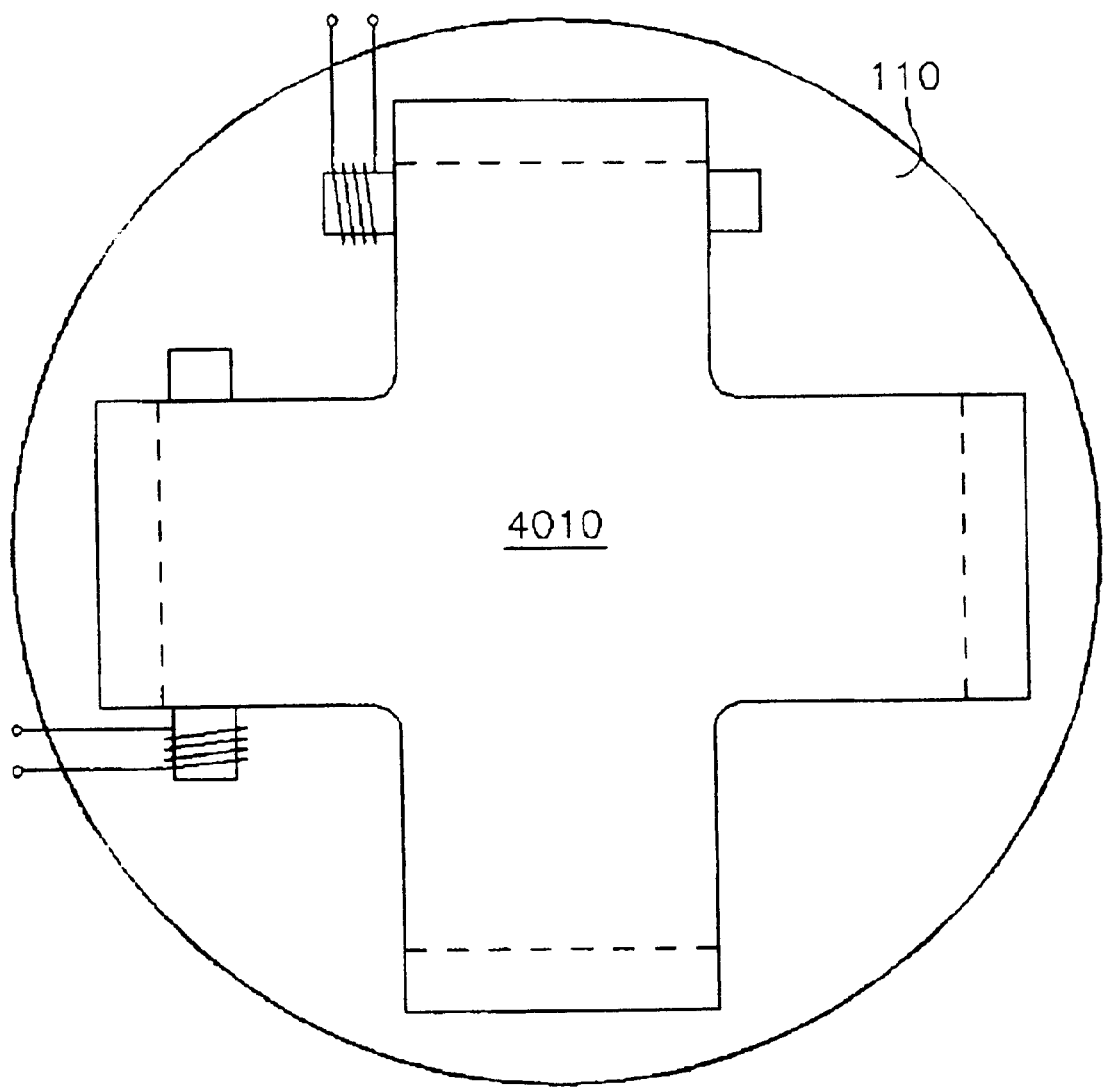
FIG. 40 is an embodiment corresponding to that of FIG. 36 in which the external conduits join together in a common plenum 4010.

FIG. 40 is an embodiment corresponding to that of FIG. 36 in which the external conduits join together in a common plenum 4010.

Figure 41:
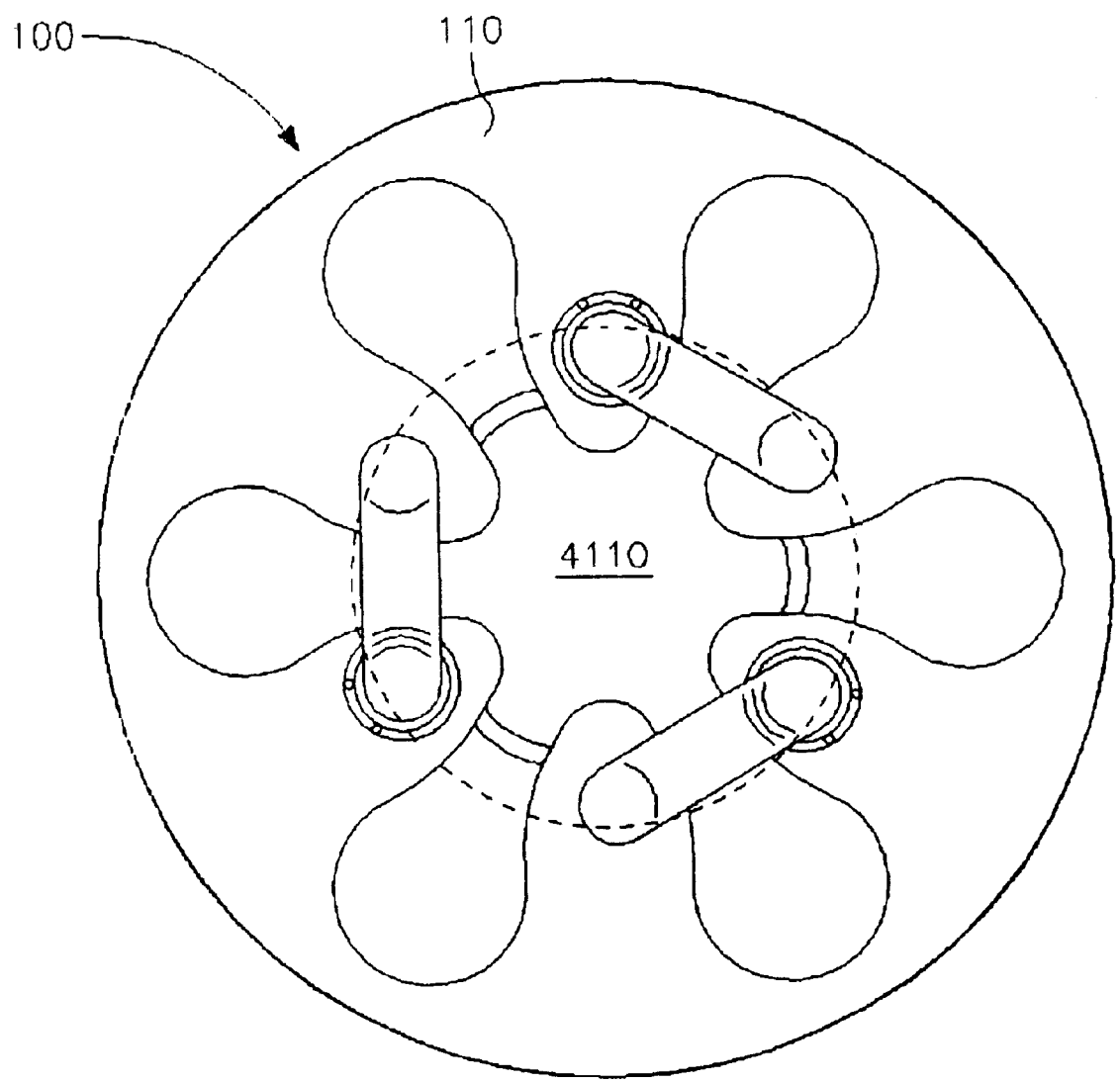
FIG. 41 is an embodiment corresponding to that of FIG. 37 in which the external conduits join together in a common plenum 4110.

FIG. 41 is an embodiment corresponding to that of FIG. 37 in which the external conduits join together in a common plenum 4110.

Figure 42:
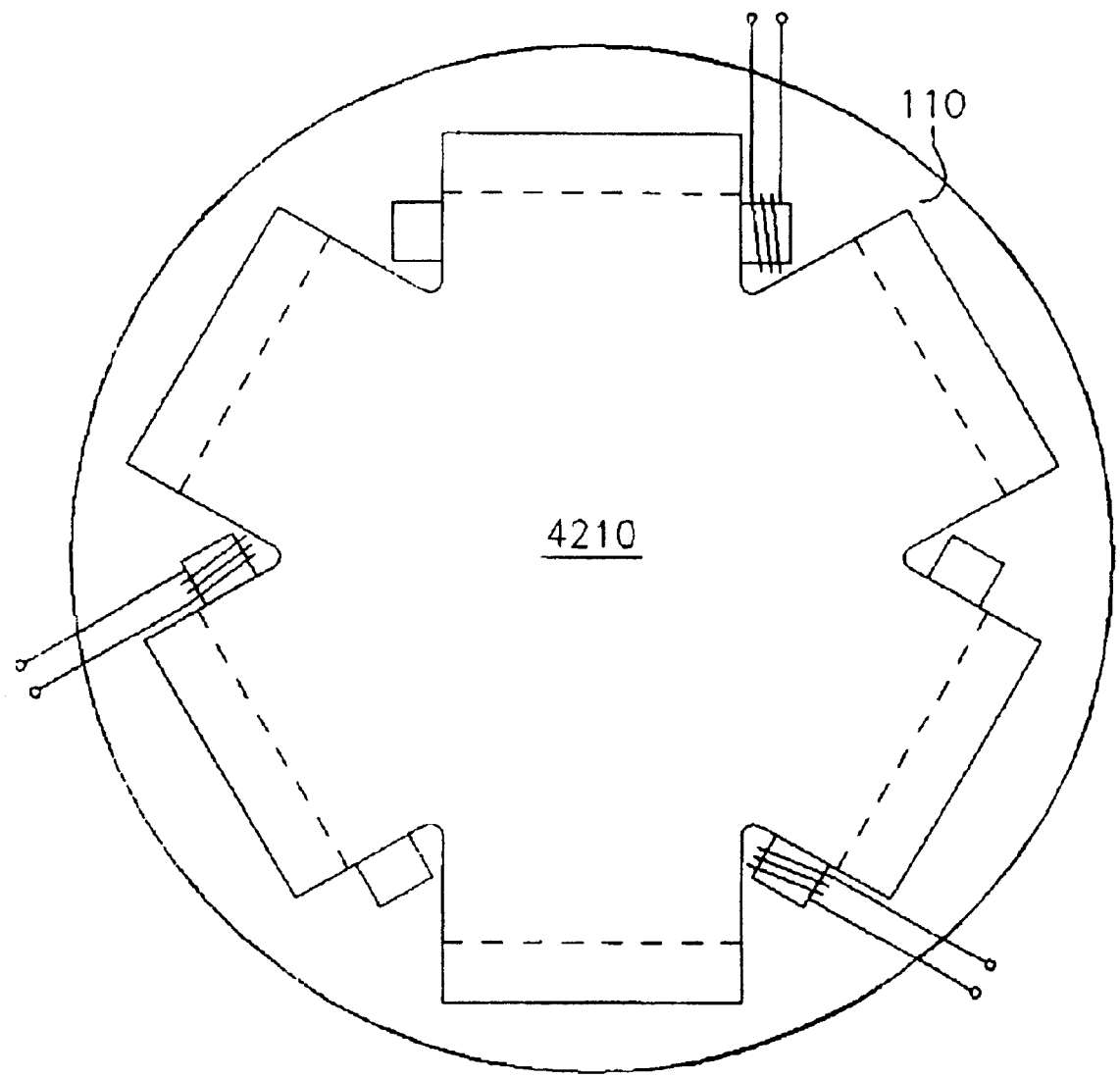
FIG. 42 is an embodiment corresponding to that of FIG. 38 in which the external conduits join together in a common plenum 4210.

FIG. 42 is an embodiment corresponding to that of FIG. 38 in which the external conduits join together in a common plenum 4210.

Figure 43:
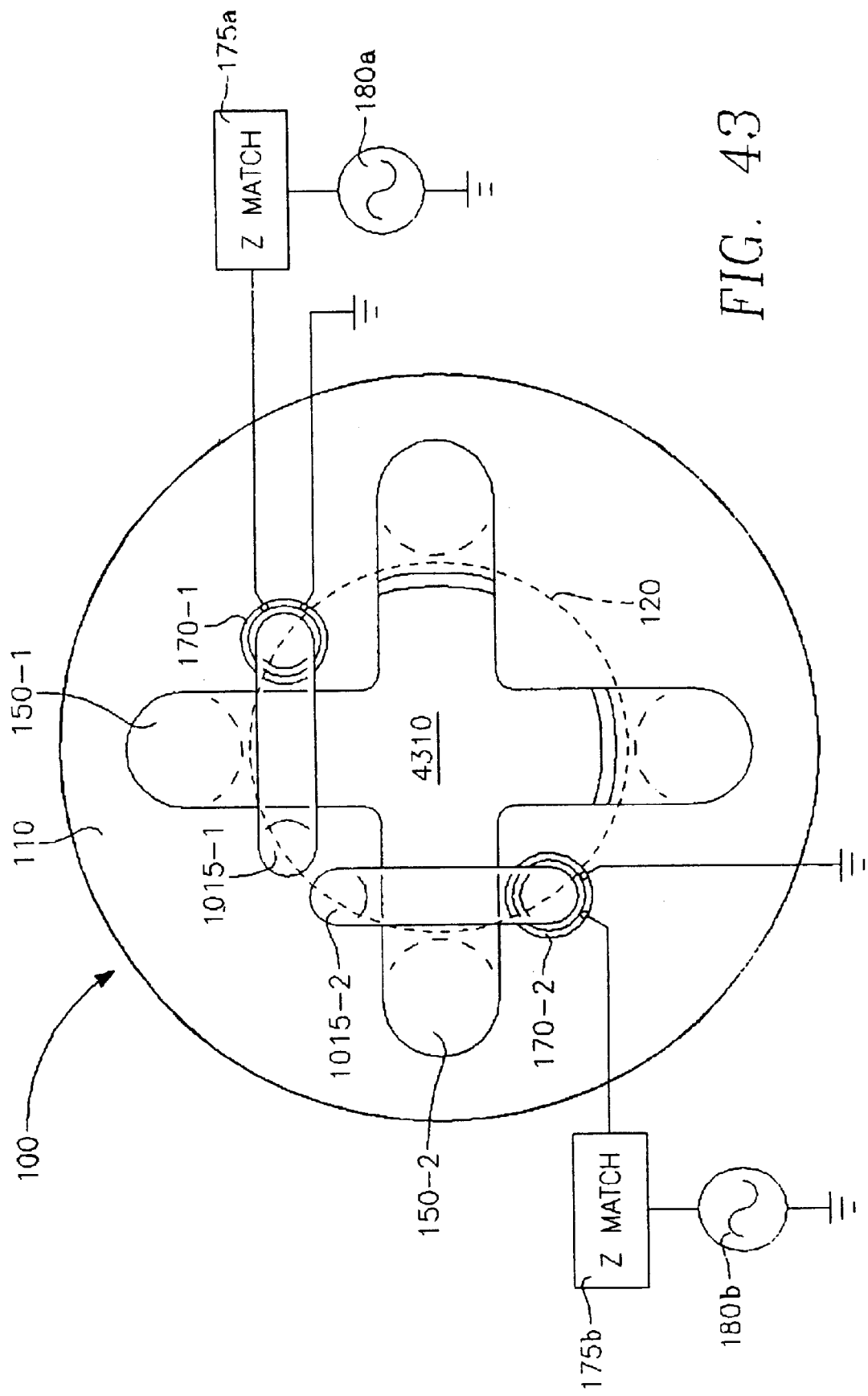
FIG. 43 is an embodiment corresponding to that of FIG. 17 in which the external conduits join together in a common plenum 4310.

FIG. 43 is an embodiment corresponding to that of FIG. 17 in which the external conduits join together in a common plenum 4310.

Advantageous Features of the Invention

The reactor of the invention affords numerous opportunities for increasing etch selectivity without sacrificing other performance features such as etch rate. For example, constricting the torroidal plasma current in the vicinity of the wafer not only improves etch selectivity but at the same time increases the etch rate by increasing the plasma ion density. It is believed no prior reactor has increased etch selectivity by the same mechanism that increases etch rate or plasma ion density over the workpiece.

Improving etch selectivity by constricting the torroidal plasma current in the vicinity of the wafer or workpiece can be achieved in the invention in any one of several ways. One way is to reduce the pedestal-to-ceiling or wafer-to-ceiling height. Another is to introduce a gas distribution plate or showerhead over the wafer that constricts the path of the torroidal plasma ion current. Another way is to increase the RF bias power applied to the wafer or workpiece. Any one or any combination of the foregoing ways of improving etch selectivity may be chosen by the skilled worker in carrying out the invention.

Etch selectivity may be further improved in the invention by injecting the reactive process gases locally (i.e., near the wafer or workpiece) while injecting an inert diluent gas (e.g., Argon) remotely (i.e., into the conduit or plenum). This is preferably accomplished by providing a gas distribution plate or showerhead directly over and facing the workpiece support and introducing the reactive process gas exclusively (or at least predominantly) through the showerhead. Concurrently, the diluent gas is injected into the conduit well away from the process region overlying the wafer or workpiece. The torroidal plasma current thus becomes not only a source of plasma ions for reactive ion etching of materials on the wafer but, in addition, becomes an agent for sweeping away the reactive process gas species and their plasma-dissociated progeny before the plasma-induced dissociation process is carried out to the point of creating an undesirable amount of free fluorine. This reduction in the residence time of the reactive process gas species enhances the etch selectivity relative to photoresist and other materials, a significant advantage.

The invention provides great flexibility in the application of RF plasma source power to the torroidal plasma current.

As discussed above, power is typically inductively coupled to the torroidal plasma current by an antenna. In many embodiments, the antenna predominantly is coupled to the external conduit or plenum by being close or next to it. For example, a coil antenna may extend alongside the conduit or plenum. However, in other embodiments the antenna is confined to the region enclosed between the conduit or plenum and the main reactor enclosure (e.g., the ceiling). In the latter case, the antenna may be considered to be "under" the conduit rather than alongside of it. Even greater flexibility is afford by embodiments having a magnetic core (or cores) extending through the enclosed region (between the conduit and the main chamber enclosure) and having an extension beyond the enclosed region, the antenna being wound around the core's extension. In this embodiment the antenna is inductively coupled via the magnetic core and therefore need not be adjacent the torroidal plasma current in the conduit. In one such embodiment, a closed magnetic core is employed and the antenna is wrapped around the section of the core that is furthest away from the torroidal plasma current or the conduit. Therefore, in effect, the antenna may be located almost anywhere, such as a location entirely remote from the plasma chamber, by remotely coupling it to the torroidal plasma current via a magnetic core.

Finally, the invention provides uniform coverage of the plasma over the surface of a very large diameter wafer or workpiece. This is accomplished in one embodiment by shaping the torroidal plasma current as a broad plasma belt having a width preferably exceeding that of the wafer. In another embodiment, uniformity of plasma ion density across the wafer surface is achieved by providing two or more mutually transverse or orthogonal torroidal plasma currents that intersect in the process region over the wafer. The torroidal plasma currents flow in directions mutually offset from one another by 360/n. Each of the torroidal plasma currents may be shaped as a broad belt of plasma to cover a very large diameter wafer. Each one of the torroidal plasma currents may be powered by a separate coil antenna aligned along the direction of the one torroidal plasma current. In one preferred embodiment, uniformity is enhanced by applying RF signals of different phases to the respective coil antennas so as to achieve a rotating torroidal plasma current in the process region overlying the wafer. In this preferred embodiment, the optimum structure is one in which the torroidal plasma current flows in a circularly continuous plenum communicating with the main chamber portion through a circularly continuous annular opening in the ceiling or side wall. This latter feature allows the entire torroidal plasma current to rotate azimuthally in a continuous manner.

While the invention has been described in detail by specific reference to preferred embodiments, it is understood that variations and modifications thereof may be made without departing from the true spirit and scope of the invention.

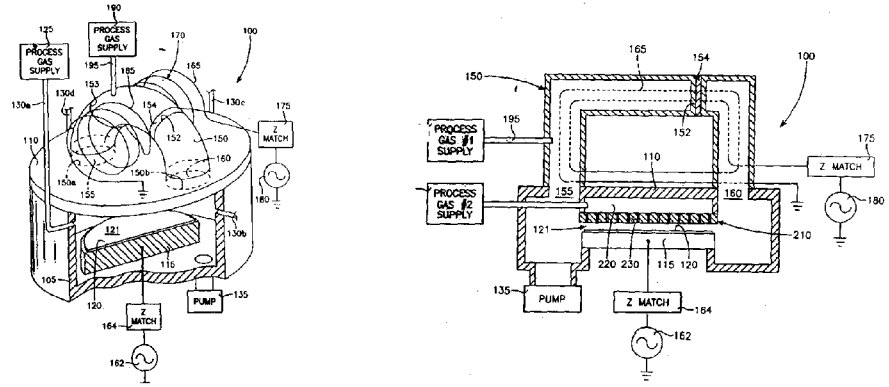

What is claimed is:

1. A plasma chamber defining an evacuated interior environment for processing a substrate, said chamber comprising:
   a substrate support;
   an apertured gas distribution plate in spaced facing relationship to the substrate support, and adapted to flow process gases into the chamber interior environment adjacent the substrate support, said gas distribution plate and substrate support defining a substrate processing region therebetween;

a hollow conduit having respective ends opening into said substrate processing region on opposite sides of said gas distribution plate, with the interior of said conduit sharing the interior environment;

a side wall surrounding said processing region between said gas distribution plate and said substrate support;

said conduit being adapted to accept irradiation by an RF field of processing gases within the conduit to sustain a plasma in a reentrant path extending around the conduit interior and across the substrate processing region within said chamber interior environment, said path being bounded by said side wall.

2. The chamber of claim 1, in which said path is torroidal.

3. The chamber of claim 1, in which a plasma current circulates around said path.

4. The plasma chamber of claim 1 wherein the conduit has a diameter greater than that of the substrate processing region.

5. The plasma chamber of claim 1 wherein said respective ends of said hollow conduit have a separation distance therebetween that exceeds a diameter of said substrate support.

6. The plasma chamber of claim 1 wherein induced electric field lines of the plasma extend across the substrate plasma processing region from one of the conduit ends to the other.

7. The plasma chamber of claim 6 wherein the electric field lines are generally parallel.

8. The plasma chamber of claim 7 wherein the electric field strength is evenly distributed across the substrate plasma processing region.

9. The plasma chamber of claim 1 wherein the conduit includes an insulating gap generally midway between said respective ends to preclude the conduit from presenting a continuous conductive path between said ends.

10. The plasma chamber of claim 1 wherein said conduit has a diameter exceeding the diameter of the chamber.

11. The plasma chamber of claim 1 wherein each end of said conduit has a transverse dimension which is at least as great as that of said substrate support.

12. The plasma chamber of claim 1 further comprising an RF power applicator.

13. The plasma chamber of claim 2 further comprising an RF inductive source.

14. The plasma chamber of claim 13 wherein said inductive source is adjacent said conduit.

15. The plasma chamber of claim 1 further comprising a bias RF power source coupled to said substrate support.

16. The plasma chamber of claim 1 further comprising a gas injection inlet to said conduit.

17. The plasma chamber of claim 16 in which said gas injection inlet is adapted to flow diluent gases, and said gas distribution plate is adapted to flow primarily reactive process gases.

18. The plasma chamber of claim 1 wherein said gas distribution plate is adapted to flow different mixtures of inert and reactive process gases at different radial locations.

19. The plasma chamber of claim 1 wherein said respective ends of said hollow conduit open through said gas distribution plate.

20. The plasma chamber of claim 1 further comprising a pumping annulus in a plane below said processing region through which gases are evacuated from said chamber.

21. The plasma chamber of claim 1 wherein said reentrant path extends across a top of said gas distribution plate, down one side of said gas distribution plate, across a bottom of said gas distribution plate and up an opposite side of said gas distribution plate, whereby said gas distribution plate is compassed by said reentrant path.

* * * * *

UNITED STATES PATENT AND TRADEMARK OFFICE
CERTIFICATE OF CORRECTION

PATENT NO.    : 6,468,388 B1
DATED         : October 22, 2002
INVENTOR(S)   : Hiroji Hanawa et al.

It is certified that error appears in the above-identified patent and that said Letters Patent is hereby corrected as shown below:

Title page showing the Illiustrative figure should be deleted to be replaced with the attached title page.

Please replaces FIGS. 1-13 with FIGS. 1-13 of the attached replacement drawings.

Signed and Sealed this

Ninth Day of September, 2003

JAMES E. ROGAN
*Director of the United States Patent and Trademark Office*

(12) United States Patent
Hanawa et al.

(10) Patent No.: US 6,468,388 B1
(45) Date of Patent: *Oct. 22, 2002

(54) REACTOR CHAMBER FOR AN EXTERNALLY EXCITED TORROIDAL PLASMA SOURCE WITH A GAS DISTRIBUTION PLATE

(75) Inventors: Hiroji Hanawa, Sunnyvale; Yan Ye, Campbell; Kenneth S Collins, San Jose; Kartik Ramaswamy, Santa Clara; Andrew Nguyen, San Jose; Tsutomu Tanaka, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 65 days.

This patent is subject to a terminal disclaimer.

(21) Appl. No.: 09/636,434

(22) Filed: Aug. 11, 2000

(51) Int. Cl.[7] ............................................. H01L 21/00
(52) U.S. Cl. .......................... 156/345.48; 118/723 I; 118/723 AN; 118/723 R
(58) Field of Search ................... 156/345; 118/723 I, 118/723 R

(56) References Cited

U.S. PATENT DOCUMENTS

| | | |
|---|---|---|
| 2,344,138 A | 3/1944 | Drummond |
| 3,109,100 A | 10/1963 | Papp |
| 3,291,715 A | 12/1966 | Anderson |

(List continued on next page.)

FOREIGN PATENT DOCUMENTS

| | | |
|---|---|---|
| EP | 0 546 852 | 6/1993 |
| EP | 0 546 852 A1 | 6/1993 |
| EP | 0 836 218 | 4/1998 |
| WO | 99/00823 | 1/1999 |
| WO | WP 99/00823 | 1/1999 |
| WO | 01/11650 | 2/2001 |

OTHER PUBLICATIONS

U.S. Patent application Ser. No. 09/584,167, filed May 25, 2000, entitled, "Toroidal Plasma Source for Plasma Processing," By Michael S. Cox, et al.

Zhang, B.C., and Cross, R.C., "A high power radio frequency transformer for plasma production in a toroidal plasma source," *Rev. Sci. Instrum.*, vol. 69, No. 1, Jan. 1998, pp. 101–108.

U.S. patent application Ser. No.: 09/636,435, filed Aug. 11, 2000, entitled,"Externally Excited Multiple Torroidal Plasma Source", by Hiroji Hanawa, et al.

U.S. patent application No.: 09/636,436, filed Aug. 11, 2000, entitled, "A Method of Processing a Workpiece Using an Externally Excited Torroidal Plasma Source," By Hirojoi Hanawa, et al.

(List continued on next page.)

*Primary Examiner*—Gregory Mills
*Assistant Examiner*—Anna Michelle Crowell
(74) *Attorney, Agent, or Firm*—Michaelson and Wallace; Joseph Bach

(57) ABSTRACT

A plasma chamber defining an evacuated interior environment for processing a substrate includes a substrate support, an apertured gas distribution plate in spaced facing relationship to the substrate support, and adapted to flow process gases into the chamber interior environment adjacent the substrate support, the gas distribution plate and substrate support defining a substrate processing region therebetween. A hollow conduit having respective ends opening into the substrate processing region on opposite sides of the gas distribution plate, with the interior of the conduit sharing the interior environment. The conduit being adapted to accept irradiation by an RF field of processing gases within the conduit to sustain a plasma in a path extending around the conduit interior and across the substrate processing region within the chamber interior environment.

21 Claims, 41 Drawing Sheets